US011557529B2

(12) United States Patent
Boyd et al.

(10) Patent No.: US 11,557,529 B2
(45) Date of Patent: Jan. 17, 2023

(54) MECHANISM COMBINING FASTENER CAPTIVATION AND ASSEMBLY TILT CONTROL FOR MICROPROCESSOR THERMAL SOLUTIONS

(71) Applicant: Intel Corporation, Santa Clara, CA (US)

(72) Inventors: Thomas Boyd, Vancouver, WA (US); Ming-Chen Chang, Portland, OR (US); Evan A. Chenelly, Beaverton, OR (US); Divya Swamy Bandaru, Hillsboro, OR (US); Craig J. Jahne, Beaverton, OR (US); Andrew Larson, Hillsboro, OR (US); Eric W. Buddrius, Hillsboro, OR (US); Eric D. McAfee, Portland, OR (US); Mustafa Haswarey, Tigard, OR (US); Ralph V. Miele, Hillsboro, OR (US); Rolf Laido, Sherwood, OR (US)

(73) Assignee: Intel Corporation, Santa Clara, CA (US)

( * ) Notice: Subject to any disclaimer, the term of this patent is extended or adjusted under 35 U.S.C. 154(b) by 1144 days.

(21) Appl. No.: 15/942,270

(22) Filed: Mar. 30, 2018

(65) Prior Publication Data
US 2019/0304870 A1 Oct. 3, 2019

(51) Int. Cl.
*H05K 7/14* (2006.01)
*H01L 23/40* (2006.01)
*H01L 23/367* (2006.01)

(52) U.S. Cl.
CPC ...... *H01L 23/4093* (2013.01); *H01L 23/3677* (2013.01); *H05K 7/1405* (2013.01); *H01L 2924/15323* (2013.01)

(58) Field of Classification Search
CPC ............ H01L 23/4093; H01L 23/3677; H01L 2924/15323; H05K 7/1405
USPC ..................................................... 361/679.54
See application file for complete search history.

(56) References Cited

U.S. PATENT DOCUMENTS

| 2,949,054 | A |   | 8/1960 | White |
|---|---|---|---|---|
| 4,546,408 | A | * | 10/1985 | Rodseth ................. H05K 3/325 |
|           |   |   |         | 361/720 |
| 4,756,654 | A |   | 7/1988 | Clough |
| 4,863,330 | A |   | 9/1989 | Olez et al. |
| 4,883,399 | A |   | 11/1989 | MacLean |

(Continued)

FOREIGN PATENT DOCUMENTS

| DE | 2802465 | 7/1979 |
|---|---|---|
| EP | 0476158 | 3/1992 |

OTHER PUBLICATIONS

Non-Final Office Action for U.S. Appl. No. 15/942,278, dated Sep. 9, 2021.

(Continued)

*Primary Examiner* — Anatoly Vortman
*Assistant Examiner* — Zhengfu J Feng
(74) *Attorney, Agent, or Firm* — Essential Patents Group, LLP.

(57) ABSTRACT

A microprocessor heat sink fastener assembly, comprising a base to couple to a heat sink a retention nut to be received by a cavity of the base, and a retention clip to be attached to the base and to be cantilevered therefrom. The retention clip is to engage with a latching structure extending from a latching structure of a retention plate.

17 Claims, 35 Drawing Sheets

(56) References Cited

U.S. PATENT DOCUMENTS

| | | | |
|---|---|---|---|
| 5,080,547 A | 1/1992 | Moghe | |
| 5,209,888 A | 5/1993 | Shimada et al. | |
| 5,234,299 A | 8/1993 | Giannuzzi | |
| 5,431,518 A | 7/1995 | Young et al. | |
| 5,823,729 A | 10/1998 | Nagayama | |
| 6,109,848 A | 8/2000 | Werner | |
| 6,238,158 B1 | 5/2001 | Clements | |
| 6,280,222 B1 | 8/2001 | Walkup | |
| 6,869,303 B1 | 3/2005 | Ma | |
| 7,009,844 B2 | 3/2006 | Farrow et al. | |
| 7,142,430 B2 | 11/2006 | Lee et al. | |
| 7,156,670 B2 | 1/2007 | Schaty | |
| 7,283,362 B2 | 10/2007 | Lin et al. | |
| 7,785,125 B1 | 8/2010 | Terhune, IV | |
| 7,957,148 B1 | 6/2011 | Gallarelli et al. | |
| 8,172,597 B1 | 5/2012 | Terhune, IV | |
| 8,465,241 B2 | 6/2013 | Gaw et al. | |
| 8,613,580 B2 | 12/2013 | Hecht | |
| 8,905,775 B2 | 12/2014 | Yeh | |
| 8,974,165 B2 | 3/2015 | Yumi et al. | |
| 9,028,635 B2 | 5/2015 | Jeong et al. | |
| 9,466,900 B1 | 10/2016 | Heng et al. | |
| 10,030,685 B2 | 7/2018 | Berton et al. | |
| 10,455,685 B1 | 10/2019 | Klein et al. | |
| 11,143,676 B2 | 10/2021 | Tramet et al. | |
| 2002/0036891 A1* | 3/2002 | Lo | H01L 23/4093 257/E23.086 |
| 2002/0060064 A1* | 5/2002 | Yu | H01L 23/4006 174/16.3 |
| 2003/0165371 A1 | 9/2003 | Notaro et al. | |
| 2003/0186578 A1 | 10/2003 | McClinton | |
| 2004/0156171 A1* | 8/2004 | Dong | H01L 23/4093 257/E23.086 |
| 2005/0112922 A1 | 5/2005 | Ma | |
| 2005/0191890 A1 | 9/2005 | Taylor et al. | |
| 2005/0208813 A1 | 9/2005 | Trout et al. | |
| 2005/0218035 A1 | 10/2005 | Pearson et al. | |
| 2005/0266604 A1 | 12/2005 | Byquist | |
| 2006/0275100 A1* | 12/2006 | Aukzemas | F16B 37/145 411/353 |
| 2007/0211431 A1* | 9/2007 | Munch | H01L 23/4338 361/696 |
| 2008/0256764 A1* | 10/2008 | Hsu | H01L 23/4093 24/457 |
| 2009/0110901 A1 | 4/2009 | Gaw et al. | |
| 2009/0191744 A1 | 7/2009 | Yeh et al. | |
| 2010/0035456 A1 | 2/2010 | Fan | |
| 2010/0130048 A1 | 5/2010 | Fan | |
| 2011/0070053 A1 | 3/2011 | Chang | |
| 2011/0249404 A1 | 10/2011 | Chiu | |
| 2012/0156913 A1 | 6/2012 | Haswarey et al. | |
| 2012/0162923 A1 | 6/2012 | Lee et al. | |
| 2012/0200993 A1 | 8/2012 | Aoki et al. | |
| 2013/0183087 A1 | 7/2013 | Weibel et al. | |
| 2013/0342997 A1 | 12/2013 | Yeh | |
| 2013/0343829 A1 | 12/2013 | Benedetti et al. | |
| 2014/0071647 A1 | 3/2014 | Bridges et al. | |
| 2014/0161558 A1* | 6/2014 | Hayashi | F16B 43/00 411/366.1 |
| 2014/0199873 A1 | 7/2014 | Liu et al. | |
| 2014/0234052 A1 | 8/2014 | Blom | |
| 2014/0262148 A1* | 9/2014 | Lin | H01L 23/4093 403/322.4 |
| 2015/0266260 A1 | 9/2015 | Fujioka et al. | |
| 2016/0285184 A1 | 9/2016 | Liu et al. | |
| 2016/0351526 A1 | 12/2016 | Boyd et al. | |
| 2017/0321411 A1 | 11/2017 | Junca | |
| 2018/0166807 A1 | 6/2018 | Boyd et al. | |
| 2019/0304869 A1 | 10/2019 | Larson et al. | |
| 2019/0393631 A1 | 12/2019 | Haswarey et al. | |
| 2020/0126889 A1 | 4/2020 | Mao et al. | |
| 2020/0378430 A1 | 12/2020 | Wakabayashi | |
| 2021/0318191 A1 | 10/2021 | Okulov | |

OTHER PUBLICATIONS

Office Action for U.S. Appl. No. 15/942,263, dated Jul. 7, 2021.
Office Action for U.S. Appl. No. 15/942,275, dated Aug. 27, 2021.
Office Action for U.S. Appl. No. 15/942,280, dated Oct. 22, 2021.
Restriction Requirement for U.S. Appl. No. 15/942,275, dated May 19, 2021.
Restriction Requirement for U.S. Appl. No. 15/942,278, dated May 17, 2021.
Restriction Requirement for U.S. Appl. No. 15/942,280, dated Apr. 20, 2021.
Notice of Allowance for U.S. Appl. No. 15/942,263, dated Dec. 2, 2021.
Notice of Allowance for U.S. Appl. No. 15/942,275, dated Dec. 14, 2021.
Notice of Allowance for U.S. Appl. No. 15/942,278, dated Mar. 17, 2022.

* cited by examiner

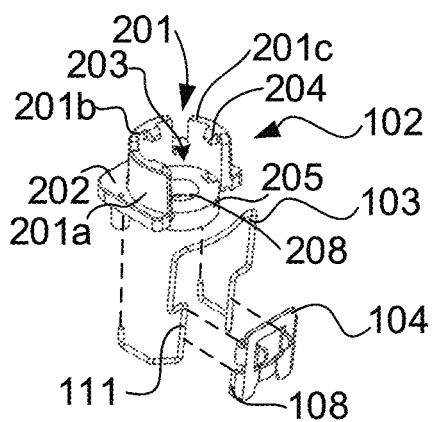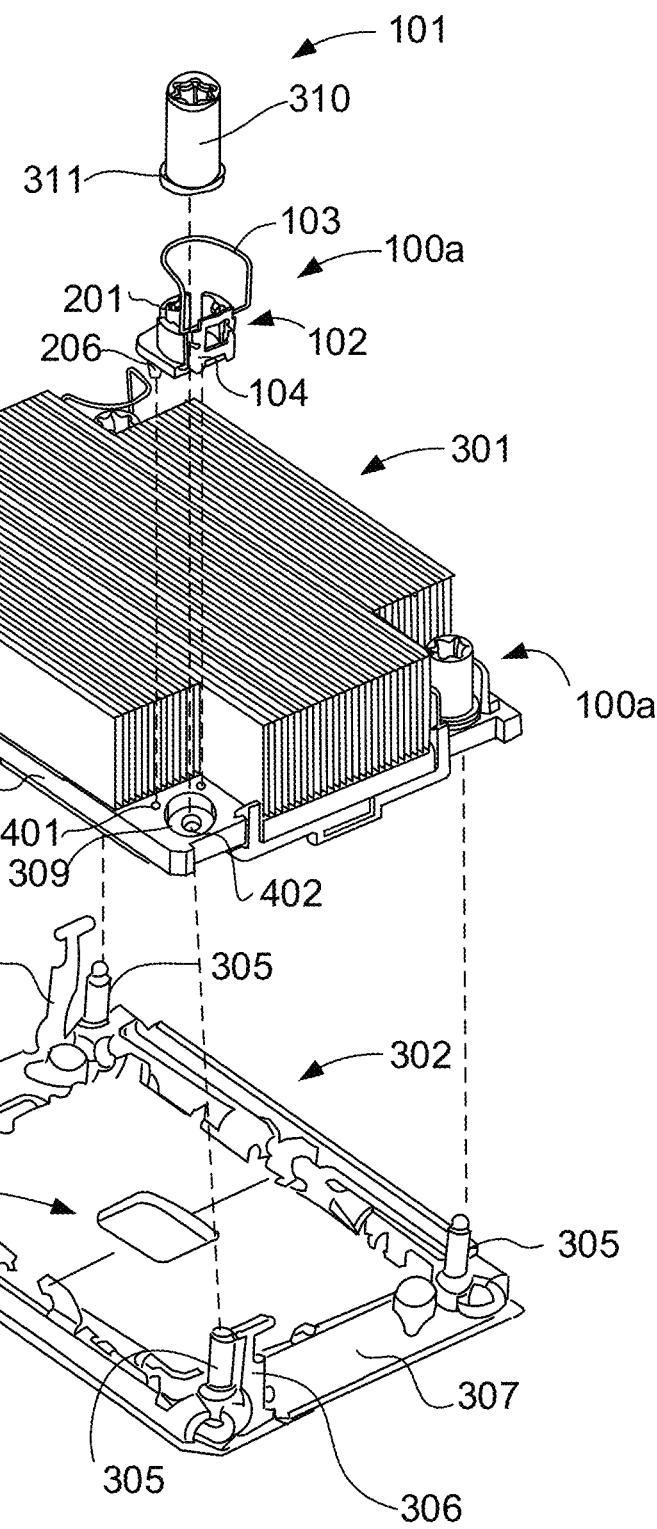

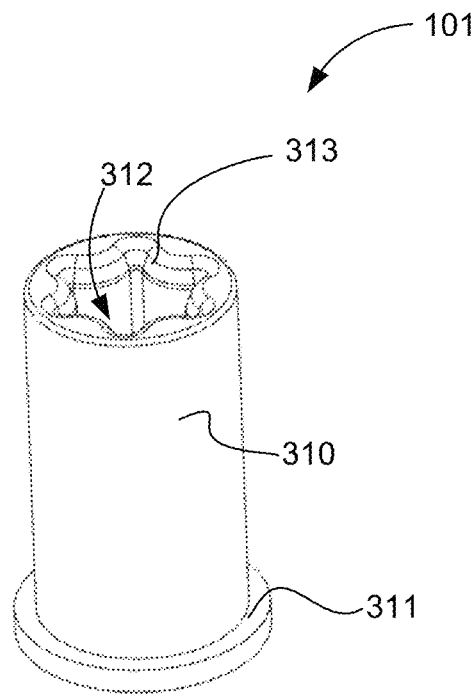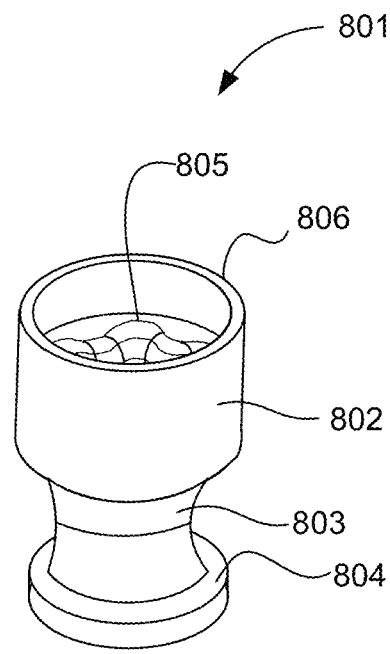
FIG. 8A
FIG. 8B
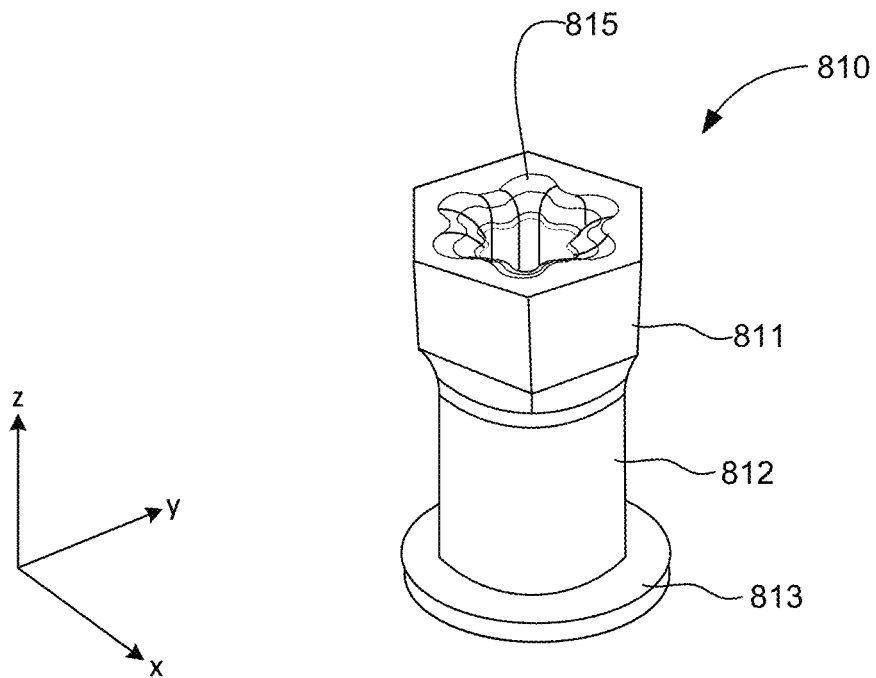
FIG. 8C

MECHANISM COMBINING FASTENER CAPTIVATION AND ASSEMBLY TILT CONTROL FOR MICROPROCESSOR THERMAL SOLUTIONS

BACKGROUND

Loading of modern land grid array (LGA) microprocessors into sockets requires the application of large for loads to ensure that all of the electrical connections between the processor package and the socket contacts are established and stable. Current methods to load a microprocessor on a socket includes placing a thermal solution, which is generally the heat transfer surface of a heatsink, on the integrated heat spreader on the die side of the microprocessor and bolted to a motherboard. The load is transferred to the microprocessor through the heatsink. Multiple fasteners and load points are used to apply the load, requiring a specific sequence of fastener tightening. In many cases, the heatsink is caused to tilt by uneven distribution of the of the load when the fasteners are tightened. This can displace the microprocessor, resulting in damage to the socket contacts and to the microprocessor.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 2A illustrates a top oblique view of an assembled anti-tilt base, according to some embodiments of the disclosure.

FIG. 2B illustrates a bottom oblique view of an assembled anti-tilt base, according to some embodiments of the disclosure.

FIGS. 4A-4B illustrate isometric views of an exemplary method of using an anti-tilt fastener assembly, according to some embodiments of the disclosure.

FIG. 8A illustrates an isometric view of a first embodiment of a retention nut for an anti-tilt fastener assembly, according to some embodiments of the disclosure.

FIG. 8B illustrates an isometric view of a second embodiment of a retention nut for an anti-tilt fastener assembly, according to some embodiments of the disclosure.

FIG. 8C illustrates an isometric view of a third embodiment of a retention nut for an anti-tilt fastener assembly, according to some embodiments of the disclosure.

DETAILED DESCRIPTION

Figure 1:
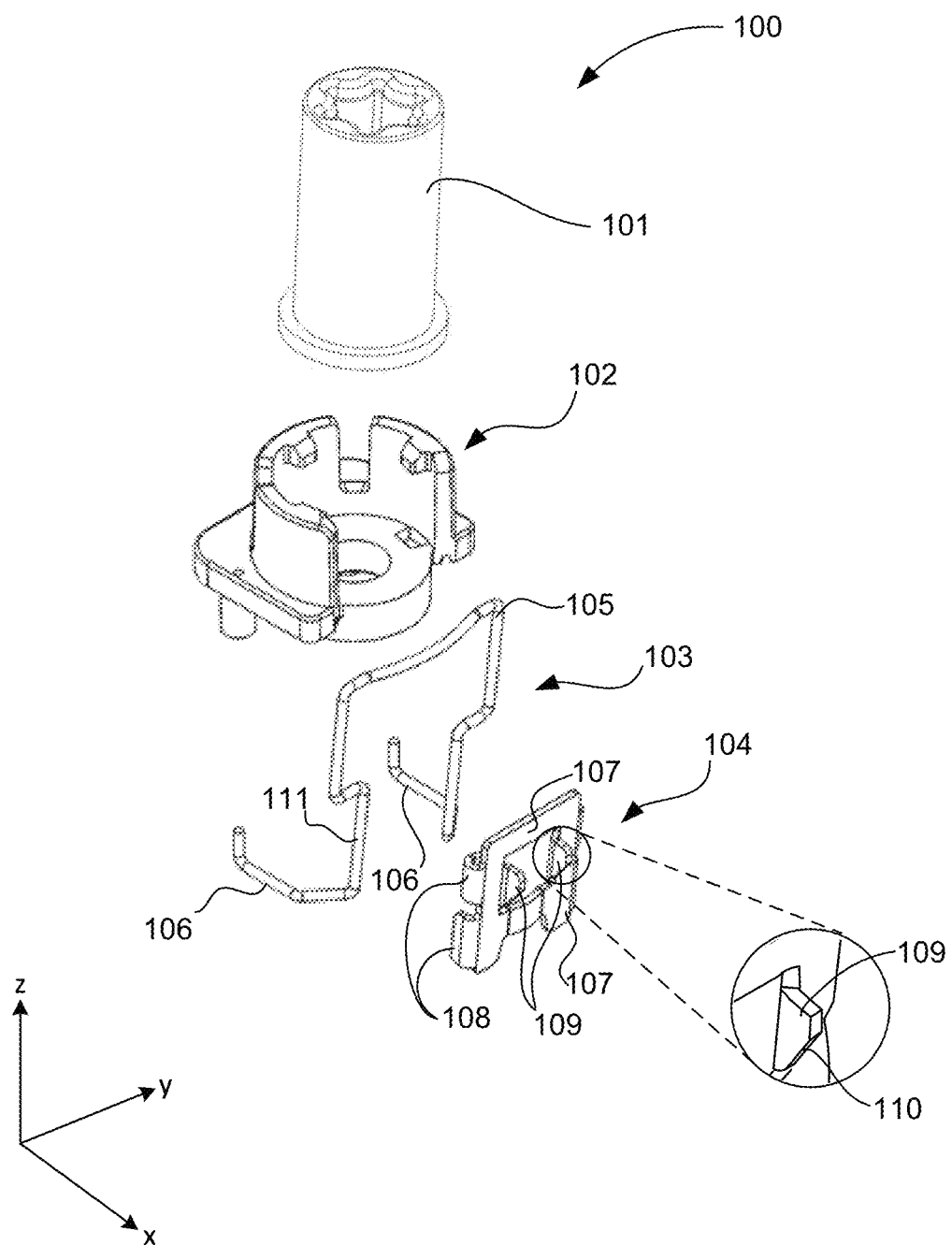
FIG. 1 illustrates an exploded view of an anti-tilt fastener assembly, according to some embodiments of the disclosure.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Due to the large power requirements for modern microprocessors employed in laptops, desktop workstations and servers, a thermal solution is necessary to remove heat from the microprocessor package. The thermal solution is generally in the form of a heatsink that comprises fins to remove heat by convective cooling. In most microprocessor mounting schemes, the microprocessor package is mounted in such a way that the microprocessor is in intimate contact with the heatsink. The microprocessor package typically comprises an integrated heat spreader (IHS) that is juxtaposed to a heat transfer surface on the bottom of the heatsink mounting flange. A thermal interface material, such as a heat transfer liquid or gel, is commonly spread on the IHS before mounting to enhance heat conduction from the microprocessor to the heatsink.

The heatsink is fastened over the microprocessor to apply a load on the microprocessor to compress the microprocessor against its socket. The load on the microprocessor is generally necessary to ensure that the electrical contact pads on the microprocessor are solidly coupled to corresponding contacts on the socket. In some embodiments, the heatsink is fastened on a microprocessor loading mechanism.

A microprocessor loading mechanism facilitates mounting a microprocessor on a computer motherboard or other printed circuit board (PCB). Microprocessor loading mechanisms may comprise a retention plate that is attached to a computer motherboard for a desktop machine or server, or any other microprocessor-hosting PCB. Typically, the retention plate surrounds a microprocessor socket designed for land grid array microprocessors. The retention plate may comprise mounting studs for mounting the heatsink.

The microprocessor socket may be attached directly to the PCB. The microprocessor is generally seated in the socket with a heatsink placed over the microprocessor and interfaced with an integrated heat spreader (IHS) on the die side of the microprocessor package. The heatsink is bolted down on the loading mechanism to provide a compressive load on the microprocessor. In some embodiments, the microprocessor and heatsink are assembled as a single module that is brought to the PCB and bolted to the loading mechanism.

A significant load on the microprocessor is necessary to press the lands on the microprocessor package against the pin array on the socket to ensure that 100% of the contacts on the microprocessor are solidly coupled to corresponding pins on the socket. In many cases, loads between 150 and 400 lbf are necessary to impose on the microprocessor package. In general, the required load scales in proportion to the size of the contact array. Modern microprocessor packages have contact counts of over 4000.

In conventional microprocessor installations, one nut is typically tightened at a time on the mounting studs. The load on the heatsink can be unbalanced, causing a tendency for the heatsink to tilt. The load imbalance is transmitted to the microprocessor package, which may tilt along with the heatsink. Damage may occur to the socket and pins. In some embodiments, the microprocessor is mounted in a carrier that is attached to the base of the heatsink and moves with it. To mitigate the load imbalance in conventional microprocessor installation schemes, nuts have to be tightened in a pattern and sequence.

The same conditions can arise when uninstalling a microprocessor. Unbolting the heatsink releases the load on the microprocessor. Balanced load becomes unbalanced as load is released unevenly as the nut fasteners are loosened one at a time. Nuts may be loosened and removed in a particular pattern to mitigate the load imbalance, but this increases service time.

Disclosed herein is an anti-tilt fastener assembly that may replace conventional fasteners (e.g., standard nuts) for mitigating load imbalances during microprocessor installation and removal. Anti-tilt fastener assemblies comprise a retention nut, captivation base, latch spring and latch plate. The latch spring and latch plate engages latching structures on a loading mechanism. The captivation base attaches to a heatsink mounting flange captivates the retention nut and aligns it to a mounting stud. Anti-tilt fastener assemblies disclosed herein restrict upward motion of the heatsink as the retention nuts are loosened on each mounting stud. In this way, the tendency of the heatsink to tilt is mitigated, and the heatsink remains substantially parallel during installation and deinstallation of the microprocessor.

Here, the term "package" generally refers to a self-contained carrier of one or more dies, where the dies are attached to the package substrate, and encapsulated for protection, with integrated or wire-boned interconnects between the die(s) and leads, pins or bumps located on the external portions of the package substrate. The package may contain a single die, or multiple dies, providing a specific function. The package is usually mounted on a printed circuit board for interconnection with other packaged ICs and discrete components, forming a larger circuit.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

FIG. 1 illustrates an exploded view of anti-tilt fastener assembly 100, according to some embodiments of the disclosure.

In FIG. 1, an exploded view is shown of anti-tilt fastener assembly 100, where anti-tilt fastener assembly 100 is an assembly comprising a retention nut 101, a base 102, a spring clip 103, and a latch plate 104. Retention nut 101 and base 102 are described in more detail in FIGS. 2A-2B. In some embodiments, spring clip 103 is a cantilever spring comprising a spring wire bent into a loop or bail 105, which may be contoured to serve as a finger catch. In some embodiments, spring clip 103 comprises anchor hooks 106, which engage with base 102 to cantilever spring clip 103 from base 102. In some embodiments, spring clip 103 functions as a cantilever compression spring, as described below. Spring clip 103 may comprise spring steel, such as piano wire, beryllium copper wire, or any wire comprising compositions that exhibit elastic deformation when bent off-axis. In some embodiments, spring clip 103 has dimensions ranging from 0.5 inch to 1 inch (12-25 mm) tall×0.5 inch to 1-inch wide×0.5 inch–0.7 inch deep. Spring clip 103 may be characterized as a clip, retention clip, or the like.

Latch plate 104 comprises a frame 107, which in some embodiments is substantially coplanar with spring clip 103, clasps 108 (or catches), and tabs 109. In some embodiments, clasps 108 and tabs 109 extend from frame 107. In some embodiments, tabs 109 extend from the plane of frame 107. In some embodiments, tabs 109 are substantially planar structures that extend orthogonally from frame 107. In some embodiments, tabs 109 comprise sloped or chamfered edges 110 as shown in the inset. In some embodiments, clasps 108 comprise snap and guide structures that attach latch plate 104 to spring clip 103, where clasps 108 snap onto wire receiving structures 111 of spring clip 103.

Latch plate 104 may be formed from any suitable material such as a sheet metal stock that can be stamped. For example, sheet metal stock may comprise steel alloys. In some embodiments, the sheet metal stock may comprise copper and beryllium alloys.

Figures 2A, 2B:
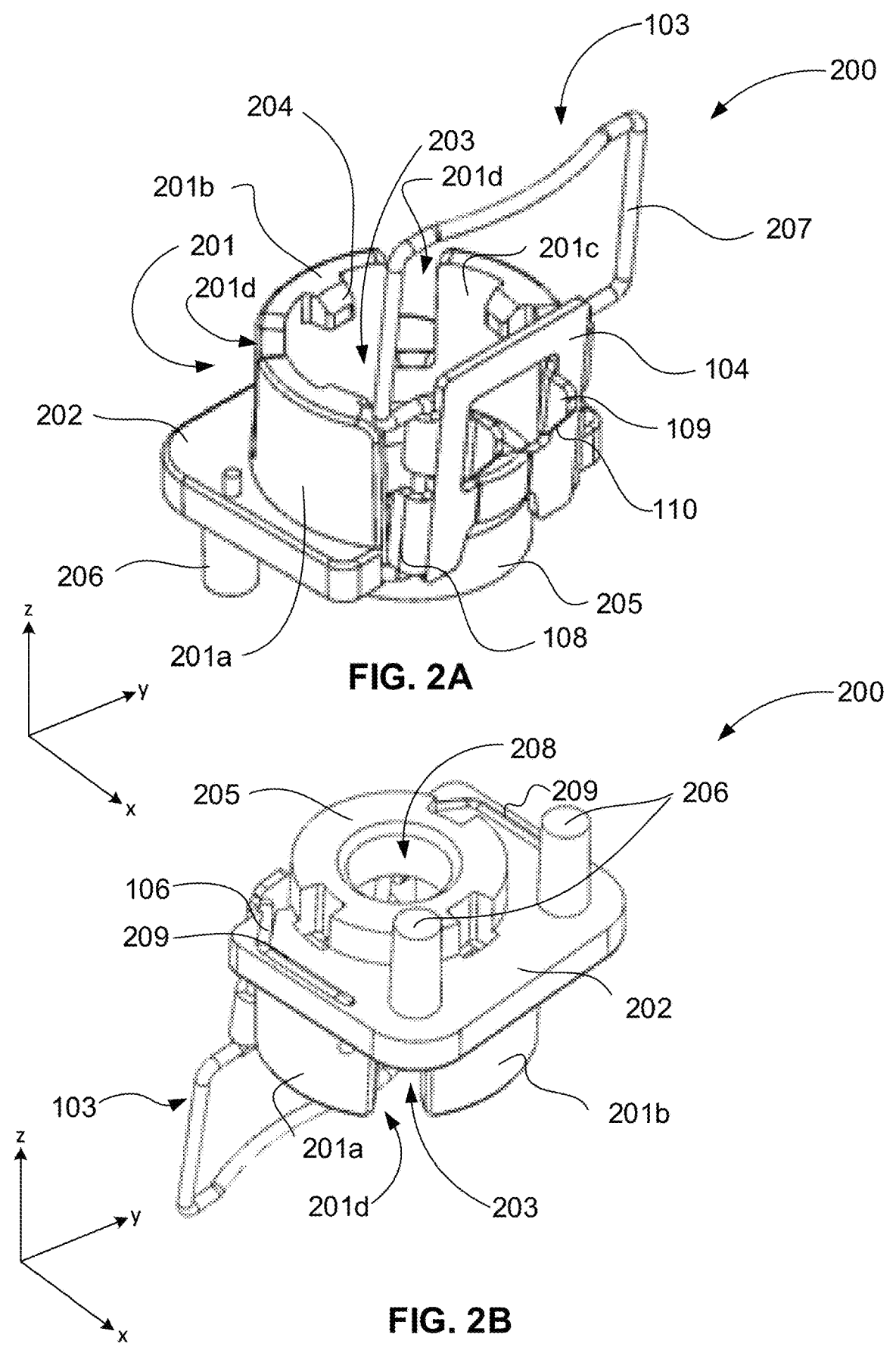

FIG. 2A illustrates a top isometric view of assembled anti-tilt base 200, comprising spring clip 103 mounted on base 102, and latch plate 104 attached to spring clip 103. Base 102 comprises captivation sleeve 201 integral with seating flange 202. In some embodiments, captivation sleeve 201 is divided into segments separated by gaps. In the embodiment shown in FIG. 2A, captivating sleeve comprises wall segments 201a, 201b, 201c, separated by gaps 201d. In some embodiments, captivation sleeve 201 comprises more than three segments. In some embodiments, captivating sleeve 201 comprises fewer than three wall segments.

Captivation sleeve 201 surrounds cavity 203, which is adapted to receive retention nut 101 (not shown). In some embodiments, alignment stubs 204 protrude into cavity 203 from the inner surface of wall segments 201a-201c. In some embodiments, alignment stubs 204 may be employed to capture and center a retention nut (e.g. retention nut 101 in FIG. 1) within cavity 203. Below the bottom side of seating flange 202 and integral therewith is collar 205, where seating collar 205 may be employed to insert into a counterbore around a bolt passage hole on the mounting flange of a heatsink to center the base around the bolt passage hole, as described below (see FIG. 3B). Alignment prongs 206 extend from the bottom of seating flange 202, and may be employed to assist seating collar 205, according to some embodiments. Alignment prongs 206 may be employed to anchor base 102 to the mounting flange by inserting into mating holes on the heatsink flange, as described below (see FIG. 4B).

Base 102 may include any suitable material or materials. In some embodiments, base 102 comprises a polymeric material, such as, but not limited to, polyether ether ketone (PEEK), polyesters such as polyethylene terephthalate (PET), polysulfones such as polyether sulfones (PES), poly (p-phenylene sulfide), polyetherimide such as capton and ultem, polycarbonate, polyamides such as nylon, acrylonitrile butadiene styrene (ABS), and poly(methyl methacrylate) (PMMA). In some embodiments, base 102 is a molded piece.

Latch plate 104 is attached to spring clip 103 by clasps 108. In some embodiments, spring clip 103 is cantilevered from base 102. Specifically, in some embodiments, spring clip 103 is cantilevered from seating flange 202. Spring clip 103 may be made to deflect away from captivation sleeve 201 by manual actuation, for example. In the illustrated embodiment, spring clip 103 comprises a loop or bail 207, which may be employed as a finger catch to bend spring clip 103 outward from captivation sleeve 201.

FIG. 2B illustrates a bottom oblique view of assembled anti-tilt base 200, according to some embodiments of the disclosure.

In FIG. 2B, the bottom side of seating flange 202 is shown, exposing further structural details of base 102. Seating collar 205 comprises passage hole 208 extending through the center of seating collar 205. Passage hole 208 opens into cavity 203 and may be employed to pass a threaded stud or bolt into cavity 203. In some embodiments, the center of passage hole 208 coincides with the center of captivation sleeve 201. In some embodiments, a retaining nut is centered over passage hole 208 by abutting alignment stubs 204 within cavity 203 to engage with a threaded stud or bolt extending into cavity 203.

Alignment prongs 206 are shown extending from the bottom surface of seating flange 202. In the illustrated embodiment, two alignment prongs 206 are shown. It is understood that the number of alignment prongs 206 are not limited to two, and any suitable number of alignment prongs 206 may be employed. Grooves 209 are incorporated into seating flange 202 to accommodate anchor hooks 106 of spring clip 103. Grooves 209 may be employed as fixations for anchor hooks 106, facilitating cantilevering spring clip 103 from seating flange 202.

Figure 3A:
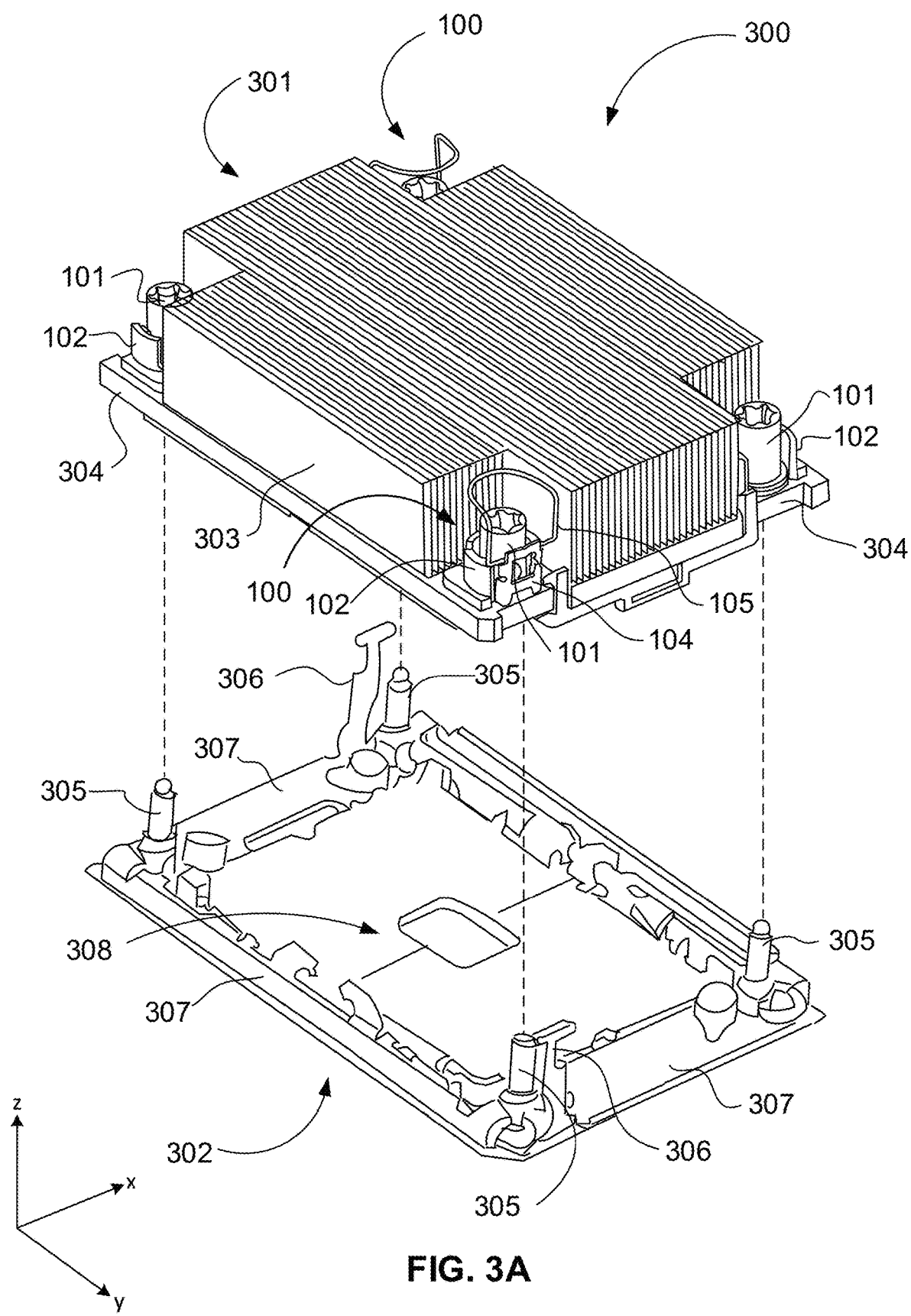
FIG. 3A illustrates an exploded isometric view of an implementation of an anti-tilt fastener assembly, according to some embodiments of the disclosure.

FIG. 3A illustrates an exploded isometric view of an implementation 300 of anti-tilt fastener assembly 100, according to some embodiments of the disclosure.

In FIG. 3A, implementation embodiment 300 is a microprocessor mounting assembly comprising heatsink 301 and bolster plate 302. Heatsink 301 comprises heat transfer fins 303 integral with mounting flange 304. Anti-tilt fastener assemblies 100 are positioned at the four corners of mounting flange 304. Not shown are bolt passage holes at the four corners of mounting flange 304, over which anti-tilt fastener assemblies 100 are centered. Heatsink 301 is mounted on bolster plate 302 by passage of threaded mounting studs 305 extending in the z-direction from the corners of bolster plate 302 through bolt passage holes (shown in FIG. 4B) in mounting flange 304, where they are engaged with retention nuts 101. Adjacent to mounting studs 305 are latching posts 306.

Bolster plate 302 comprises frame 307 surrounding microprocessor socket 308. In a typical implementation, bolster plate 302 is fastened to a computer motherboard or other printed circuit board substrate (not shown) and retains microprocessor socket 308 on the substrate. A microprocessor (not shown) is placed on the socket with contacts, which are typically a ball grid array (BGA) on the land side of the microprocessor, aligned with microspring contacts on the socket. The assembly is completed when heatsink 301 is positioned over the microprocessor and brought into contact with an integrated heat spreader (IHS), which is a heat transfer surface on the die side of the microprocessor. Heatsink 301 is aligned by passage of mounting studs 305 on bolster plate 302 through bolt passage holes at the corners of mounting flange 304. A load is applied to the microprocessor by compressing it against the socket as retention nuts 101 are engaged with mounting studs 305 and torqued down over mounting flange 304. In some embodiments, loads between 200 and 300 lbf are applied to the microprocessor by torqueing retention nuts 101 to torques between 4 in-lb and 16 in-lb on mounting flange 304.

In some embodiments, latching posts 306 are adjacent to mounting studs 305 on bolster plate 302. Anti-tilt fastener assemblies 100 are aligned to engage latch plates 104 with latching posts 306 (described below, see FIG. 3C). Latch plates 104 are loaded by spring clips 103, which act as cantilever springs under compressive strain when latch plates 104 are engaged with latching posts 306. The illustrated embodiment of FIG. 3A shows two latching posts 306 on opposing corners of bolster plate 302, adjacent to two of the mounting studs 305. Correspondingly, two anti-tilt fastener assemblies 100 are attached to opposing corners of mounting flange 304 aligned to the mounting studs 305 that are adjacent to each latching post 306. In some embodiments, four latching posts 306 are adjacent to the four mounting studs 305, where anti-tilt fastener assemblies 100 are attached to the four corners. In some embodiments, mounting flange 304 has additional bolt passage holes midway between corners, to mate with additional mounting studs 305 positioned along frame 307 midway between corners of bolster plate 302.

Latching posts 306 ensure parallelism between heatsink 301 and bolster plate frame 307. In some embodiments, a pre-load position and a load position are provided by latching posts 306 having a T-shaped structure at their tops. As will be described further below (FIGS. 5A and 5B), the pre-load and load positions ensure parallelism between mounting flange 304 and bolster plate 302 before a load is applied to the microprocessor from torque applied to retention nuts 101. Conventional microprocessor loading methods may cause the heatsink to disadvantageously tilt as the retaining nuts are torqued down, transferring uneven loads to the microprocessor, which may cause it to tilt as well. This may damage both the microprocessor and the microspring pins of microprocessor socket 308.

Figure 3B:
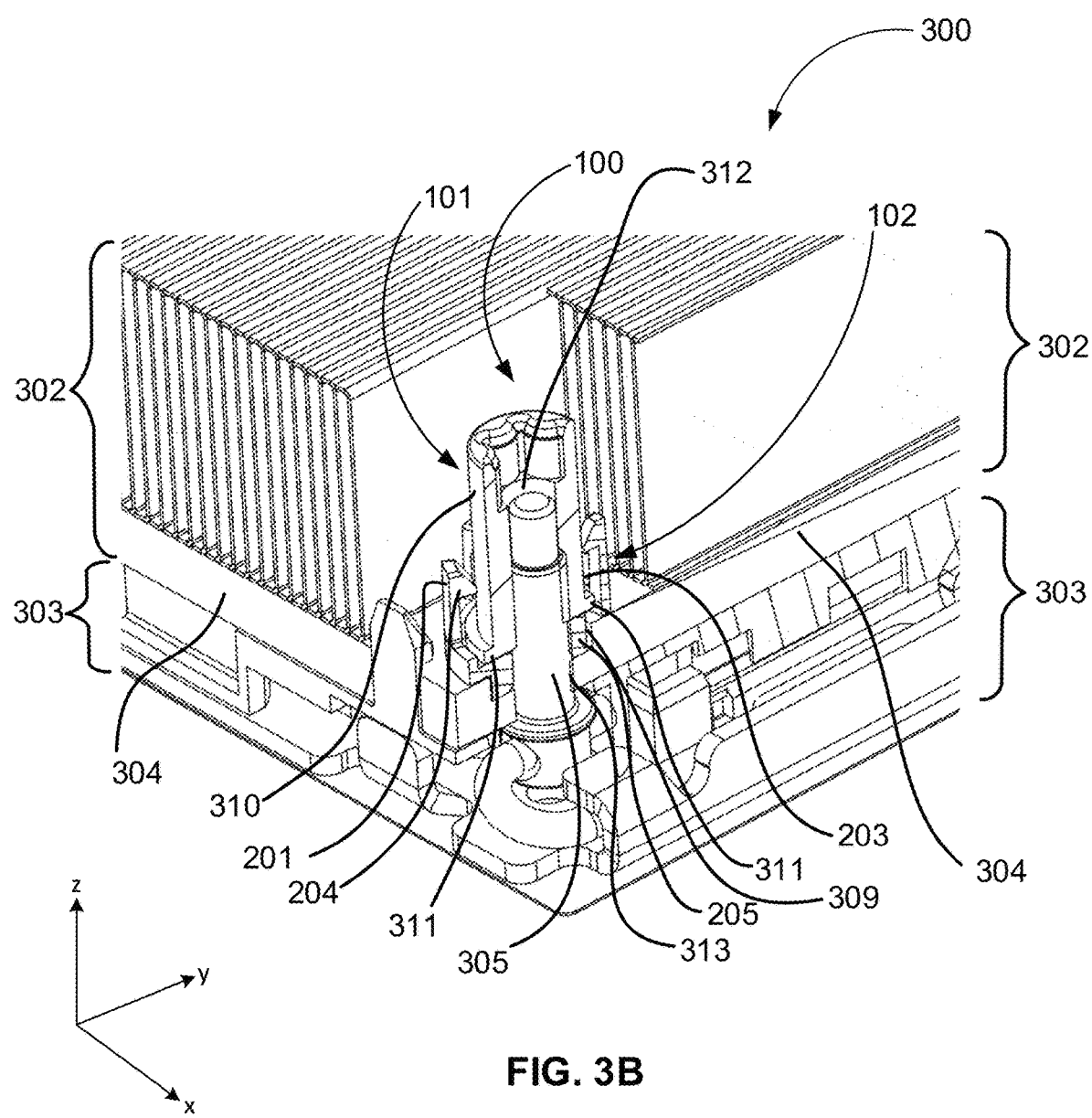
FIG. 3B illustrates a partial isometric view of an implementation showing a cutaway view of a single anti-tilt fastener assembly engaged with mounting structures, according to some embodiments of the disclosure.

FIG. 3B illustrates a partial isometric view of implementation 300 in a load position showing a cross-sectional view of a single anti-tilt fastener assembly 100 engaged with mounting structures, according to some embodiments of the disclosure.

In FIG. 3B, a partial view of implementation 300 in a load position, shows a corner of heatsink 301 mounted on bolster plate 302. A cutaway view of anti-tilt fastener assembly 100 engaged with mounting stud 305 is shown to reveal structural details. Retention nut 101 is seated within base 102, which is secured on mounting flange 304 by insertion of seating collar 205 within counterbore 309 of mounting flange 304. Retention nut 101 comprises a barrel 310 and a retaining flange 311. Threaded bore 312 extends coaxially along barrel 310. In some embodiments, threaded bore 312 extends only partially along the longitudinal axis of barrel 310. Retention nut 101 is captivated within cavity 203 of captivation sleeve 201, and abuts alignment stubs 204, which center retention nut 101 over bolt passage hole 313 extending through mounting flange 304. Mounting stud 305 extends substantially vertically (z-direction) from bolster plate 302 through bolt passage hole 313, and is engaged within threaded bore 312 of retention nut 101. In some embodiments, mounting stud 305 extends to driver pattern 313.

Figure 3C:
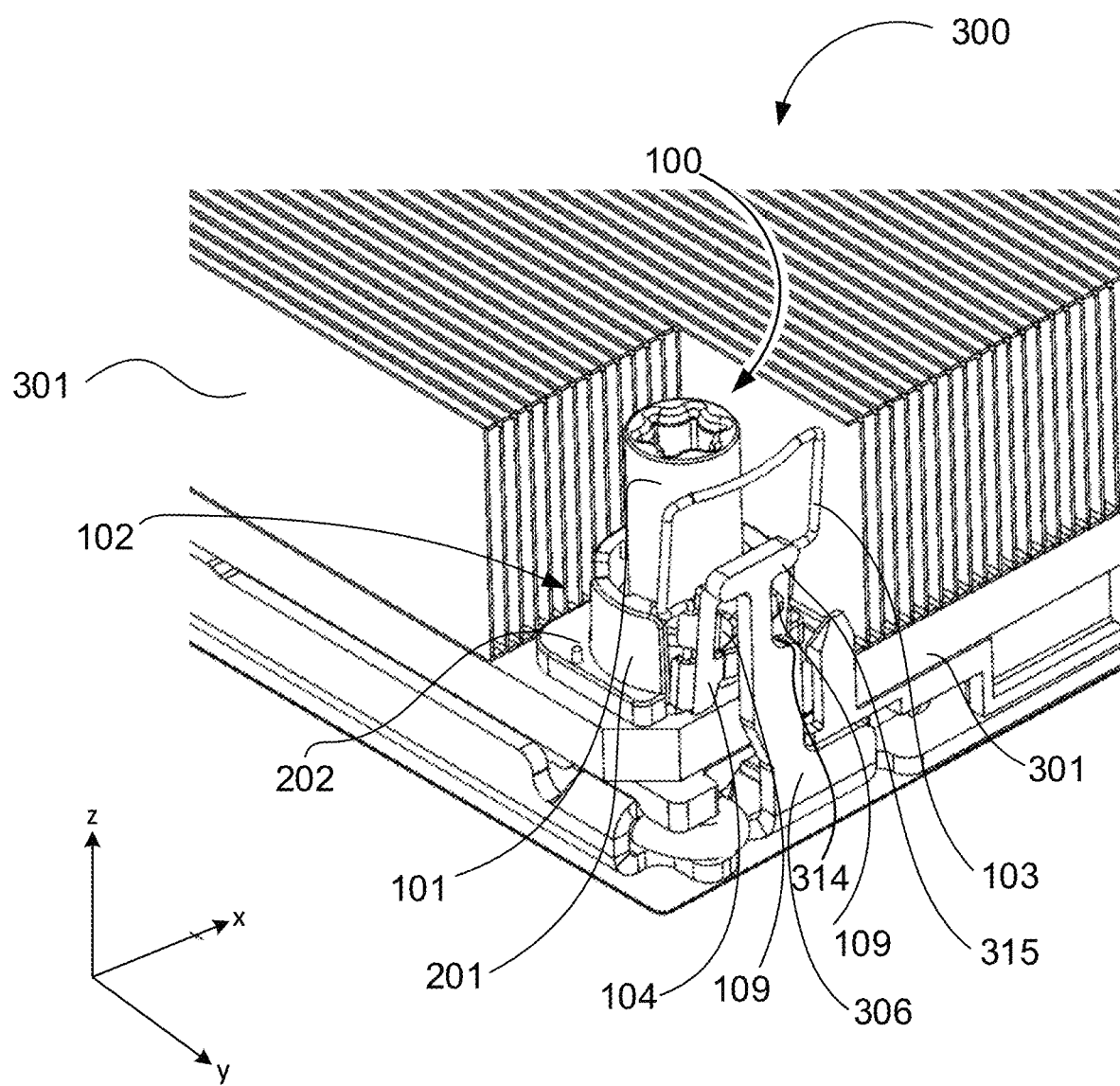
FIG. 3C illustrates a partial isometric view of an implementation, showing a complete view of an anti-tilt fastener assembly engaged with mounting structures, according to some embodiments of the disclosure.

FIG. 3C illustrates a partial isometric view of implementation 300, showing a complete view of anti-tilt fastener assembly 100 engaged with mounting structures, according to some embodiments of the disclosure.

In FIG. 3C, retention nut 101 is seated within captivation sleeve 201. Anti-tilt fastener assembly 100 is anchored to mounting flange 304 of heatsink 301 by seating flange 202. In some embodiments, captivation sleeve 201 is integral with seating flange 202 to complete base 102, and thus base 102 is anchored to mounting flange 304. As shown in FIG. 3B, seating collar 205, which is integral with seating flange 202, engages with counterbore 309 to anchor base 102 to mounting flange 304. In some embodiments, alignment prongs 206 shown in FIGS. 2A and 2B, also insert into mounting flange 304 (shown in FIG. 4B), further anchoring base 102.

Spring clip 103 presses latch plate 104 against latching post 306. Tabs 109 that extend orthogonally from latch plate 104 are engaged with notch 314 of latching post 306. Crossbar 315 confines tabs 109 within notch 314, restricting vertical movement of heatsink 301 as part of the anti-tilt function. In some embodiments, latching post 306 is integral with bolster plate 302. In the illustrated embodiment, and as described above, latching post 306 has a particular T-shape to enable the anti-tilt function. In some embodiments, other suitable shapes may provide substantially the same anti-tilt function by restricting vertical movement of heatsink 301 in the z-direction. In the illustrated embodiment, crossbar 315 and notch 314 confine tabs 109 within notch 314, ensuring parallelism between heatsink 301 and bolster plate 302 during application or removal of the load by tightening or loosening retention nut 101 on mounting flange 304.

FIGS. 4A-4D illustrate isometric views of an exemplary method of using anti-tilt fastener assembly 100, according to some embodiments of the disclosure.

In FIG. 4A, method 400 begins with assembly of anti-tilt fastener assembly 100, according to some embodiments. Anti-tilt fastener assembly 100 is shown in exploded view with dashed lines indicating the relationship between the components. Assembly may be made in any order; the following description is exemplary only and by no means is meant to be limiting. Spring clip 103 is mounted on base 102 by insertion of anchor hooks 106 into receiving grooves 209 on the bottom of seating flange 202 (not shown, see FIG. 2B). Latch plate 104 is mounted on spring clip 103 by attaching clasp 108 onto wire receiving structures 111. Retention nut 101 is to be inserted into captivation sleeve 201 in a subsequent operation. In some embodiments, anti-tilt fastener is received in an assembled state.

In the operation shown in FIG. 4B, anti-tilt fastener assemblies 100 (and/or partial assemblies 100a, where spring clip 103 and latch plate 104 are omitted) are inserted on mounting flange 304 of heatsink 301, as indicated by the dashed vertical connector lines. The dashed lines indicate alignment of partially assembled anti-tilt fastener assembly 100a with counterbore 309 and prong receiving holes 401. In some embodiments, anti-tilt fasteners 100 are assembled on mounting flange 304. In some embodiments, anti-tilt fastener assemblies 100 are attached to mounting flange 304 in a partially assembled state (e.g., 100a), with insertion of retention nut 101 in a subsequent operation. In the illustrated embodiment, diagonal corners of mounting flange 304 receive complete (100) and partial (100a) anti-tilt fastener assemblies. In the illustrated embodiment, partial anti-tilt fastener assemblies 100a lack spring clip 103 and latch plate 104. For example, tilt control of heatsink 301 may be accomplished using only two complete anti-tilt assemblies 100 placed at diagonal corners.

Base 102 is attached to mounting flange 304 by insertion of alignment prongs 206 into prong receiving holes 401 until seating flange 202 of base 102 abuts mounting flange 304. Alignment prongs 206 may be press-fit into receiving holes 401 to securely mount base 102. Seating collar 205 (not shown in FIG. 4B; see FIG. 4A) is inserted into counterbore 309. Centered within counterbore 309 is bolt passage hole 402, to which passage hole 208 in base 102 and retention nut 101 is aligned by captivation sleeve 201. In some embodiments, seating collar 205 is press fit into counterbore 309. In some embodiments, retention nut 101 comprises retaining flange 311. Retention nut 101 is pressed into captivation sleeve 201.

During insertion, retaining flange 311 at the base of retention nut 101 abuts alignment stubs 204 and is pushed downward, pushing apart wall segments 201a-201c, which close over retaining flange 311 once it is pushed past alignment stubs 204. The captivation action retains retention nut 101 within captivation sleeve 201. The wall of barrel 310 of retention nut 101 abuts alignment stubs 204, aiding in centering retention nut within captivation sleeve 201.

In the operation depicted in FIG. 4B, attachment of anti-tilt fastener assemblies 100 (and 100a, according to some embodiments) is combined with mounting heatsink 301 onto bolster plate 302. In some embodiments, bolster plate 302 is fastened to a printed circuit board substrate (not shown), such as, but not limited to, a computer motherboard. Frame 307 of bolster plate 302 surrounds microprocessor socket 308. In some embodiments, microprocessor socket 308 is fastened to bolster plate 302. In some embodiments, microprocessor socket 308 is fastened to the substrate directly. Heatsink 301 is mounted to bolster plate 302 by passing mounting studs 305 through bolt passage holes 402 on mounting flange 304. In the illustrated embodiment shown in FIG. 4B, this operation is performed by lowering heatsink 301 to bolster plate 302, aligning bolt passage holes 402 to mounting studs 305.

In some embodiments, the microprocessor is attached to a microprocessor carrier (not shown), which in turn is attached to the bottom side of mounting flange 304. In some embodiments, mounting flange 304 comprises a heat transfer surface (not shown). The heat transfer surface comprises a region of high heat conductivity, such as a copper or aluminum surface embedded in mounting flange 304, whose structural portion comprises steel, according to some embodiments. In some embodiments, an integrated heat spreader (IHS) is incorporated onto the die side surface of the microprocessor. The IHS is in intimate contact with the heat transfer surface when mounted on heatsink 301. In some embodiments, a layer of thermal interface material (TIM) is applied between the IHS and the heat transfer surface of mounting flange 304. A TIM is typically a gel or paste, spread as a thin layer to enhance thermal conduction from one surface to the other.

In some embodiments, the microprocessor is mounted on socket 308 on the substrate and not carried by heatsink 301. In some embodiments, microprocessor socket 308 comprises multiple contact pins (e.g., several thousand) that are in the form of microspring wires. The microspring wires have a load tolerance that when exceeded, may be damaged by application of excessive force. In some embodiments, a global load of 300 lbf or more on the microprocessor cannot be exceeded without risking damage to the socket contacts and the microprocessor itself. A minimum global load is generally required to ensure that all pads on the microprocessor (e.g., a LGA) contact all pins on the socket. In some embodiments, the minimum global load is 150-200 lbf.

In the illustrated embodiment of FIG. 4B, heatsink 301 is lowered over bolster plate 302, comprising frame 307 that surrounds socket 308 and the microprocessor (not shown) when seated within socket 308, establishing an interface between the IHS and the heat transfer surface of mounting flange 304. In conventional heatsink mounting operations, a heatsink similar to heatsink 301 is laid directly on top of the microprocessor. Various ways to fasten the heatsink to the substrate are available. During the fastening procedure, the microprocessor is compressed by a load transferred through the heatsink. When parallelism is maintained between the heatsink mounting flange and the microprocessor during application of a load when retention nuts 101 are torqued down, a uniform load is distributed evenly on the microprocessor, and transferred evenly to the contact pins on the socket. With even loading of the contact pins by transfer of a uniform load over the microprocessor, damage to the pins is avoided as long as the load tolerance (of the contact pins) is not exceeded.

However, in conventional heatsink mounting operations, the load may be applied unevenly due to the uneven distribution of force generated locally when torque is applied to the individual fasteners around the heatsink mounting flange. The uneven load distribution may cause the heatsink to tilt, thus compressing some socket pins with excessive force, while breaking contact with others. In attempts to avoid excessive tilting of the heatsink during conventional mounting, tightening procedures may require a special torqueing sequence, where fasteners are tightened in a strict pattern that may include cycles of partial tightening. These procedures tend to increase time necessary to mount a microprocessor on a motherboard.

Returning to the exemplary method of operation of FIG. 4B, alignment of heatsink 301 with bolster plate 302 by passage of mounting studs 305 through bolt passage holes 402 immediately centers mounting studs 305 to retention nuts 101 (indicated by the vertical dashed connector line), where mounting studs 305 and retention nuts 101 are substantially coaxial. In some embodiments, retention nut 101 is inserted into captivation sleeve 201 after base 102 is secured to mounting flange 304. In some embodiments, retention nut 101 is inserted in captivation sleeve 201 before attachment.

Lowering heatsink 301 onto bolster plate 302 ultimately juxtaposes latching posts 306 with latch plates 104 in the preload position mentioned above. The interaction between latching posts 306 and latch plates 104 plays a central role in the tilt control afforded by anti-tilt fastener assemblies 100, and is now described.

Figure 5A:
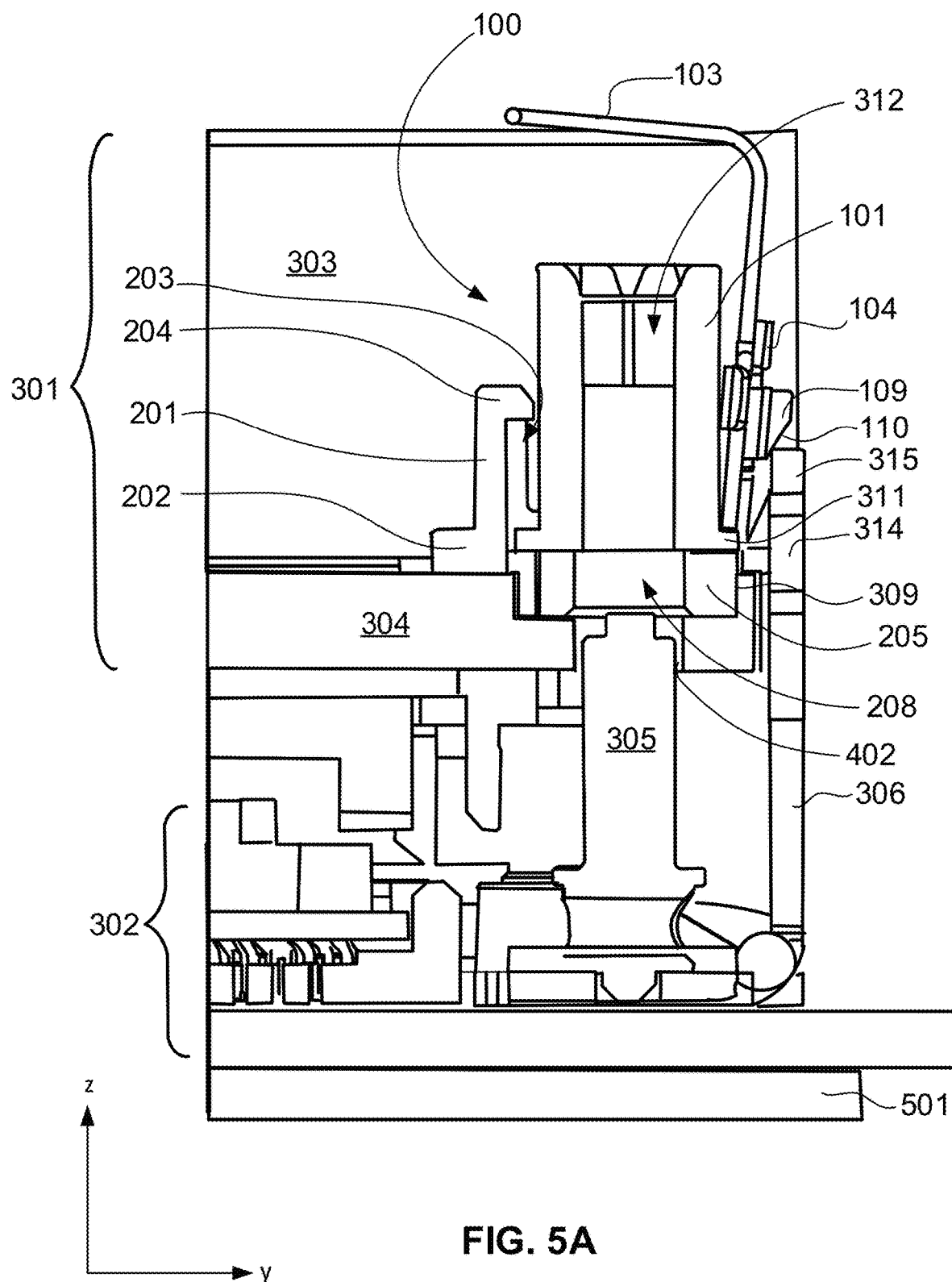
FIGS. 5A-5B illustrate cross-sectional views of an exemplary method of using an anti-tilt fastener assembly, according to some embodiments of the disclosure.
Figure 5B:
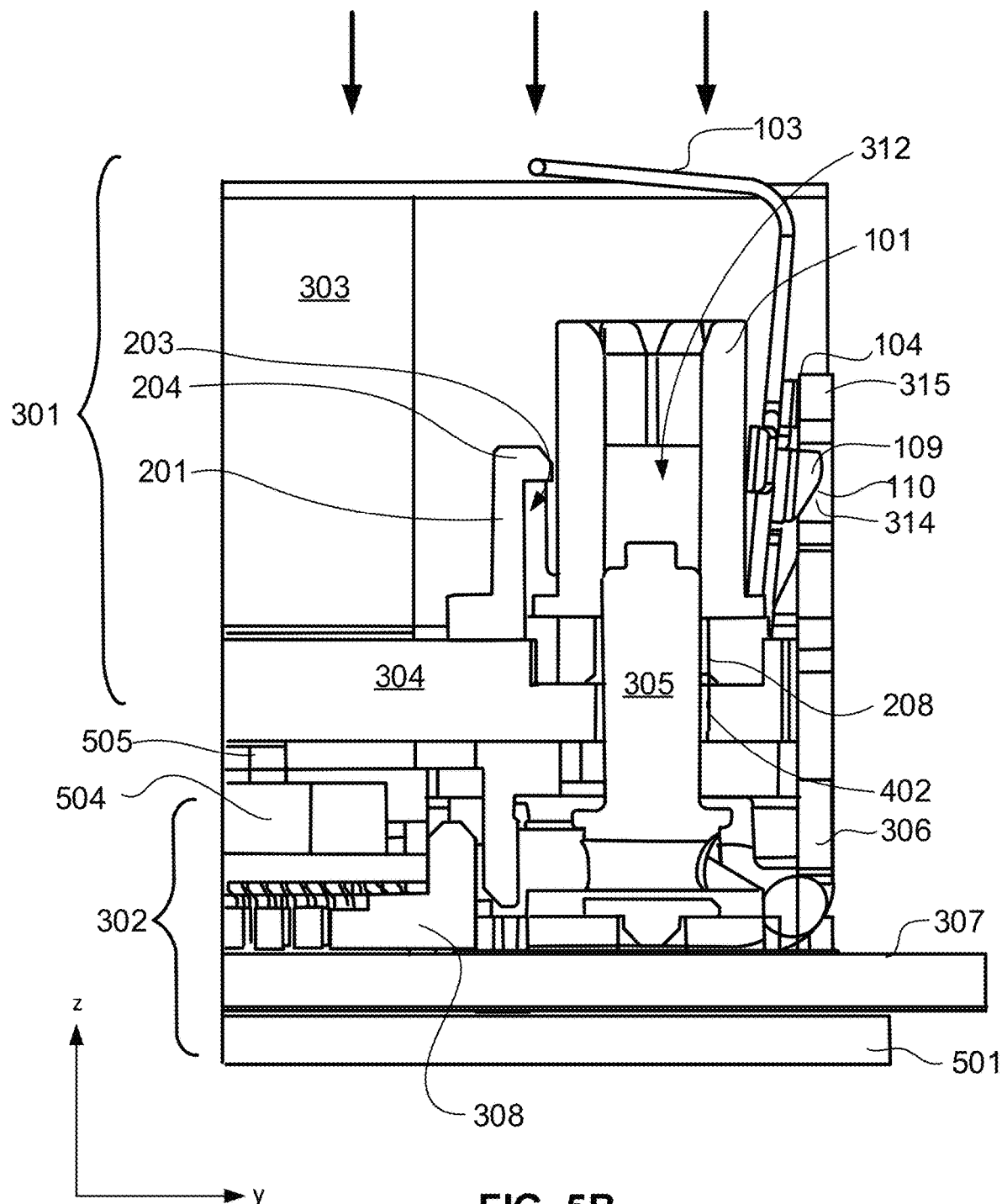

FIGS. 5A-5B illustrate cross-sectional views of an exemplary method of using anti-tilt fastener assembly 100, according to some embodiments of the disclosure.

In the operation shown in FIG. 5A, heatsink 301 is pre-loaded over bolster plate 302 to establish parallelism before a load is applied when retention nuts 101 are engaged with mounting studs 305 and torqued down on mounting flange 304 in subsequent operations. In some embodiments, bolster plate 302 is fastened to substrate 501. In the pre-load position, tabs 109 that extend outward (away from retention nut 101) orthogonally from latch plate 104, rest on top of latching posts 306 on bolster plate 302. Tension in spring clip 103 presses latch plate against latching post 306, where tabs 109 rest on crossbar 315. In some embodiments, latching post 306 comprises plate steel, and is substantially immovable. In some embodiments, tension in spring clip 103 is sufficient to suspend heatsink 301 over bolster plate 302, where spring clip 103 is not caused to collapse and deflect toward retention nut 101 by the weight of heatsink 301 alone. Inward deflection of spring clip 103 (toward retention nut 101) releases latch plate 104 from latching post 306, which causes heatsink 301 to descend toward bolster plate 302. As described below, sufficient force exerted from downward hand pressure on heatsink 301 overcomes tension in spring clip 103, and forces sloped edges 110 of tabs 109 to slide over crossbar 315.

Torques engendered by the reaction of latching post 306 on latch plate 104 are countered by the reaction of mounting flange 304 on seating flange 202 of base 102, and by the walls of counterbore 309 on seating collar 205. The counter reaction forces stabilize anti-tilt fastener assemblies 100 during pre-loading and contribute to maintaining pre-load parallelism.

As shown in FIG. 5A, mounting studs 305 are aligned with bolt passage holes 402 and caused to partially extend through bolt passage holes 402 when sloped edge 110 of tab 109 is brought to rest on crossbar 315. In some embodiments, mounting studs 305 extend at least partially through passage hole 208. Retention nut 101 is centered within captivation sleeve 201 by virtue of alignment stubs 204, permitting mounting stud 305 to be automatically aligned with passage hole 208 centered within seating collar 205. Mounting stud 305 is aligned with bore 312 of retention nut 101, which is coaxial with passage hole 208 and bolt passage hole 402. Retention nut 101 has a degree of freedom of motion in the z-direction within cavity 203 of captivation sleeve 201, and may be pushed upward by mounting stud 305 to accommodate the length or penetration of mounting stud 305. Retention nut 101 is constrained to remain within captivation sleeve 201 by alignment stub 204 reacting on retaining flange 311 at the base of retention nut 101.

In the operation shown in FIG. 5B, downward force (indicted by the downward pointing arrows) is applied over heatsink 301 to overcome the tension in spring clip 103, causing tab 109 to slide smoothly over crossbar 315 (by virtue of sloped edge 110) and be captivated in notch 314. Heatsink 301 is in the load position. In this way, the parallelism established in the pre-load position (FIG. 5A) is maintained by controlled descent of heatsink 301 into the load position, effectuated by simultaneous release of spring clips 103 on multiple symmetrically distributed anti-tilt fastener assemblies 100.

Mounting stud 305 now fully penetrates through bolt passage hole 402 in mounting flange 304 and passage hole 208, entering into cavity 203 to abut bore 312 of retention nut 101. As retention nut 101 can move in the z-direction within cavity 203, it may float freely on top of mounting stud 305, therefore mounting stud 305 may have any length that does not exceed the z-height of captivation sleeve 201. The mouth of bore 312 may be countersunk to allow entry of the tip of mounting stud 305 to aid the engagement of mounting stud 305 with threads of retention nut 101.

In the load position, the microprocessor that is carried by mounting flange 304 is now seated in socket 308 on bolster plate 302. In some embodiments, keying structures 504 on microprocessor carrier ensure proper alignment of the microprocessor and socket 308. In this state, no load is yet applied on heatsink 301. As torque is applied to each retention nut 101 where multiple anti-tilt fastener assemblies 100 are employed, load increases locally at each corner of mounting flange, tending to tilt heatsink 301 upwards. Tilt control is effectuated by tab 109 extending from latch plate 104, which bucks the upward movement of an opposing corner or edge in the z-direction by abutting crossbar 315 from inside notch 314, restricting z-motion of the opposing corner or edge that has not yet been fastened.

Figure 6A:
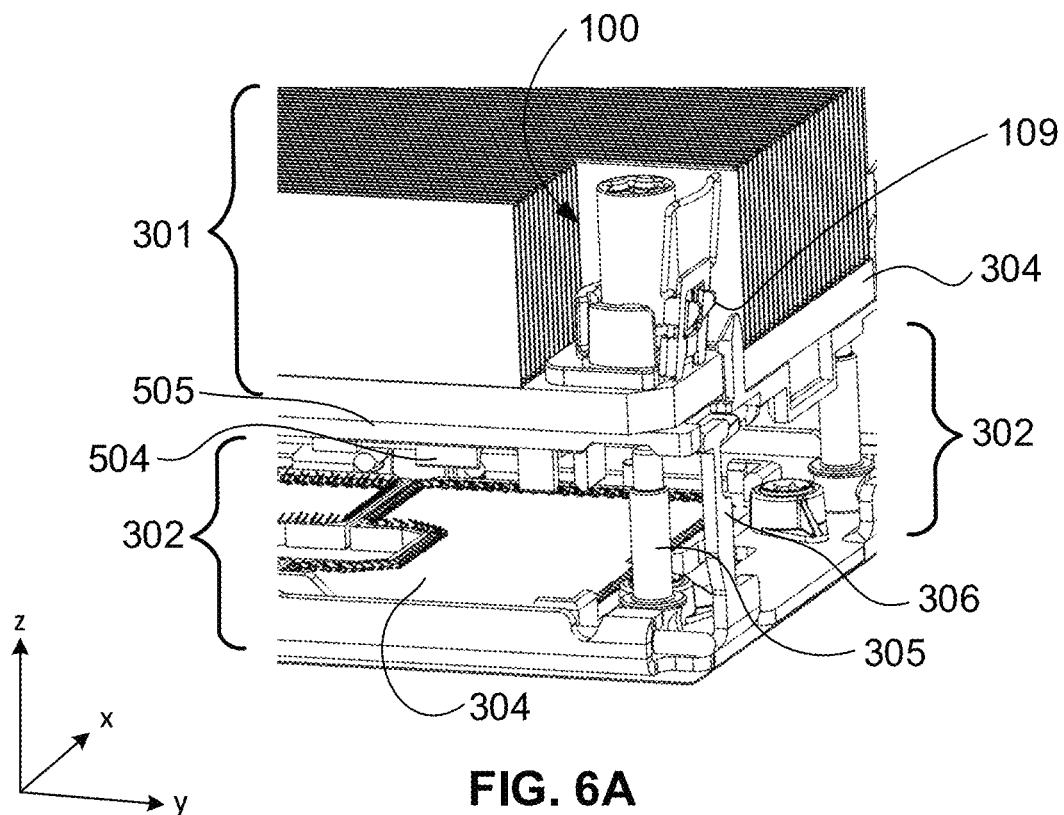
FIGS. 6A-6B illustrate isometric views of the exemplary method of using an anti-tilt fastener shown in FIGS. 5A and 5B, according to some embodiments of the disclosure.
Figure 6B:
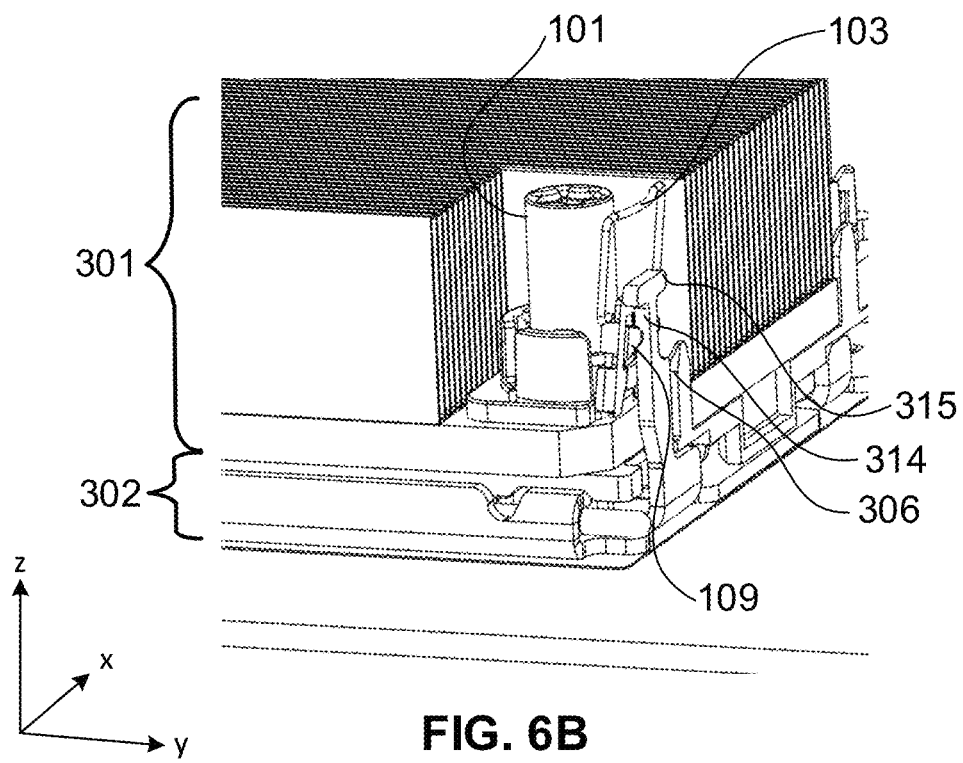

FIGS. 6A-B illustrate isometric views of the exemplary method of using anti-tilt fastener assembly 100 shown in FIGS. 5A and 5B, according to some embodiments of the disclosure.

FIG. 6A shows an isometric representation of the cross-sectional view of FIG. 5A. The isometric view shows details that are not visible in the cross-sectional views. Heatsink 301 carries anti-tilt fastener assembly 100 on mounting flange 304, and is positioned over bolster plate 302 to align mounting stud 305 under anti-tilt fastener 101. Below heatsink 301 are keying structures 504 extending from microprocessor carrier 505, that align with mating features of socket 308. Alignment of retention nut 101 with mounting stud 305 lines up latching post 306 with tabs 109.

FIG. 6B shows an isometric representation of the cross-sectional view of FIG. 5B. Heatsink 301 is lowered onto bolster plate 302, seating the microprocessor in microprocessor socket 308 (not shown in FIG. 6B). Tabs 109 are locked in notch 314 by spring clip 103. In this operation retention nut 101 is engaged with mounting stud 305 (as in FIG. 6A, not shown). In some embodiments, retention nut 101 may be torqued down on mounting flange 304 in any order without risking tilting of heatsink 301, protecting the microprocessor.

Figure 7:
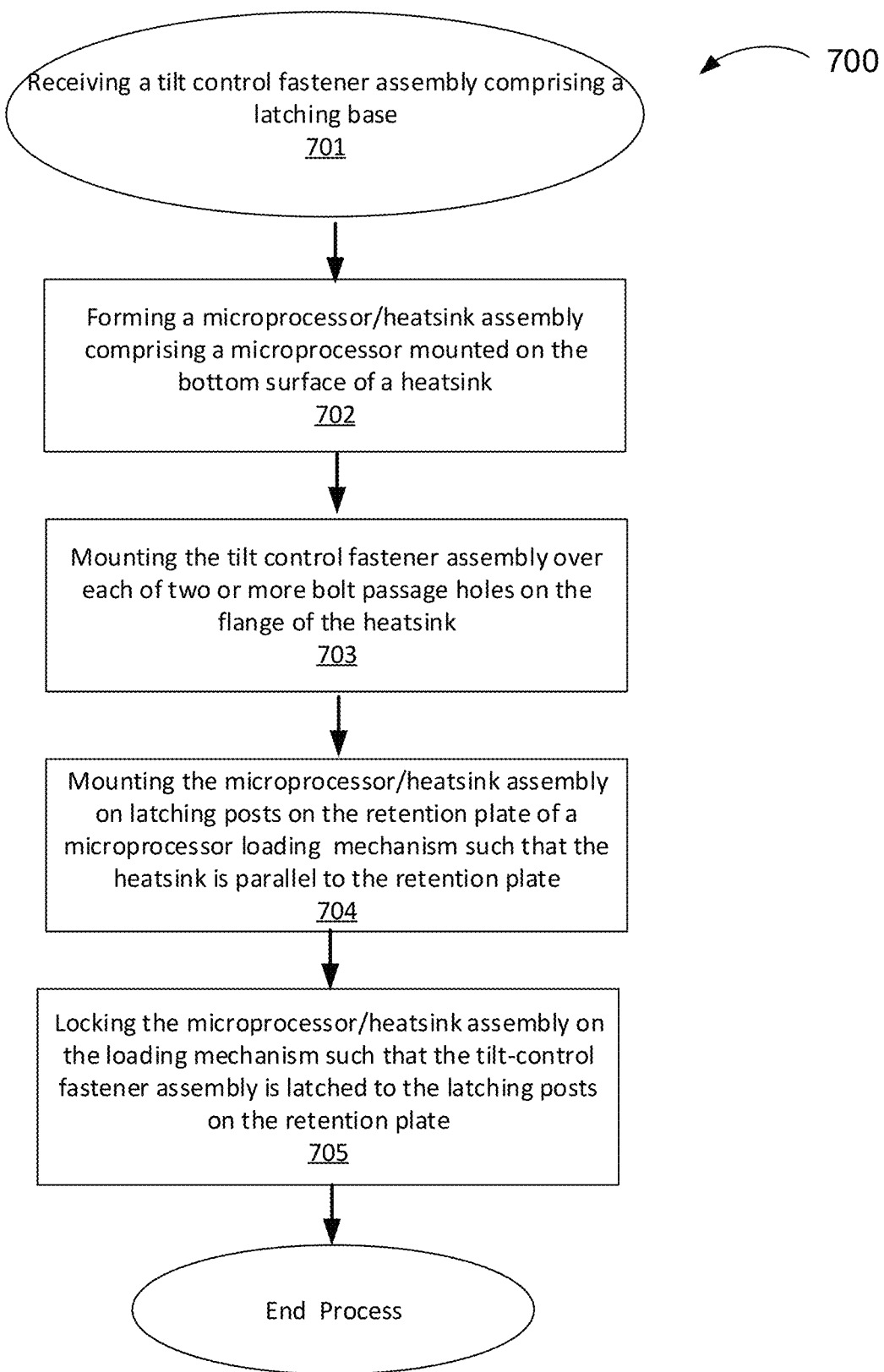
FIG. 7 illustrates a flow chart for an exemplary method of using an anti-tilt fastener assembly, according to some embodiments of the disclosure.

FIG. 7 illustrates flow chart 700 for an exemplary method of using anti-tilt fastener assembly 100, according to some embodiments of the disclosure.

At operation 701, one or more anti-tilt fastener assemblies are received for microprocessor installation on a printed circuit board (PCB), such as, but not limited to, a computer motherboard. Installation methods commonly seat a microprocessor package in a socket mounted on a PCB, placing a substantially heavier heatsink over the microprocessor package.

Microprocessor packages frequently comprise an integrated heat spreader (IHS) on the die side of the package. The IHS is interfaced with a heat transfer surface integrated in the base plate of the heatsink. The heatsink is bolted down over a retaining plate around the socket. Retention nuts are tightened on mounting studs extending through holes in a mounting flange at the base of the heatsink. While the retention nuts are being tightened, load is generated on the heatsink and distributed over the microprocessor package. The load is necessary to compress the microprocessor package against the socket such that the multiple thousands of contacts on the microprocessor package make reliable connections with the pins on the socket. Too little load will cause open contacts; too much load can damage the pins, socket and/or microprocessor package.

As typically one nut is tightened at a time, the load on the heatsink can become unbalanced and engenders a tendency for the heatsink to tilt. The load imbalance is transmitted to the microprocessor package, which may tilt along with the heatsink. Damage may occur to the socket and pins. In some embodiments, the microprocessor is mounted in a carrier that is attached to the base of the heatsink, and moves with it. To mitigate the load imbalance in conventional microprocessor installation schemes, nuts have to be tightened in a pattern and sequence.

The anti-tilt fastener assembly (e.g., 100 in FIG. 1) may replace conventional nuts for generating load on a microprocessor. Anti-tilt fastener assemblies comprise a retention nut, captivation base, latch spring and latch plate. The latch spring and latch plate engages latching structures on a retention plate. The captivation base captivates the retention nut and aligns it to a mounting stud.

At operation 702, a microprocessor package is mounted in a suitable microprocessor carrier (e.g., microprocessor carrier 1100 in FIG. 11; however, any suitable carrier design for mounting on heatsink may be employed) that is attached to the base plate of a heatsink. The microprocessor carrier comprises latch tabs (e.g., latch tabs 1207 in FIG. 12A) that fit around the mounting flange of the heatsink (e.g., see FIG. 13A). The carrier/microprocessor assembly ("package" is omitted here) is then mounted on the base of the heatsink, forming a microprocess/heatsink assembly. In some embodiments, the IHS of the microprocessor package is interfaced with the heat transfer surface on the bottom surface of the heatsink base plate.

At operation 703, the anti-tilt fastener assemblies are mounted over bolt passage holes on the mounting flange of the heatsink (e.g., see FIG. 4B). In some embodiments, bolt passage holes (e.g., holes 309 in FIG. 4B) are counterbored (e.g., counterbore 402 in FIG. 4B). The anti-tilt fastener assembly base components seat in the counterbores, holding captivated retention nuts (e.g., retention nut 101 in FIG. 1) and aligning the retention nuts with the bolt passage holes. In some embodiments, alignment prongs extending from the base component fit into holes (e.g., holes 401 in FIG. 4B) to aid in anchoring and centering the anti-tilt fastener assemblies.

At operation 704, the microprocessor/heatsink assembly formed at operation 702 is mounted on a retention plate. In some embodiments, the retention plate is a bolster plate (e.g., bolster plate 302 in FIG. 3A). In some embodiments, the retention plate is part of a microprocessor loading mechanism. The retention plate is fastened to a PCB, which is typically a computer motherboard. The retention plate comprises mounting studs and latching posts adjacent to at least two mounting studs (e.g., see FIG. 3A).

The mounting process occurs in two stages. First, the microprocessor/heatsink assembly is lowered onto of the retention plate, where mounting studs pass through the bolt passage holes and through the base component to abut the captivated retention nuts. The latch plate component of the anti-tilt fastener assemblies perch on the latching posts (e.g., perch on crossbar 315 in FIG. 3C). The microprocessor/heatsink assembly is suspended a few millimeters over the microprocessor socket so the microprocessor package does not seat within the socket. By perching on at least two latching posts on diagonal corners, the parallelism of the microprocessor/heatsink assembly can be adjusted. In some embodiments, the retention plate comprises a latching post at each of the four corners of the retention plate. Perching the latch plate component of each anti-tilt fastener assembly on the four latching posts automatically aligns the microprocessor/heatsink assembly to the socket below (e.g., see FIG. 5A).

Alternatively, in some embodiments, the microprocessor package is separate from the heatsink, and seated in the socket that is within an aperture in the retention plate comprising the latching posts. The heatsink is lowered onto the retention plate latching posts as a separate unit. Following the steps outlined above, the heatsink is first aligned and made parallel to the microprocessor package in the socket.

At operation 705, a downward steady force is applied over the heatsink, pushing the microprocessor/heatsink assembly (or the heatsink separately) down and onto the microprocessor socket. The latch plate components of the anti-tilt fastener assemblies engage with the latching posts, locking the heatsink/microprocessor assembly (or heatsink separately) onto the retention plate.

Release of the load during unmounting procedure can imbalance the load, tending to tilt the heatsink. The latch plate component of the anti-tilt fastener assemblies restricts vertical movement of any corner of the heatsink, thereby preventing the heatsink from tilting upwards.

The following description concerns the composition of retention nut 101 and related embodiments. The embodiments described below are exemplary and understood not to be limiting.

During computer manufacture and servicing, it is common for the microprocessor be unloaded and re-loaded multiple times, where retention nuts undergo numerous torque cycles. In some manufacturing lines, retention nuts may be tightened and untightened between 12 and 30 times. In addition to loading cycles during computer manufacture, repair or upgrade of the motherboard may cause end-users to replace the microprocessor more than one time.

As retaining nuts are generally made from steel alloys, load cycle demands can cause excessive wear of the retaining nuts. Flaking of metal particles result from the wear, which may cause risk of short circuits. Disclosed herein is a retention nut fastener comprising an injection-molded thermoplastic material that does generate electrically conductive debris from wear as do metal nuts. In some embodiments, the thermoplastic material is glass-filled polyether ether ketone (PEEK) that comprises a glass fiber fill composition ranging between 15%-30%. The retention nut fastener of the present disclosure does not show signs of wear even when subjected to more than 1000 loading cycles.

FIG. 8A illustrates an isometric view of retention nut 101, according to some embodiments of the disclosure.

In FIG. 8A, retention nut 101 comprises barrel 310, retaining flange 311 at the base of barrel 310, threaded bore 312 extending through barrel 310 (described in greater detail below and shown in FIGS. 8A, 8B and 9) and driver pattern 313 at the top of barrel 310. In some embodiments, retention nut 101 or any other retention nut discussed herein comprises a thermoplastic such as, but not limited to, polyether ether ketone (PEEK), polyether ketone (PEK), polyether sulfones (PES), and polyphenylene sulfides (PPS). In some embodiments, retention nut 101 or any other retention nut discussed herein comprises fibrous-filled PEEK. In some embodiments, the fibrous fill material comprises glass fibers having a composition between 15% and 30% by weight in a PEEK matrix. In some embodiments, the glass fill material comprises glass fibers. In some embodiments, the fibrous fill material comprises carbon fibers in a PEEK matrix.

In some embodiments, barrel 310 of retention nut 101 has a cylindrical shape with cylindrical symmetry. In specific embodiments, barrel 310 has a straight wall (e.g., outer wall) extending from retaining flange 311 to driver pattern 313. In some embodiments, barrel 310 has a length to diameter ratio of 1:1 or greater. Drive pattern 313 may be shaped to mate with various nut driving tools. As shown in FIG. 8A, in some embodiments, drive pattern 313 is a six-pointed star pattern for receiving a star wrench. In other embodiments, drive pattern 313 is a hexagon for receiving an Allen wrench (hex key). In other embodiments, drive pattern 313 is a slot for receiving a slotted screw driver blade. In some embodiments, drive pattern 313 is a cross pattern for receiving a Phillips screw driver tip.

FIG. 8B illustrates an isometric view of an example retention nut 801, that is compatible with anti-tilt fastener assembly 100, according to embodiments of the disclosure.

In FIG. 8B, retention nut 801 comprises a head 802 and barrel 803 extending between head 802 and retaining flange 804. Retention nut 801 may replace retention nut 101 in anti-tilt fastener assembly 100. In some embodiments, retention nut 801 has a length to diameter ratio of 1:1 or greater. In some embodiments, retention nut 801 is dimensioned to fit within captivation sleeve 201 of anti-tilt fastener assembly 100. Retaining flange 804 extends from barrel 803. In some embodiments, retention nut 801 is substituted for retention nut 101 in anti-tilt fastener assembly 100. In some embodiments, retention nut 801 comprises a thermoplastic and/or fill material(s) such as those described above for retention nut 101.

In some embodiments, head 802 has a larger diameter than barrel 803. In some embodiments, head 802 is recessed such that drive pattern 805 is substantially below top rim 806 of head 802, is as shown in FIG. 8B. The recessed level of drive pattern 805 may aid in prevention of a driver tip from slipping from head 802. In other embodiments, drive pattern 805 is substantially planar with the top rim 806.

FIG. 8C illustrates an isometric view of an example retention nut 810 that is compatible with anti-tilt fastener assembly 100, according to embodiments of the disclosure.

In FIG. 8C, retention nut 810 comprises head 811 having hexagonal shape with hexagonal symmetry (e.g., having a hexagonal cross-sectional shape). Barrel 812 extends between head 811 and retaining flange 813. In some embodiments, top surface 814 of head 811 comprises driver pattern 815. Driver pattern 815 may receive a driver tip, such as a star wrench tip, Phillips head tip, square tip, etc. In some embodiments, head 811 comprises a hexagonal sidewall, as shown in FIG. 8C, for receiving a box-end wrench or open-end wrench. In some embodiments, retention nut 810 comprises a thermoplastic and/or fill material(s) such as those described above for embodiment 101.

Figure 9A:
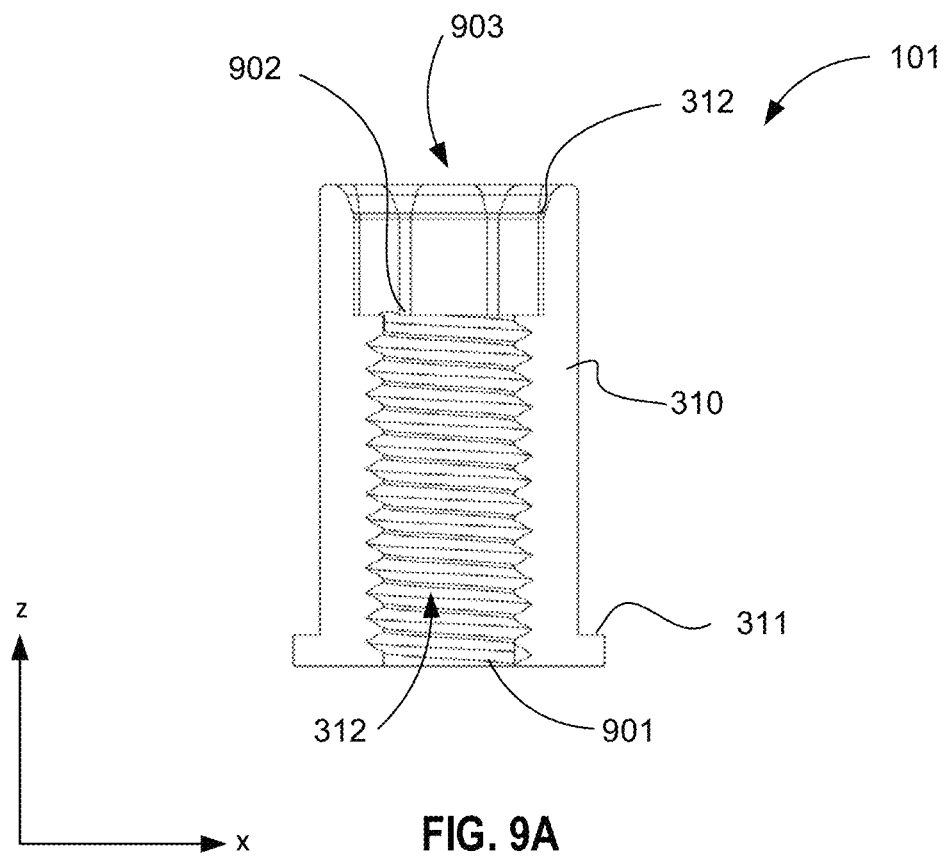
FIG. 9A illustrates a cross-sectional view of a retention nut having a through-bore, according to some embodiments of the disclosure.

FIG. 9A illustrates a cross-sectional view of retention nut 101 to reveal details of threaded through-bore 312, according to some embodiments of the disclosure.

In FIG. 9A, retention nut 101 comprises threaded through-bore 312 extending through barrel 310 along a central axis thereof, from stud entrance 901 to stud exit 902, below drive pattern 313 within driver well 903. In the illustrated embodiment, through-bore 312 is threaded from stud entrance 901 to stud exit 902. Through-bore 312 may accept long studs as shown in FIG. 3B. Retention nut 101 comprises retaining flange 311 to enable captivation within base 102 of anti-tilt fastener assembly 100. Threaded bore 312 may be present within any retention nut discussed herein such as retention nut 801 or retention nut 810.

Figure 9B:
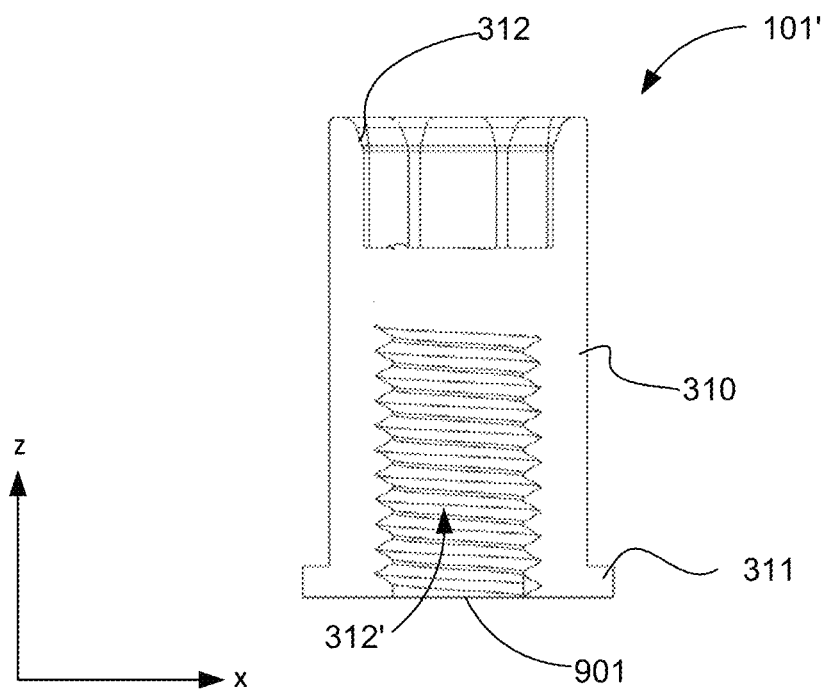
FIG. 9B illustrates a cross-sectional view of a retention nut having a blind bore, according to some embodiments of the disclosure.

FIG. 9B illustrates a cross-sectional view of retention nut 101 having a blind bore, according to some embodiments of the disclosure.

In FIG. 9B, retention nut 101' comprises blind bore 312', coaxial with barrel 310. Blind bore 312' extends partially from stud entrance 901' and terminates within barrel 310, not reaching through to driver well 903. In some embodiments, retention nut 101' is substantially similar to retention nut 101, and may substitute for retention nut 101. Blind bore 312' may be present within any retention nut discussed herein such as retention nut 801 or retention nut 810.

Figure 10:
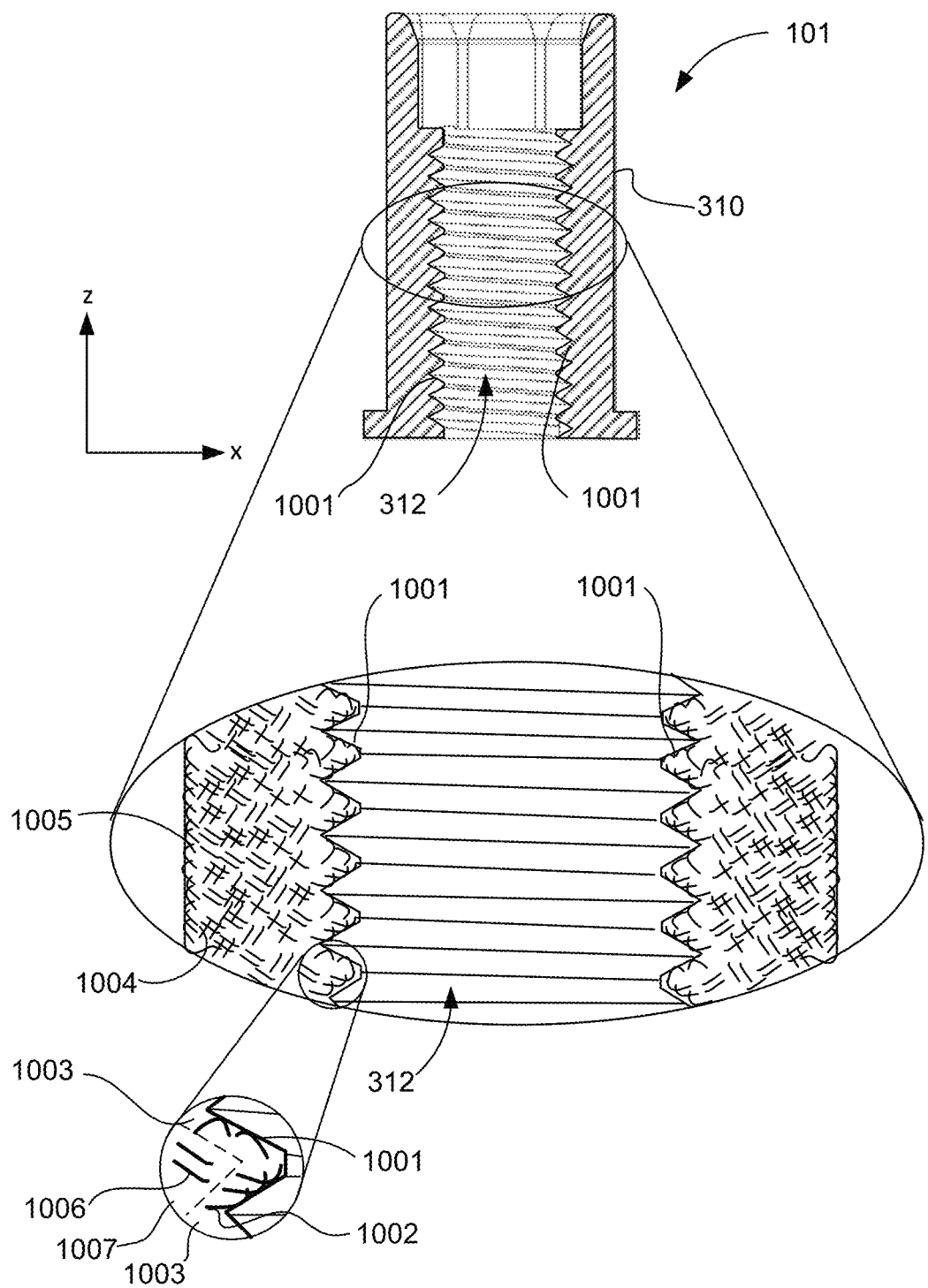
FIG. 10 illustrates a cross-sectional view of the structure of fill-fibers in fiber filled PEEK body of a retention nut, according to some embodiments of the disclosure.

FIG. 10 illustrates a cross-sectional view of the exemplary structures of fill-fibers in a fiber filled PEEK body of retention nut 101, according to some embodiments of the disclosure.

In FIG. 10, a cross-sectional view of retention nut 101 is shown. In some embodiments, retention nut 101 is manufactured from an injection molded thermoplastic comprising a composition of fiber-filled PEEK. The inset in FIG. 10 shows a magnified view of threads 1001 to reveal the microstructure of two types of fibers embedded in the PEEK matrix of retention nut 101. Sub-surface fibers 1002 are embedded in the sub-surface region 1003 of threads 1001, and in the sub-surface region 1004 of outer wall 1005 of barrel 310. Bulk fibers 1006 are embedded in the interior bulk regions 1007 of barrel 310. In the inset, sub-surface region 1003 is separated from bulk region 1007 by the dashed lines. In some embodiments, the sub-surface region 1003 extends from the surface up to 100 microns into the bulk regions 1007 within threads 1001 and outer wall 1005. In some embodiments, sub-surface fibers 1002 have a different structure than bulk fibers 1006.

Referring to the inset in FIG. 10, sub-surface fibers 1002 have a bent shape, possessing substantial curvature, according to some embodiments. In some embodiments, both ends of sub-surface fibers 1002 extend toward the bulk region 1007 from within sub-surface region 1003 of threads 1001. In contrast, bulk fibers 1006 are substantially straight, according to some embodiments. In some embodiments, fibers 1002 and 1006 are glass fibers. In some embodiments, fibers 1002 and 1006 are carbon fibers.

In some embodiments, the curved shape of the subsurface fibers 1002 is a result of the injection molding process. Temperature gradients at the surface of the molded piece can create density gradients while the molten plastic is cooling. At the outer surface and sub-surface regions may cool before the bulk, densification of the melt can force fibers to migrate away from the surface and into the bulk. In some embodiments, the surface and sub-surface regions of injection molded threads 1001 may be have fewer fibers in comparison to bulk regions 1007.

The temperature gradients experienced near the surface of injection molded thermoplastic pieces can cause fibers to bend. Surface tension in sub-surface regions 1002 may retain fibers while convection of the liquid thermoplastic tends to pull on the fibers, dragging the end portions toward the bulk, while the middle section of the fibers at the surface are held back from moving into the bulk. Short fibers may by completely held at the surface or immediately below the surface in the sub-surface region 1003 by surface tension. End portions of longer fibers may be pulled inward by convective forces during cooling of the melt, but middle portions held at the surface by surface tension as if caught in a tug-of-war by both forces.

Curvature of surface fibers 1002 may vary, according to some embodiments. In some embodiments, fibers 1002 have large curvature. In some embodiments, fibers 1002 have low curvatures. In some embodiments, the curvature of fibers 1002 scale with their length. In some embodiments, an average of the curvatures (e.g., any measure of scalar curvature) of fibers 1002 within sub-surface regions 1003, 1004 is greater than an average of the curvatures of fibers 1006. Such an average of curvatures may be determined using any suitable technique or techniques such as sampling some fibers, determining their curvatures using any techniques, and averaging the curvatures of the sampled fibers to determine a representative curvature. In some embodiments, the curvatures may be determined as scalar values such as an inverse of the radius of a circle fit to the maximum curve of the fiber or a rate of change of a unit tangent vector for a particle moving at a unit speed along the fiber. Other techniques for measuring curvature are available.

Conventional manufacture of thermoplastic fasteners employs machining methods, such as cutting threads by lathe tooling. In contrast to the curved shape of sub-surface fibers 1002 in injection-molded retention nuts 101, machined fiber-filled PEEK may produce sub-surface fibers that are substantially straight. Machined threads are cut from a bulk stock. Generally, the surface and sub-surface regions are cut away, and the bulk of stock material is worked. Bulk fibers 1006 are substantially straight. Cutting with a tool (such as a lathe shaping tool) is done in the bulk regions of a piece of stock material to form threads or other structure on the body of retention nut 101. Surface and sub-surface regions of machined fiber-filled PEEK contain substantially straight fibers that may extend from the surface into the bulk regions.

Attention is now turned to description of microprocessor carrier 1000 comprising an integrated microprocessor release mechanism. The microprocessor release mechanism comprises a lever articulating on the frame of microprocessor carrier 1000, and a wedge at an end of the lever extending into the interior of the microprocessor carrier. In a first embodiment, the lever rotates in a plane parallel to the microprocessor carrier. In a second embodiment, the lever rotates in a plane orthogonal to the microprocessor carrier.

Figure 11:
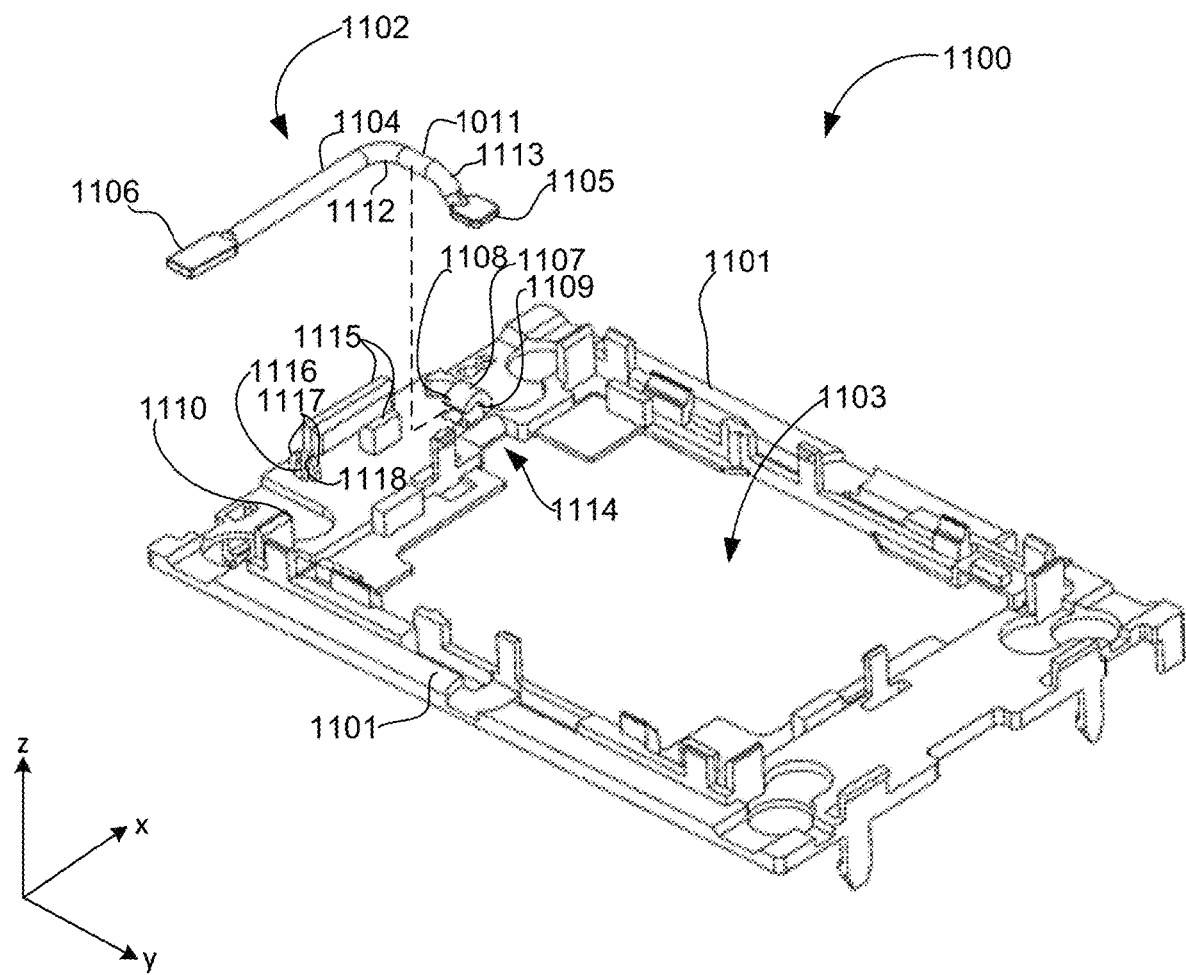
FIG. 11 illustrates an isometric exploded view of a first embodiment of a microprocessor carrier comprising a microprocessor release lever, according to some embodiments of the disclosure.

FIG. 11 illustrates an isometric exploded view of a first embodiment of microprocessor carrier 1100 comprising a microprocessor release lever, according to some embodiments of the disclosure.

In FIG. 11, microprocessor carrier 1100 comprises frame 1101 and microprocessor release lever 1102. Frame 1101 surrounds microprocessor receiving aperture 1103. Microprocessor release lever 1102 comprises shaft 1104 and blade 1105. In some embodiments, at least a portion of shaft 1104 has a circular cross-section. In some embodiments, microprocessor release lever 1102 comprises grip 1106. In some embodiments, grip 1106 is substantially flat. It will be understood that in some embodiments, grip 1106 may have any suitable geometry. In some embodiments, sleeve 1107 comprises deformable split wall 1108 surrounding passage 1109 for receiving microprocessor release lever 1102. In some embodiments, microprocessor release lever 1102 attaches to frame 1101 by insertion of shaft 1104 into passage 1109 through split wall 1108, indicated by the dashed line. It will be understood that embodiments are not limited to the afore-mentioned description, and that other suitable structures are possible for attachment of shaft 1104 to frame 1101. In some embodiments, passage 1109 is cylindrical, and has an axis that coincides with the axis of rotation of microprocessor release lever 1102. In some embodiments, microprocessor release lever 1102 is to rotate in a plane that is substantially parallel to the x-z plane when actuated. In some embodiments, shaft 1104 is substantially parallel to edge 1110 of frame 1101 along the x-direction when microprocessor release lever 1102 is in a stowed position.

In some embodiments, shaft 1104 comprises lever portion 1112 curved in the x-y plane such that the blade end of shaft 1104 extends substantially in the y-direction, into the microprocessor receiving aperture 1103. In some embodiments, lever portion 1112 has a cylindrical geometry with a circular cross-section. Lever portion 1112 passes through passage 1109 of sleeve 1107. In some embodiments, lever portion 1112 has an axis that coincides with the axis of passage 1109. In some embodiment, lever portion 1112 has an axis that coincides with the axis of rotation of microprocessor release lever 1102.

In some embodiments, shaft 1104 comprises lever portion 1113 that extends from lever portion 1111 from a first end. Lever portion 1113 has a second end that is curved in the z-direction to extend below the axis of rotation of lever portion 1112 through notch 1114. Blade 1105 extends from the second end of lever portion 1113 substantially in the y direction. In some embodiments, blade 1105 is substantially parallel to the x-y plane when microprocessor release lever 1102 is in the stowed position.

In some embodiments, tabs 1115 are substantially parallel to one another, and extend along edge 1110 and substantially orthogonal to frame 1101. In some embodiments, microprocessor release lever 1102 extends between tabs 1115 when in the stowed position. In some embodiments, clip 1116 is adjacent to tabs 1115. In some embodiments, clip 1116 comprises compliant prongs 1117 that flank gap 1118 centered on a line that is centered between tabs 1115. Gap 1118 is to receive microprocessor release lever 1102 when in the stowed position.

Figure 12A:
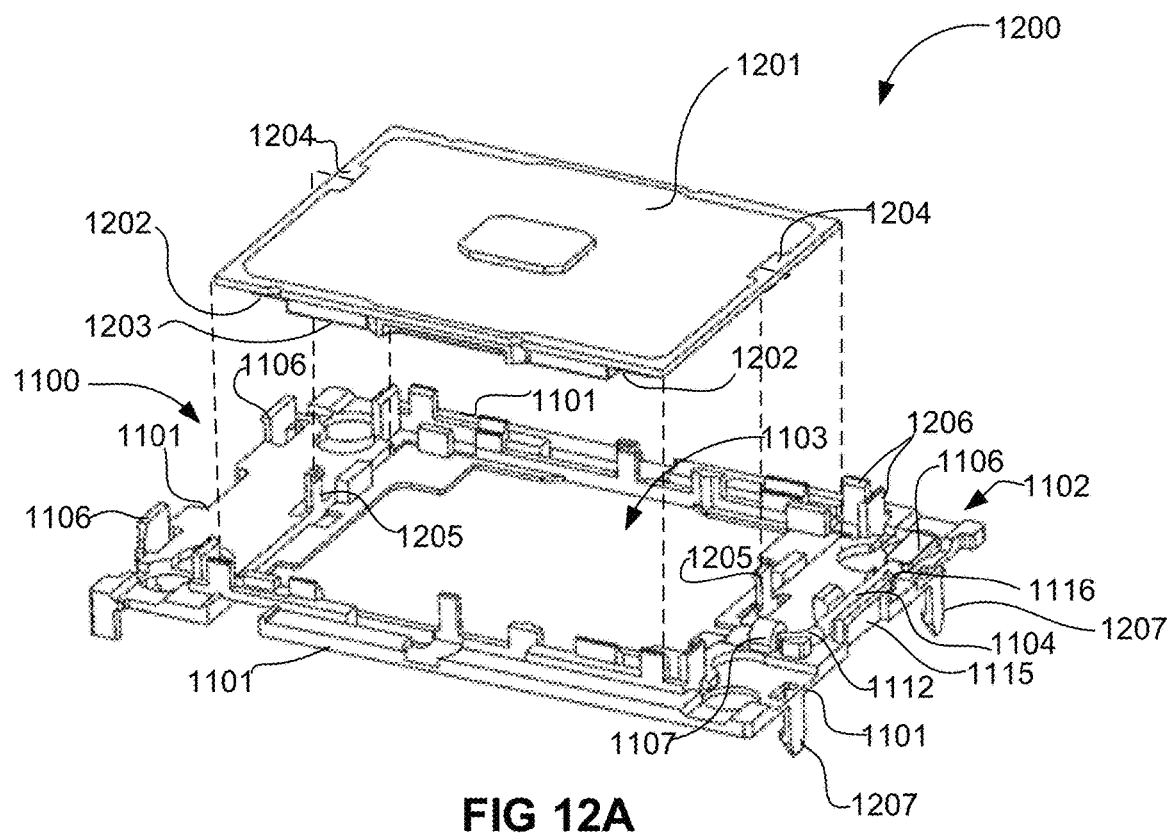
FIG. 12A illustrates an exploded isometric view of a carrier/microprocessor assembly, comprising a microprocessor carrier and a microprocessor, viewed from the land side, according to some embodiments of the disclosure.

FIG. 12A illustrates an exploded isometric view of carrier/microprocessor assembly 1200, comprising microprocessor carrier 1100 and microprocessor 1201 viewed from the land side, according to some embodiments of the disclosure.

In the exploded view of FIG. 12A, microprocessor 1201 is shown aligned above microprocessor receiving aperture 1103 of microprocessor carrier 1100, depicted from the top side. In some embodiments, the land side of microprocessor 1201 comprises a land grid array (LGA) of contact pads (not shown) that is to interface with contact pins of a microprocessor socket (e.g. microprocessor socket 1702 in FIG. 17) when mounted. Mounting tabs 1207 extend below frame 1101 to engage with the mounting flange of a heatsink (e.g., heatsink 1202 in FIG. 12A) for mounting microprocessor carrier 1100.

Figure 12B:
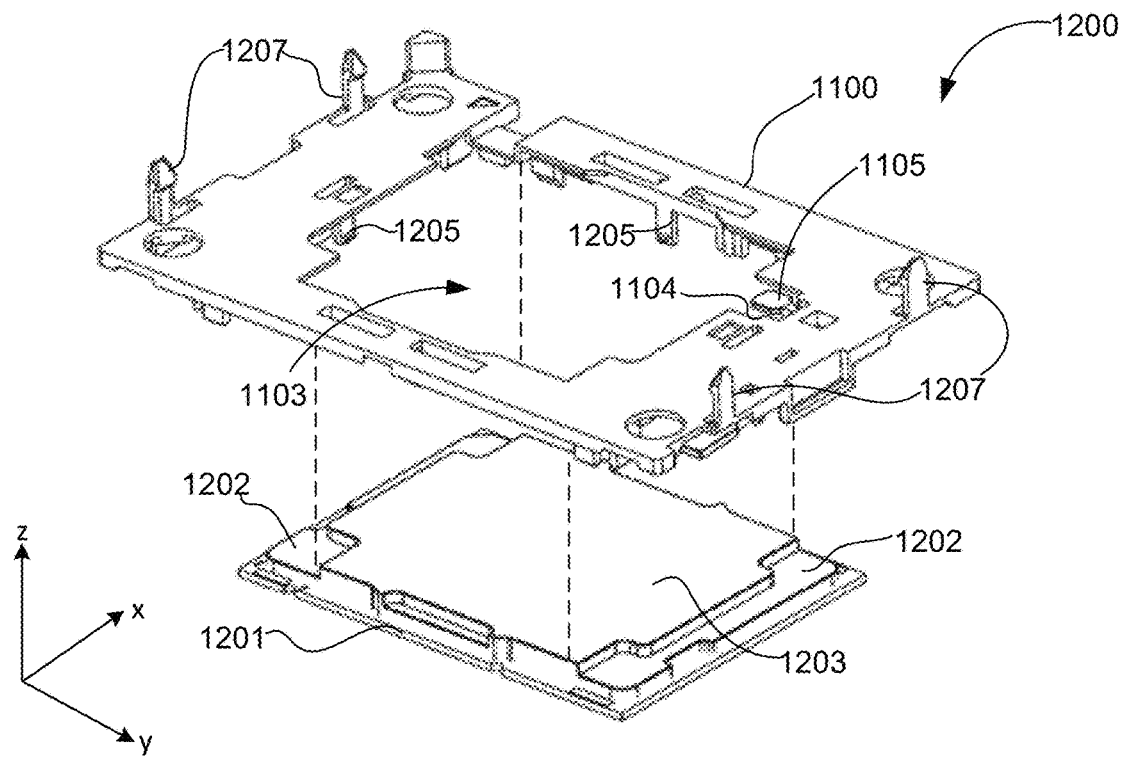
FIG. 12B illustrates an exploded isometric view of a carrier/microprocessor assembly comprising a microprocessor carrier and a microprocessor, viewed from the die side, according to some embodiments of the disclosure.

The packaging of microprocessor 1201 comprises edges 1202 that overhang integrated heat spreader (IHS) portion 1203. Overhanging edges 1202 are received on the portions of frame 1201 adjacent to microprocessor receiving aperture 1203. In some embodiments, microprocessor receiving aperture 1203 has an outline corresponding to the contours of IHS portion 1203 of microprocessor 1201. IHS portion 1203 is shown in FIG. 12B. In some embodiments, indents 1204 on overhanging edges 1202 engage snap tabs 1205 when microprocessor 1201 is seated. Alignment tabs 1106 engage with receiving structures on a microprocessor socket when microprocessor 1201 is mounted.

In some embodiments, microprocessor release lever 1102 extends along frame 1101 in a stowed position between grip 1106 and sleeve 1107. In some embodiments, shaft 1104 is substantially parallel with frame 1101 in the stowed position, tucked between tabs 1115 and secured to microprocessor carrier by clip 1116. Portion 1112 of shaft 1104 extends through sleeve 1107. Sleeve 1107 is a hinge point within which shaft 1104 rotates.

FIG. 12B illustrates an exploded isometric view of carrier/microprocessor assembly 1210 comprising microprocessor carrier 1200 and microprocessor 1201, viewed from the die side, according to some embodiments of the disclosure.

In the exploded view of FIG. 12B, carrier/microprocessor assembly 1200 is viewed from the bottom side, showing structural details of the die side of microprocessor package 1201 and microprocessor carrier 1200. The outline of microprocessor receiving aperture 1103 substantially follows contours of IHS portion 1203. Overhanging edges 1202 jut laterally from IHS 1203 and engage with snap tabs 1205, as described above, to secure microprocessor package 1201 on microprocessor carrier 1200. In some embodiments, IHS portion 1203 has a greater z-height than overhanging edges 1202, extending above overhanging edges 1202 to snugly fit within microprocessor receiving aperture 1103 and align contact of overhanging edges 1203 with frame 1201.

In some embodiments, blade 1105 is positioned under overhanging edge 1202 through notch 1114. When microprocessor release lever 1102 (FIG. 12A) is pivoted, blade 1105 rotates between overhanging edge 1202 and the heatsink (e.g., heatsink 1202 in FIG. 12B) to which carrier/microprocessor assembly 1200 is attached. In some embodiments, the rotation of blade 1105 pries microprocessor 1201 from the heatsink, as described below.

Figure 13A:
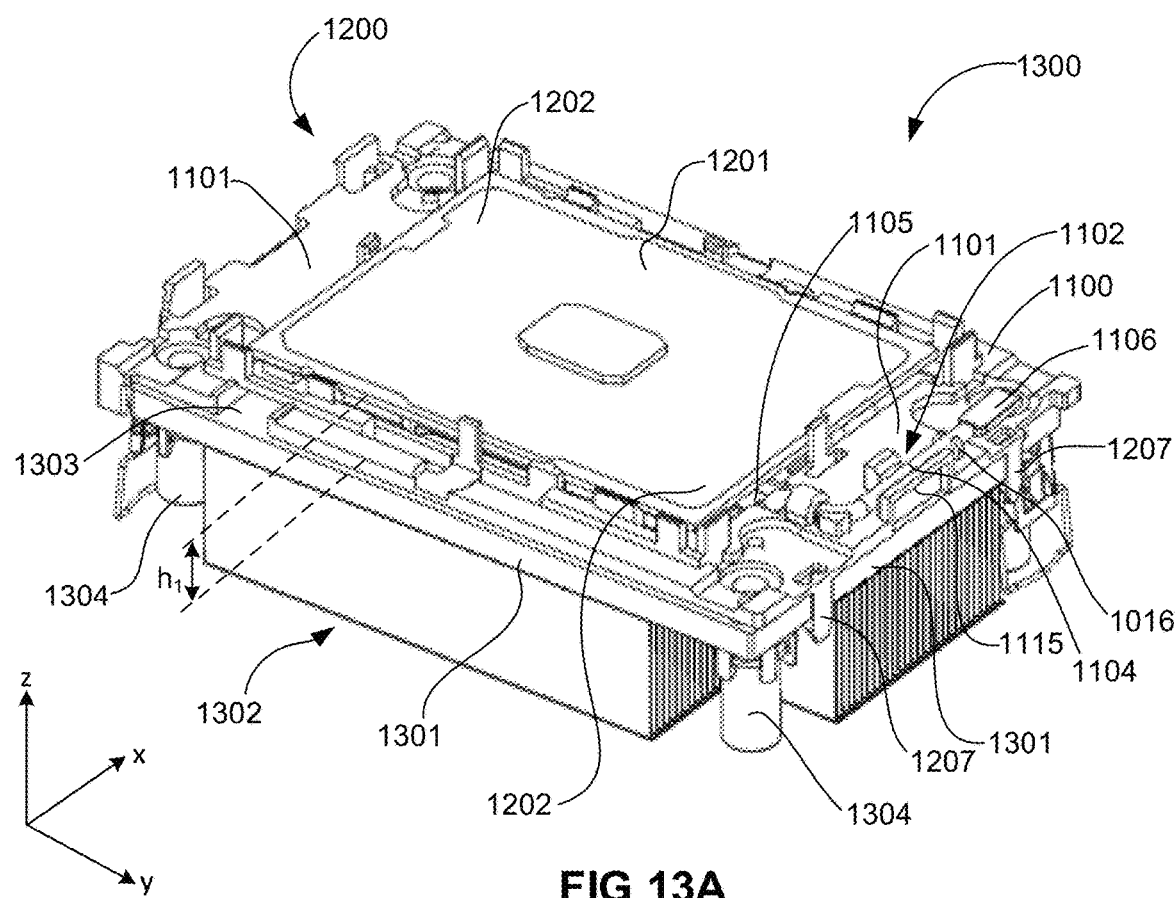
FIGS. 13A-13B illustrate operations of a method of using a microprocessor carrier, according to some embodiments of the disclosure.

Mounting tabs 1207 engage with a flange on the base of the heatsink to attach microprocessor assembly 1200 to the heatsink (see FIG. 13A). When mounted on the heatsink, carrier/microprocessor assembly 1200 is to be carried by the heatsink (e.g., heatsink 1202 in FIG. 12A) to mount over a loading mechanism (e.g., loading mechanism 1600 in FIG. 17) mounted on a PCB substrate.

Figure 12C:
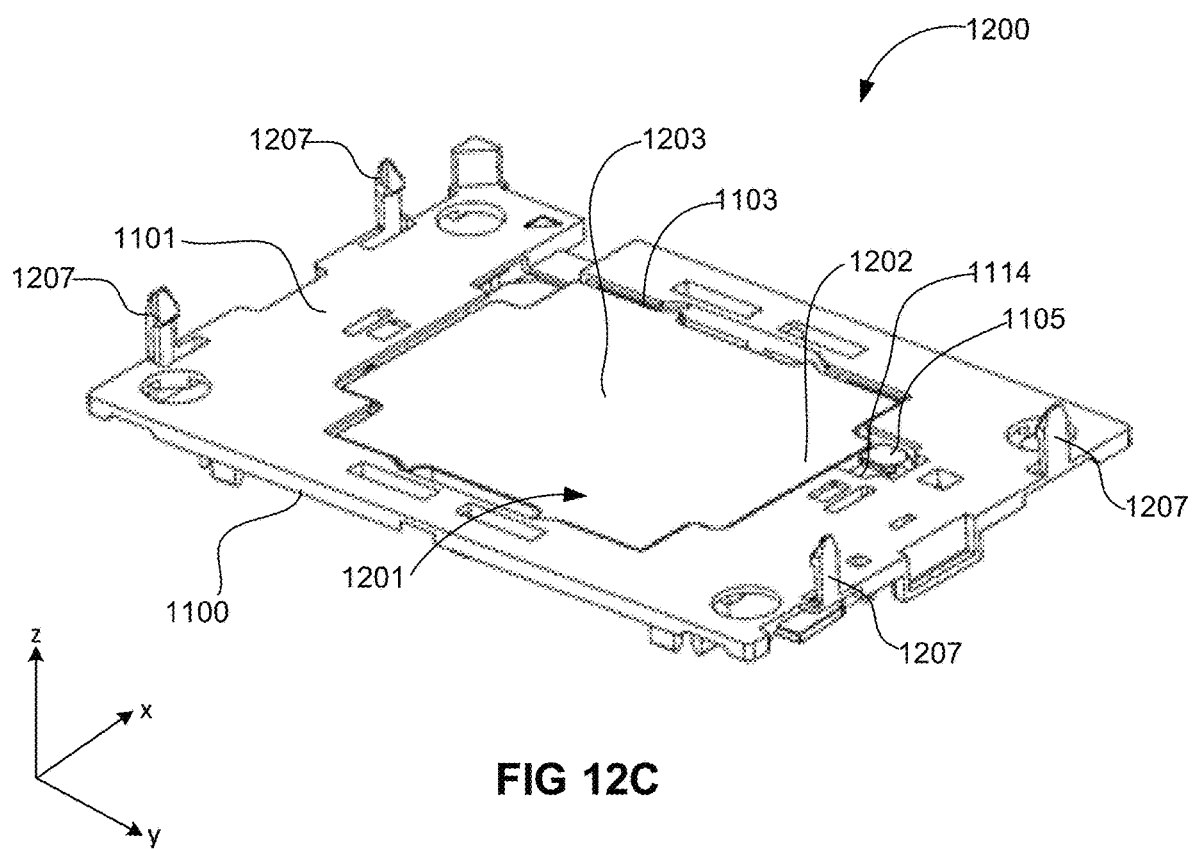
FIG. 12C illustrates an isometric view of a carrier/microprocessor assembly comprising a microprocessor carrier and a microprocessor, viewed from the die side, according to some embodiments of the disclosure.

FIG. 12C illustrates an isometric view of carrier/microprocessor assembly 1200, comprising microprocessor carrier 1200 and microprocessor 1201, viewed from the die side, according to some embodiments of the disclosure.

In FIG. 12C, carrier/microprocessor assembly 1200 is shown in the assembled state and viewed from the bottom side, according to some embodiments. IHS portion 1203 on the land side of microprocessor package 1201 is seated within microprocessor receiving aperture 1103 and extends therethrough. In some embodiments, IHS portion 1203 is substantially planar with frame 1101 of microprocessor carrier 1100.

In some embodiments, blade 1105 is positioned over overhanging edge 1202 within notch 1114. A difference between the z-heights of the die side of overhanging edge 1202 and the die side surface of frame 1101 presents a vertical gap (in the z-direction) in which blade 1105 rotates. In some embodiments, blade 1105 has a width (in the x-direction of the figure) that is larger than the z-height difference between frame 1101 and overhanging edge 1202. When rotated, opposing edges of blade 1105 abut the surfaces of both overhanging edge 1202 and the bottom surface of the flange of the heatsink, as described in greater detail below.

Figure 13B:
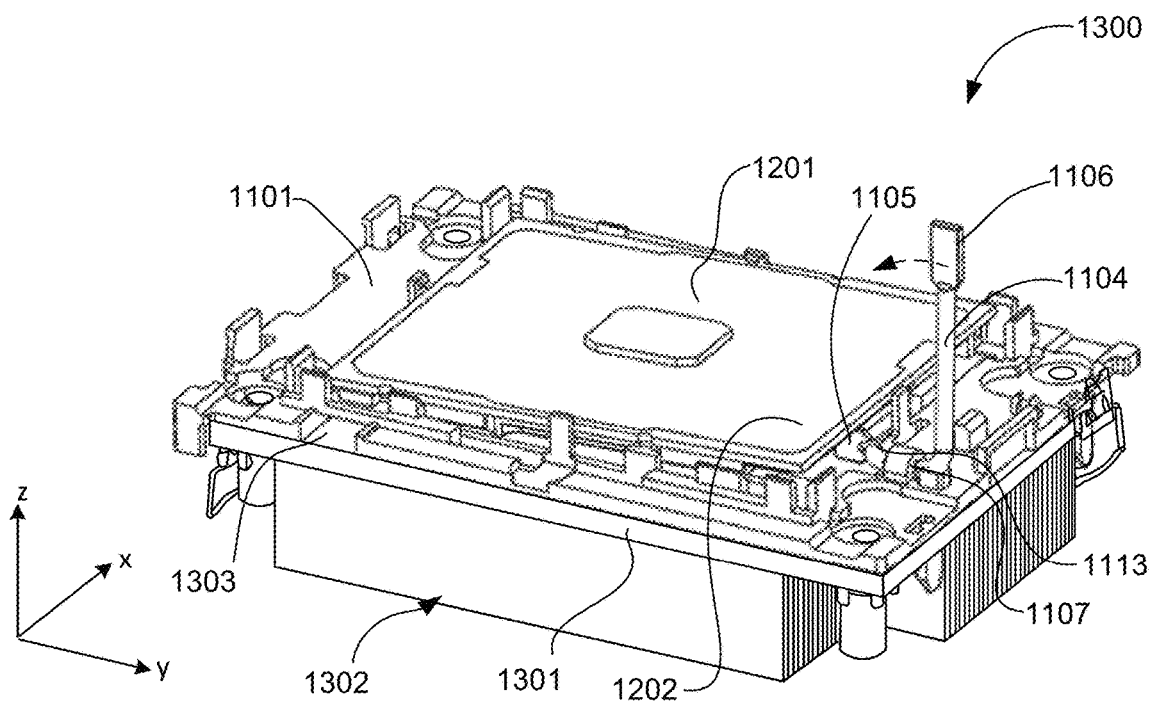

FIGS. 13A-13B illustrate operations of a method of using microprocessor carrier 1300, according to some embodiments of the disclosure.

In the operation of FIG. 13A, microprocessor/heatsink assembly 1300 is unmounted from a computer motherboard in a previous operation (not shown). Microprocessor/heatsink assembly 1300 comprises carrier/microprocessor assembly 1300 mounted on flange 1301 of heatsink 1302. The view is from the land side. In some embodiments, mounting tabs 1207 are engaged over the edge of mounting flange 1301 to secure carrier/microprocessor assembly 1200 to heatsink 1302. Frame 1101 is interfaced with flange 1301. In some embodiments, a heat transfer surface such as a cold plate (not shown) is substantially planar with the bottom surface 1303 of flange 1301. In some embodiments, the heat transfer surface extends a small distance above flange 1301. A cold plate or other form of heat transfer surface is generally interfaced with the IHS of a microprocessor (e.g., IHS portion 1203 of microprocessor package 1201 in FIG. 12C).

In some embodiments, a thin layer of thermal interface material (TIM) is interposed between bottom surface 1303 and IHS portion 1203 (see description below related to FIG. 14B). As described earlier, the TIM is generally a thermally conductive paste that is applied before mounting of carrier/microprocessor assembly 1300 to heatsink 1302. The TIM may cause some adhesion between heatsink 1302 and microprocessor 1301 due to surface tension, making separation of microprocessor package 1201 difficult. A tool is generally required to separate the microprocessor from the heatsink.

In the operation of FIG. 13A, heatsink/microprocessor assembly 1300 has been unmounted in an earlier operation by untightening retention nuts 1304 from mounting studs (e.g., mounting studs 1603 on bolster plate 1601 in FIG. 16A), then inverted to access carrier/microprocessor assembly 1200. Microprocessor release lever 1102 is in the stowed position, and according to some embodiments, and is substantially parallel to frame 1101. Shaft 1104 is retained between tabs 1115. In some embodiments, tabs 1115 are spaced apart by a distance that is substantially the diameter of shaft 1104. Tabs 1115 may provide a friction fit about shaft 1104 to restrict inadvertent pivoting or lateral movement of microprocessor release lever 1102 when not in use. In some embodiments, microprocessor release lever 1102 is secured to frame 1101 by clip 1116. Grip 1106 provides a finger placement for actuation of microprocessor release lever 1102.

In some embodiments, microprocessor package 1201 is elevated a height $h_1$ relative to frame 1101 so that microprocessor release lever 1102 does not encumber seating of microprocessor package 1201 in a microprocessor socket during mounting.

In the operation of FIG. 13B, microprocessor release lever 1302 is pivoted in sleeve 1107 in a counterclockwise direction in the x-z plane of the figure, as indicated by the curved dashed arrow extending from grip 1106. The actuation turns curved portion 1113 of shaft 1104, translating blade 1105 in the x-direction. Blade 1105 simultaneously rotates to abut opposing edges against overhanging edge 1202 of microprocessor 1201 and flange 1301. In some embodiments, blade 1105 has a width extending in the x-direction that is greater than the distance between flange 1301 and overhanging edge 1202. In some embodiments, sufficient driving force is provided by rotation of blade 1105 to overcome surface tension forces due to the TIM layer, separating microprocessor package 1201 from bottom surface 1303 of flange 1301. Driving force is provided by the torque from microprocessor release lever 1102. A mechanical advantage is realized by the ratio of the lengths of shaft 1104 and the component of curved portion 1113 that is orthogonal to shaft 1104.

Figure 14A:
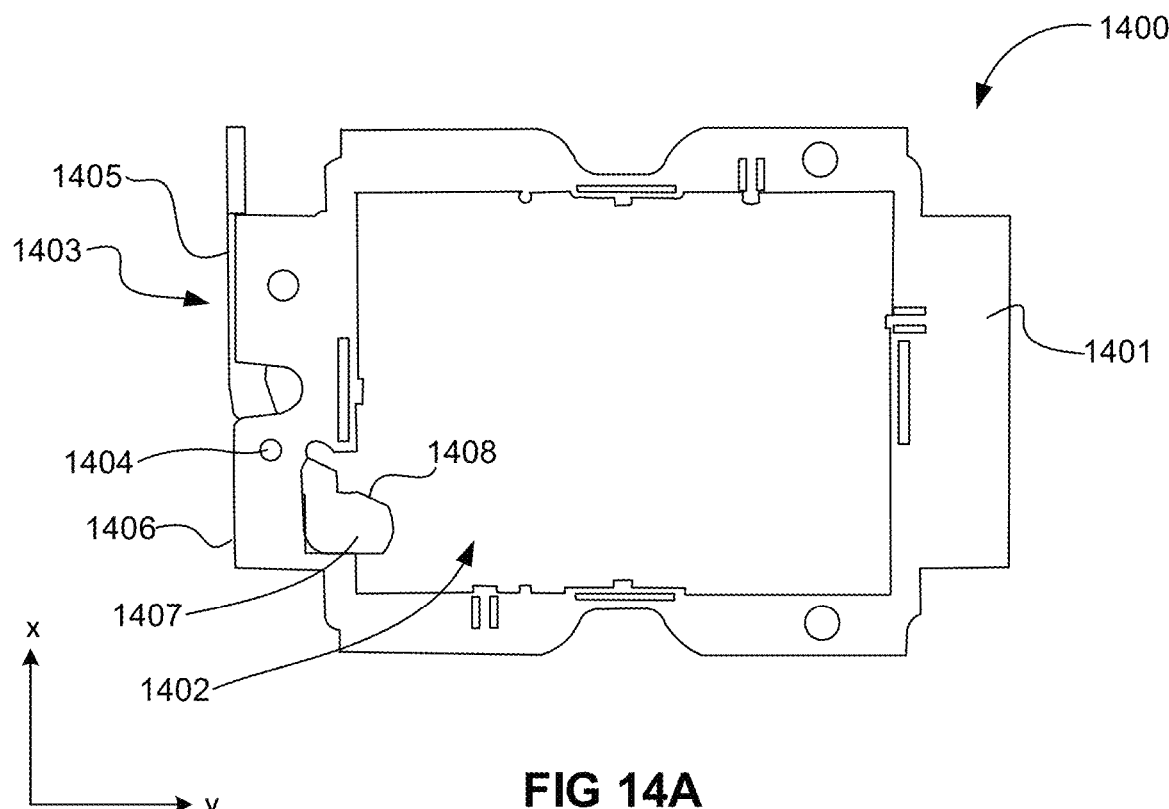
FIG. 14A illustrates a plan view of a microprocessor carrier comprising a laterally articulating microprocessor release lever, according to some embodiments of the disclosure.

FIG. 14A illustrates a plan view of microprocessor carrier 1400 comprising laterally articulating microprocessor release lever 1403, according to some embodiments of the disclosure.

In FIG. 14A, microprocessor carrier 1400 is viewed from the bottom side. Microprocessor carrier 1400 comprises frame 1401 surrounding microprocessor receiving aperture 1402. In some embodiments, the specific outline of microprocessor receiving aperture 1402 varies according to the contours of the IHS of a microprocessor type or family for which microprocessor carrier 1400 is intended.

Laterally-articulating microprocessor release lever 1403 is coupled to hinge point 1404 that is affixed to frame 1401. In some embodiments, hinge point 1404 is an axle that extends orthogonally to frame 1401, and about which microprocessor release lever 1402 rotates. In some embodiments, hinge point 1404 is a post or axle that is integral with microprocessor release lever 1403. In some embodiments, microprocessor release lever 1403 is a molded piece that comprises hinge point 1404 as a fixed post or axle that fits in a receiving structure on frame 1401 and articulates within the receiving structure. In some embodiments, hinge point is a fixed axle that is integral with frame 1401, and about which microprocessor release lever 1403 articulates. In the illustrated embodiment, microprocessor release lever 1403 is in a stowed position, where lever shaft 1405 extends substantially along edge 1406 of frame 1401.

In some embodiments, microprocessor release lever 1403 comprises wedge 1407 on an end of lever shaft 1405 such that wedge 1407 extends into microprocessor receiving aperture 1402. In some embodiments, wedge 1407 is wide in the x and y directions relative to its z-dimension (see FIGS. 14B and 14C). In some embodiments, wedge 1407 has a tapered working edge 1408. The action of wedge 1407 is described below (e.g., see description for FIG. 14B).

Figure 14B:
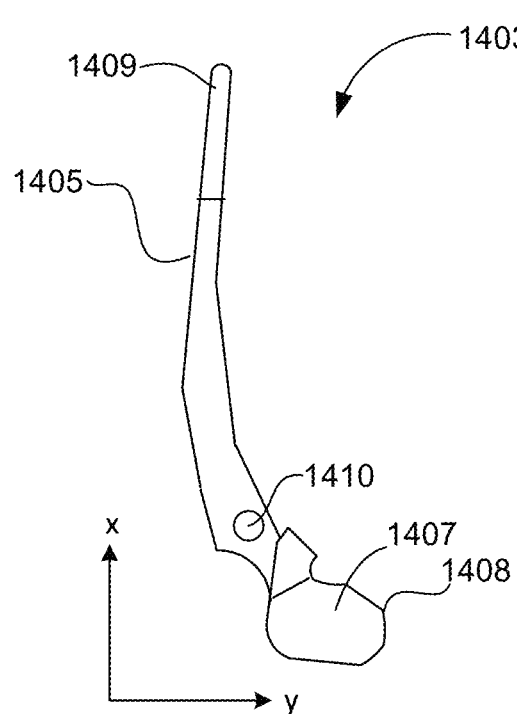
FIG. 14B illustrates a plan view of a laterally articulating microprocessor release lever separate from the microprocessor carrier, according to some embodiments of the disclosure.

FIG. 14B illustrates a plan view of microprocessor release lever 1403 separate from microprocessor carrier 1400, according to some embodiments of the disclosure.

In FIG. 14B, microprocessor release lever 1403 is shown separately from microprocessor carrier 1400 in a plan view to illustrate structural details. In the illustrated embodiment, shank 1405 comprises tapered non-colinear portions that gradually increase in width from handle end 1409 to pivot point 1410. The taper increases toward wedge 1407 to restrict bending of shank 1405 due to applied torque when actuated.

Figure 15A:
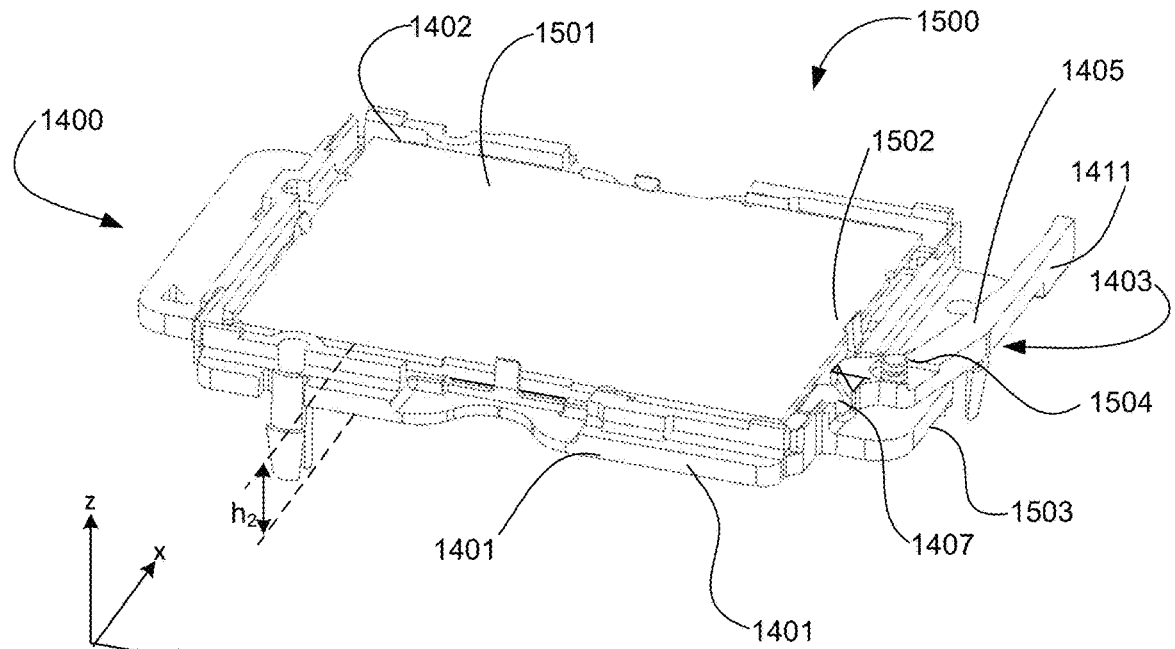
FIGS. 15A-15B illustrate operations of a method of using a microprocessor carrier to release a microprocessor from a heatsink, according to some embodiments of the disclosure.
Figure 15B:
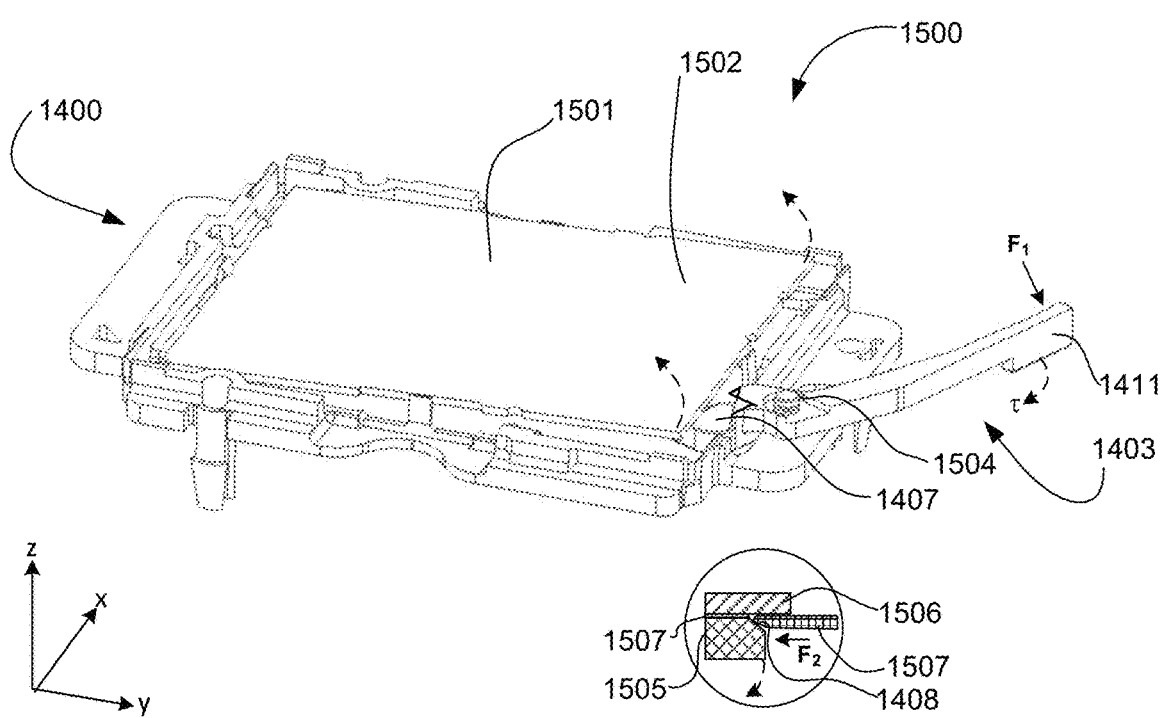

Wedge 1407 extends laterally (in the y-direction) from the end of shank 1405 to engage a working edge (e.g., edge 1408) of wedge 1407 with a microprocessor/heatsink interface when microprocessor release lever is pivoted (e.g., see FIG. 15B). In some embodiments, wedge 1407 has a width in the x-direction sufficient to suppress deflection when engaged with a microprocessor/heatsink interface. Pivot point 1410 divides shank 1405 into two legs. A first leg extends a first distance between pivot 1410 and working edge 1408 and a second leg extends a second distance between pivot 1410 and handle end 1407. The ratio of the first distance to the second distance is proportional to the mechanical advantage of microprocessor release lever 1403.

Figure 14C:
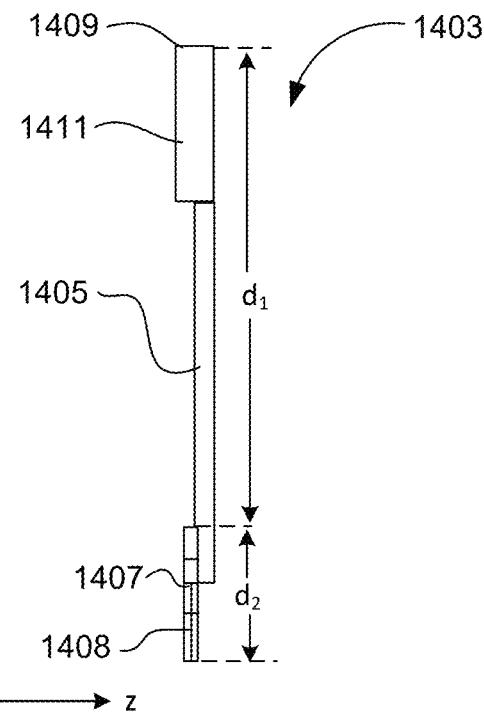
FIG. 14C illustrates a profile view of a microprocessor release lever separate from the microprocessor carrier, according to some embodiments of the disclosure.

FIG. 14C illustrates a profile view of microprocessor release lever 1403 separate from microprocessor carrier 1400, according to some embodiments of the disclosure.

In FIG. 14C, microprocessor release lever 1403 is shown in a profile view. Handle 1411 extends as a tab or flap in the z-direction from handle end 1409. In some embodiments, handle 1411 is a finger grip to enable manual activation of microprocessor release lever 1403. Distances $d_1$ and $d_2$ correspond to first and second lengths, respectively, of shank 1405. Distances $d_1$ and $d_2$ may be adjusted in some embodiments to optimize the mechanical advantage afforded by microprocessor release lever 1403 for minimizing the force necessary to apply to handle 1411 in order to effectuate unmounting of a microprocessor. In some embodiments, working edge 1408 is tapered to a knife edge to magnify the force applied by wedge 1407 at a microprocessor/heatsink interface.

FIG. 15A-15B illustrate operations of a method of using microprocessor carrier 1500 to release microprocessor 1501 from a heatsink, according to some embodiments of the disclosure.

In the operation shown in FIG. 15A, an oblique view of microprocessor mounting assembly 1500 is shown. In a previous operation, carrier/microprocessor assembly 1500 has been removed from a computer motherboard (not shown) and inverted to expose the land side of microprocessor package 1501. In some embodiments, microprocessor package 1501 extends through microprocessor receiving aperture 1402 in the z-direction. In some embodiments, the land side of microprocessor package 1501 is elevated above frame 1401 by a distance $h_2$ such that microprocessor release lever 1403 does not encumber seating of microprocessor package 1501 within a microprocessor socket when mounted.

In FIG. 15A, microprocessor release lever 1403 is shown in a stowed position. In some embodiments, shank 1405 is substantially confined over frame 1401. In some embodiments, at least a portion of shank 1405 is substantially parallel to edge 1403 of frame 1401. In some embodiments, handle 1411 is a tab or flap that extends in the z-direction from shank 1405 to perform as a finger grip. Handle 1411 facilitates manual actuation of microprocessor release lever 1403 by gripping handle 1411 with fingers and applying a lateral (e.g., in they direction) initial force to rotate microprocessor release lever 1403. In some embodiments, actuation of microprocessor release lever 1403 is applied by a mechanical device.

In some embodiments, microprocessor release lever 1403 pivots about post 1504. In some embodiments, post 1504 is integral with shank 1405, and is attached to frame 1401 in such a way that post 1504 is restricted from translation in the x, y and z directions, but is able to rotate. In some embodiments, post 1504 is a rivet that extends through frame 1401. In some embodiments, post 1504 is integral with frame 1401. In some embodiments, post 1504 is an axle about which microprocessor release lever 1403 pivots. Post 1504 may serve as an anchor for microprocessor release lever 1403 to frame 1401. In some embodiments, wedge 1407 is positioned under overhanging edge 1502 of microprocessor package 1501 when microprocessor release lever 1403 is in the stowed position.

In the operation shown in FIG. 15B, microprocessor release lever 1403 is pivoted clockwise in the x-y plane of the figure, as indicated by the curved dashed arrow. In some embodiments, the action forces wedge 1407 to abut microprocessor package 1501 at the level of the IHS/heatsink interface. The inset shows a cross-sectional view (y-z plane) of working edge 1408 of wedge 1407 abutting the interface between IHS 1505 and cold plate 1506 of a heatsink (see inset) on which microprocessor package 1501 is mounted. TIM 1507 is a layer between IHS 1505 and cold plate 1506. In some embodiments, IHS 1505 has a beveled edge to facilitate insertion of working edge 1408 between IHS 1505 and cold plate 1506. The force $F_2$ generated by the torque r applied to microprocessor release lever 1403 as a result of force $F_1$ applied on handle 1411. Microprocessor release lever 1403 is caused to pivot about post 1504.

$F_2$ is applied to wedge 1407 is indicated by the horizontal arrow in the inset. The dashed arrow in the inset indicates that microprocessor package 1501 is released from cold plate 1506 as a result of breaking of surface tension due to TIM layer 1507 by force $F_2$ applied to wedge 1507. TIM-related surface tension may cause IHS 1505 to adhere to cold plate 1506. The dashed arrows that appear over the corners of overhanging edge 1502 indicate the lifting and release of microprocessor 1501 as a result of the pivoting of microprocessor release lever 1403.

An example of the mechanical advantage afforded by microprocessor release lever is that with a mechanical advantage (ratio of $d_1$ and $d_2$, see FIG. 14C) of 5:1, a force $F_1$ of 8 $lb_f$ applied to handle 1411 generates a force $F_2$ of 40 $lb_f$ on wedge 1407.

Attention is now turned to description of microprocessor loading mechanism 1600. A microprocessor loading mechanism facilitates the mounting of a microprocessor on a computer motherboard or other printed circuit board (PCB). Microprocessor loading mechanisms may comprise a retention plate that is attached to a computer motherboard for a desktop machine or server, or any other microprocessor-hosting PCB. Typically, the retention plate surrounds a microprocessor socket designed for land grid array microprocessors. The retention plate may comprise mounting studs for mounting the heatsink.

In some embodiments, a microprocessor loading mechanism comprises load springs to which the mounting studs are attached. As the load force generated by the load springs is substantially a function of the displacement of the springs, the load springs soften the load on the microprocessor by reducing the load stiffness (spring constant) and stabilizing the load.

Figure 16A:
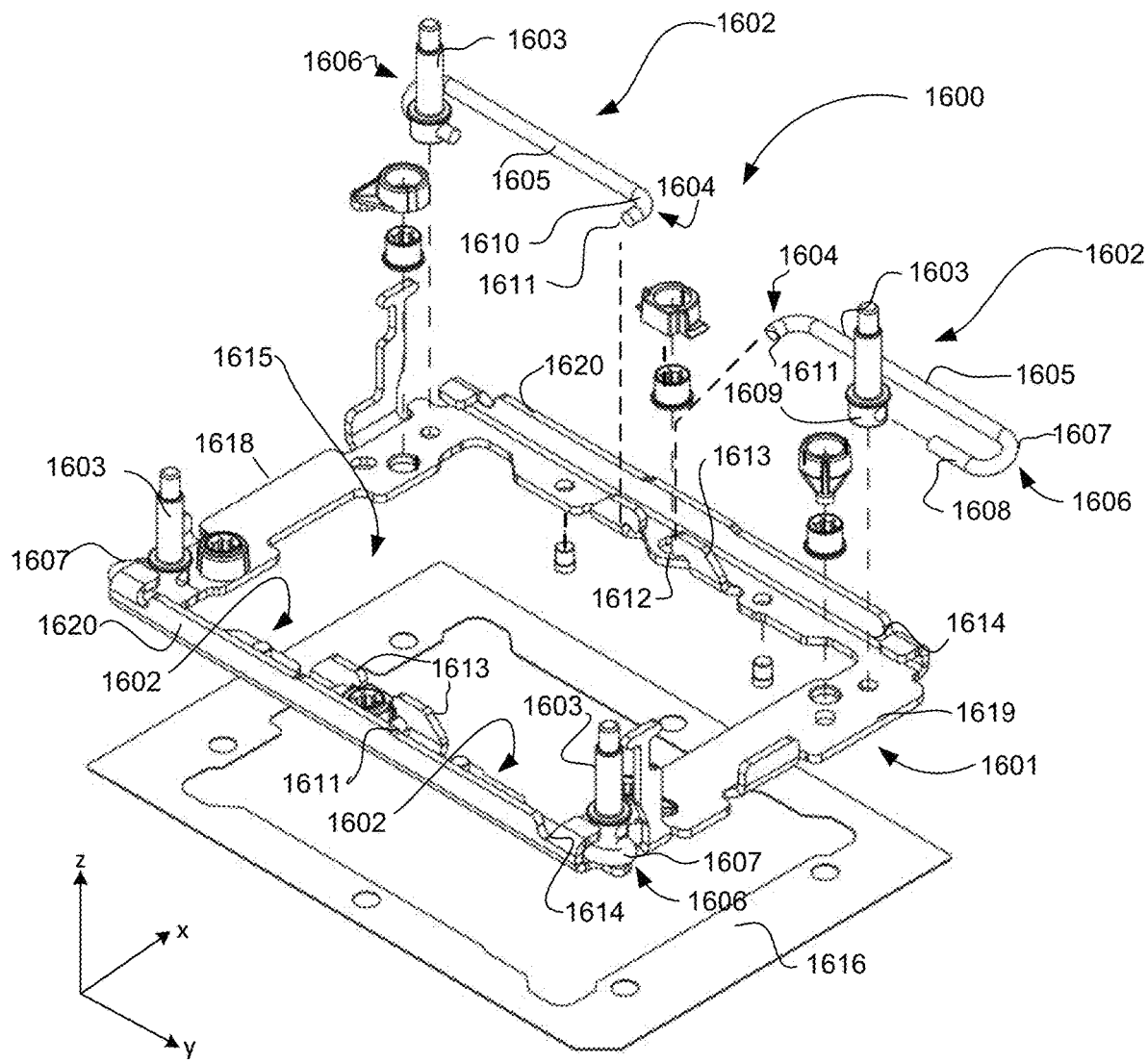
FIG. 16A illustrates an exploded isometric view of a loading mechanism, according to some embodiments of the disclosure.

FIG. 16A illustrates an exploded isometric view of loading mechanism 1600, according to some embodiments of the disclosure.

In FIG. 16A, loading mechanism 1600 comprises bolster plate 1601, torsion springs 1602 coupled to bolster plate 1601, mounting studs 1603 coupled to torsion springs 1602. In some embodiments, torsion springs 1602 comprise a single wire. In some embodiments, torsion springs 1602 comprise a torsion bar. In some embodiments, torsion springs 1602 comprise first end 1604, elongate shaft 1605 extending from first end 1604 and terminating at second end 1606. In some embodiments, second end 1606 is bent at an angle to elongate shaft 1605. In some embodiments, second end 1606 has a U-shape or hook-shape, comprising curved section 1607 extending from shaft 1605, and stub 1608 extending from curved section 1607 and adjacent to shaft 1605. In some embodiments, the U-shape of second end 1606 gives torsion springs 1602 a J-shape overall. Stub 1608 inserts into opening 1609 at the base of mounting stud 1603, coupling mounting stud 1603 to torsion spring 1602.

In some embodiments, torsion springs 1602 comprise steel wire or steel bar. In some embodiments, torsion springs 1602 comprise music wire (yield strength 2000 MPa or greater). In some embodiments, torsion springs 1602 comprise 301 stainless steel (yield strength 1600 MPa or greater). By contrast, sheet or leaf spring made from stainless steel sheet metal have yield strengths that range from 250 to 760 Mpa).

In some embodiments, first end 1604 is bent at substantially a right angle with respect to shaft 1605. First end 1604 comprises elbow 1610 extending from shaft 1605 and bent substantially at a right angle therefrom, according to some embodiments. Stub 1611 extends from elbow 1610 at substantially a right angle from shaft 1605. In some embodiments, stub 1611 is hooked by notch 1612 in vertical tab 1613, anchoring torsion spring 1602 to bolster plate 1601 approximately midway between edges 1618 and 1619. In some embodiments, torsion springs 1602 extend along vertical flanges 1620 of bolster plate 1601. In some embodiments, torsion spring 1602 is retained under tab 1614, which is bent over shaft 1605 near second end 1606 to restrict lateral (x- and y-directions) and vertical (z-direction) motion of shaft 1605.

In some embodiments, U-shaped second end 1606 of torsion spring 1602 is rotated at an angle relative to the plane formed by first end 1604 and shaft 1605. The twisted configuration of torsion spring 1602 introduces a load bias into torsion spring 1602. An applied torsion is created in shaft 1605 by pulling vertically (upwards in the z-direction) on mounting stud 1603 that is coupled to second end 1606, rotating second end 1606 towards the plane of torsion spring 1602. Reactive torque developed in shaft 1605 resists the applied torsion, creating a vertical downward force on mounting studs 1603, which grows as the angle between first end 1604 and second end 1606 shrinks.

Figure 17:
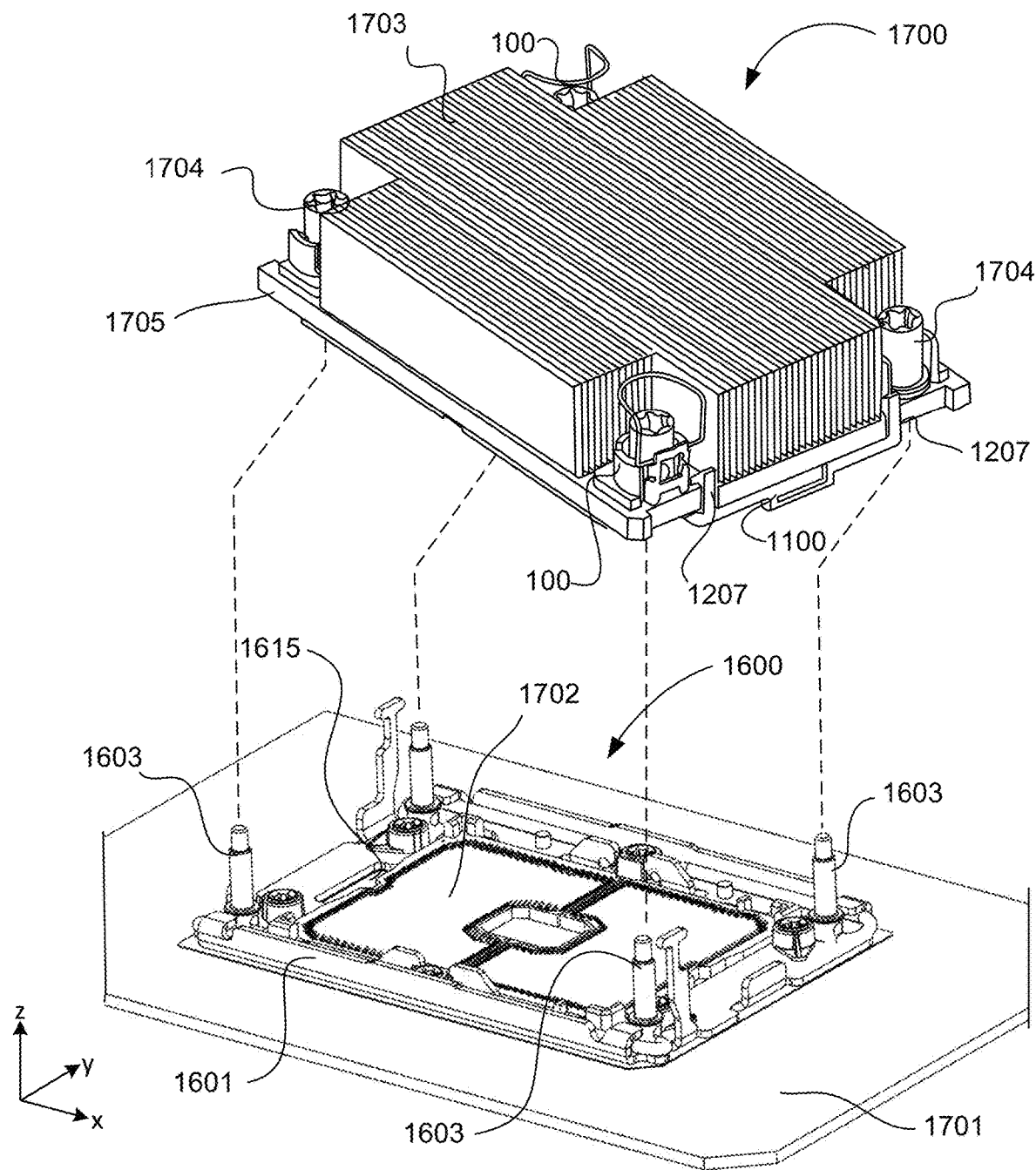
FIG. 17 illustrates an oblique view of a loading mechanism mounted on a PCB, and a microprocessor/heatsink module, according to some embodiments of the disclosure.

Bolster plate 1601 comprises aperture 1615 to receive a microprocessor socket when loading mechanism 1600 is installed on a PCB (e.g., PCB 1701 in FIG. 17). In some embodiments, the microprocessor socket (e.g., socket 1702 in FIG. 17) is coupled to the PCB independent of bolster plate 1601. In some embodiments, back plate 1616 is mounted on the PCB under bolster plate 1601. In some embodiments, back plate 1616 provides a stiff structure to receive mounting screws fastening bolster plate 1601 to a PCB.

Figure 16B:
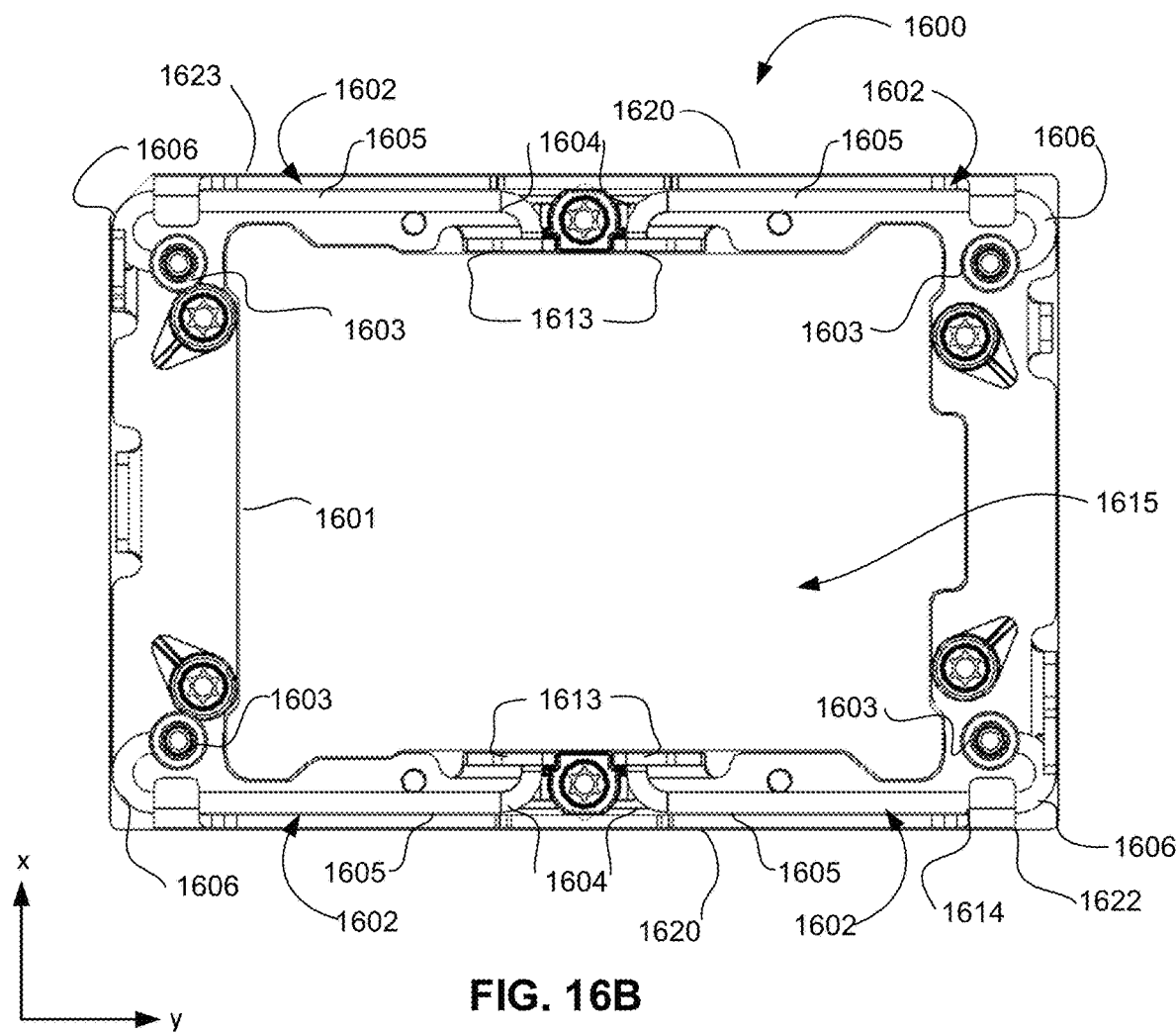
FIG. 16B illustrates a plan view in the x-y plane of a loading mechanism, according to some embodiments of the disclosure.

FIG. 16B illustrates a plan view in the x-y plane of loading mechanism 1600, according to some embodiments of the disclosure.

The plan view of FIG. 16B shows U-shaped second ends 1606 of torsion springs 1602 coupled to the four mounting studs 1603 positioned over the four corners of bolster plate 1601. In some embodiments, first ends 1604 of torsion springs 1602 extend outwardly from vertical tabs 1613, extending at substantially right angles from shafts 1605. In some embodiments, shafts 1605 are substantially parallel to edges 1622 and 1623 of bolster plate 1601 adjacent to vertical flanges 1620. In some embodiments, torsion springs 1602 extend from first ends 1604 to second ends 1606, crossing under flaps 1614. In some embodiments, second ends 1606 curve 180° as shafts 1605 emerge from flaps 1614, forming U-shaped extensions from shafts 1605. Terminal stubs 1608 couple to mounting studs 1603.

In some embodiments, bolster plate 1601 comprises microprocessor socket receiving aperture 1615. In some embodiments, the area covered by receiving aperture 1615 is a substantial portion of the total area covered by bolster plate 1601. When torsion springs 1602 are under load, narrow portions of bolster plate 1601 (e.g., between edges 1622 and 1623 and edges of microprocessor receiving aperture 1615) may be subjected to tensile stress, causing bolster plate 1601 to buckle. In some embodiments, vertical flanges 1620 reinforce bolster plate 1601, preventing it from buckling under tension from torsion springs 1602 under load.

Figure 16C:
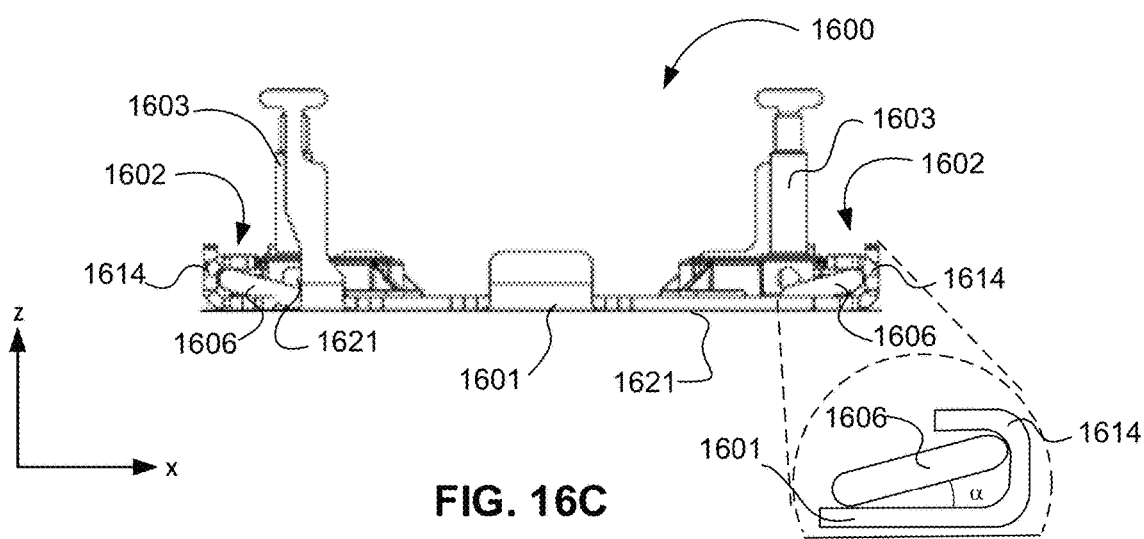
FIG. 16C illustrates a profile view in the x-z plane of a loading mechanism, according to some embodiments of the disclosure.

FIG. 16C illustrates a profile view in the x-z plane of loading mechanism 1600, according to some embodiments of the disclosure.

The profile view of loading mechanism 1600 shows second ends 1606 of torsion springs 1602 rotated relative to the plane of bolster plate 1601. In FIG. 16C, the plane of bolster plate 1601 is oriented to be parallel to the x-y plane of the figure. The inset shows a magnified view of a second end 1606 rotated an angle α relative to bolster plate 1601. In some embodiments, angle α is a torsional angle that is proportional to a load bias in torsion springs 1602. In some embodiments, the load bias is created during manufacture of torsion springs 1602, where second end 1606 is twisted relative to first end (e.g., first end 1604 in FIGS. 16A and 16B).

In some embodiments, second ends 1606 loop back below the plane of the figure to insert into openings 1621 in the bases of mounting studs 1603, which are below the plane of the figure behind edge 1621 (also shown in FIG. 16A), coupling torsion springs 1602 to mounting studs 1603. In some embodiments, stubs 1608 are press-fit into openings 1621 at the base of mounting studs 1603. In some embodiments, stubs 1608 are secured to bases of mounting studs 1603 by set screws. In some embodiments, stubs 1608 are welded to mounting studs 1603. In some embodiments, mounting studs 1603 are suspended over bolster plate 1601 by torsion springs 1602.

FIG. 17 illustrates an oblique view of loading mechanism 1600 mounted on a PCB, and microprocessor/heatsink module 1700, according to some embodiments of the disclosure.

In FIG. 17, loading mechanism 1600 is mounted on PCB substrate 1701. In some embodiments, PCB substrate 1701 is a computer motherboard. Loading mechanism 1600 comprises bolster plate 1601 that may be fastened to PCB substrate 1701. In some embodiments, a backing plate (e.g., backing plate 1616 in FIG. 16A) is positioned below bolster plate 1601 to mitigate strain on PCB substrate 1701 when bolster plate 1601 is fastened to the substrate.

In some embodiments, bolster plate 1601 comprises microprocessor receiving aperture 1615. Microprocessor socket 1702 is seated within microprocessor receiving aperture 1615. In some embodiments, microprocessor socket 1701 is surface-mounted (SMT soldered) on PCB 1701.

Microprocessor/heatsink module 1700 comprises heatsink 1703 having retention nuts 1704 mounted on mounting flange 1705 over opposing bolt passage holes (e.g., bolt passage holes 309 in FIG. 4B) on opposite corners of mounting flange 1705. Retention nut 1704 may be any of retention nuts 100, 801 or 810 described earlier in the disclosure, but by no means is restricted to these choices. Retention nut 1704 may be any suitable type. In some embodiments, two or more anti-tilt fastener assemblies 100 are mounted over bolt passage holes on opposite corners of mounting flange 1705. Microprocessor/heatsink module 1700 is mounted on loading mechanism 1600 by passage of mounting studs 1603 through bolt passage holes and engaging with fasteners 100 and nuts 1704.

In some embodiments, a microprocessor/heatsink module 1700 comprises a microprocessor carrier (e.g., microprocessor carrier 1100 shown in FIG. 11) attached on the bottom side of heatsink 1703 by hooking onto mounting flange 1705 with mounting tabs 1207, as described earlier for FIG. 12B. A microprocessor package (e.g., microprocessor package 1201 in FIG. 12B) is secured in microprocessor carrier 1100. In some embodiments, the microprocessor package comprises an integrated heat spreader (IHS) on the die side surface. In some embodiments, the IHS is thermally interfaced with a heat transfer surface embedded in the baseplate of heatsink 1703 (e.g., bottom surface 1303 of mounting flange 1301 shown earlier in FIGS. 13A and 13B; cold plate 1506 in FIG. 15B). In some embodiments, mounting flange 1705 is on the periphery of the baseplate.

In some embodiments, generation of the load on the microprocessor package is created by torqueing retention nuts down on flange 1705, pulling mounting studs 1603 upward (in the z-direction) and creating elastic torsion in torsion springs 1602. This action is shown below (see FIGS. 18A & 18B and related description).

Figure 18A:
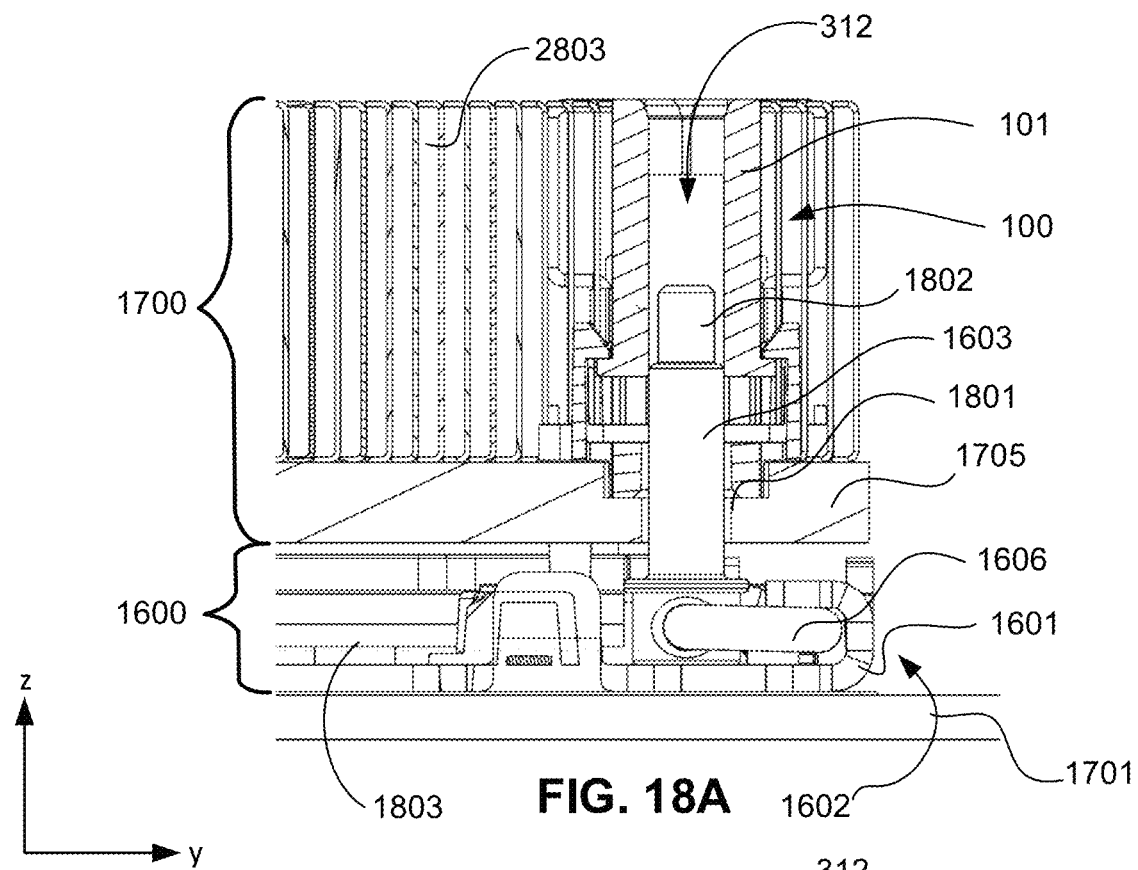
FIG. 18A illustrates a cross-sectional view of a microprocessor/heatsink module installed on a loading mechanism in a preload state, according to some embodiments of the disclosure.

FIG. 18A illustrates a cross-sectional view of microprocessor/heatsink module 1700 installed on loading mechanism 1600 in a pre-load state, according to some embodiments of the disclosure.

In FIG. 18A, microprocessor/heatsink module 1700 is installed on loading mechanism 1600 in a pre-loaded state. Loading mechanism 1600 is fastened to PCB substrate 1701. In some embodiments, microprocessor/heatsink module 1700 comprises anti-tilt fastener assembly 100 inserted over bolt passage hole 1801 (details of anti-tilt fastener assembly 100 are described earlier in the disclosure; e.g., see FIG. 1). The cross-sectional view shows details of anti-tilt fastener assembly 100 comprising retention nut 101, as well as the details of mounting flange 1705. The cross-sectional views show mounting stud 1603 engaged with anti-tilt fastener assembly 100. Shown in the cross-sectional view is the vertical position of mounting stud 1603 relative to bolster plate 1601. In FIG. 18A, a pre-loaded state is illustrated, where retention nut 101 has not yet been engaged with threads on mounting stud 1603.

Mounting stud 1603 is passed through bolt passage hole 1801 on flange 1705 when microprocessor/heatsink module 1700 is first installed on loading mechanism 1600. Mounting stud 1603 abuts retention nut 101 and enters threaded bore 312. In some embodiments, mounting stud 1603 comprises tip 1802. In some embodiments, tip 1802 is not threaded, and has a smaller diameter than the threaded portion of mounting stud 1603. Tip 1802 may aid mounting stud 1603 in locating the entrance to bore 312. Tip 1802 penetrates into bore 312 and in some embodiments remains near the entrance of bore 312. Threads in bore 312 are not engaged with mounting stud 1603 until tightening of retention nut 101 begins. In some embodiments, tip 1802 prevents inadvertent engagement of retention nut 101 with mounting stud 1603. This action enables alignment of microprocessor/heatsink module 1700 relative to microprocessor socket 1803 before load is applied by tightening retention nut 101.

In some embodiments, second end 1606 of the torsion spring 1602 (extending below the plane of the figure) is substantially parallel to bolster plate 1601. In this state, the torsion spring is not pre-loaded. In some embodiments, pre-loading by twisting the torsion spring 1602 creates a load bias for mounting stud 1603. Second end 1606 is rotated downward, and mounting stud 1603 is vertically displaced downward toward bolster plate 1601, reducing the overall z-height of loading mechanism.

Figure 18B:
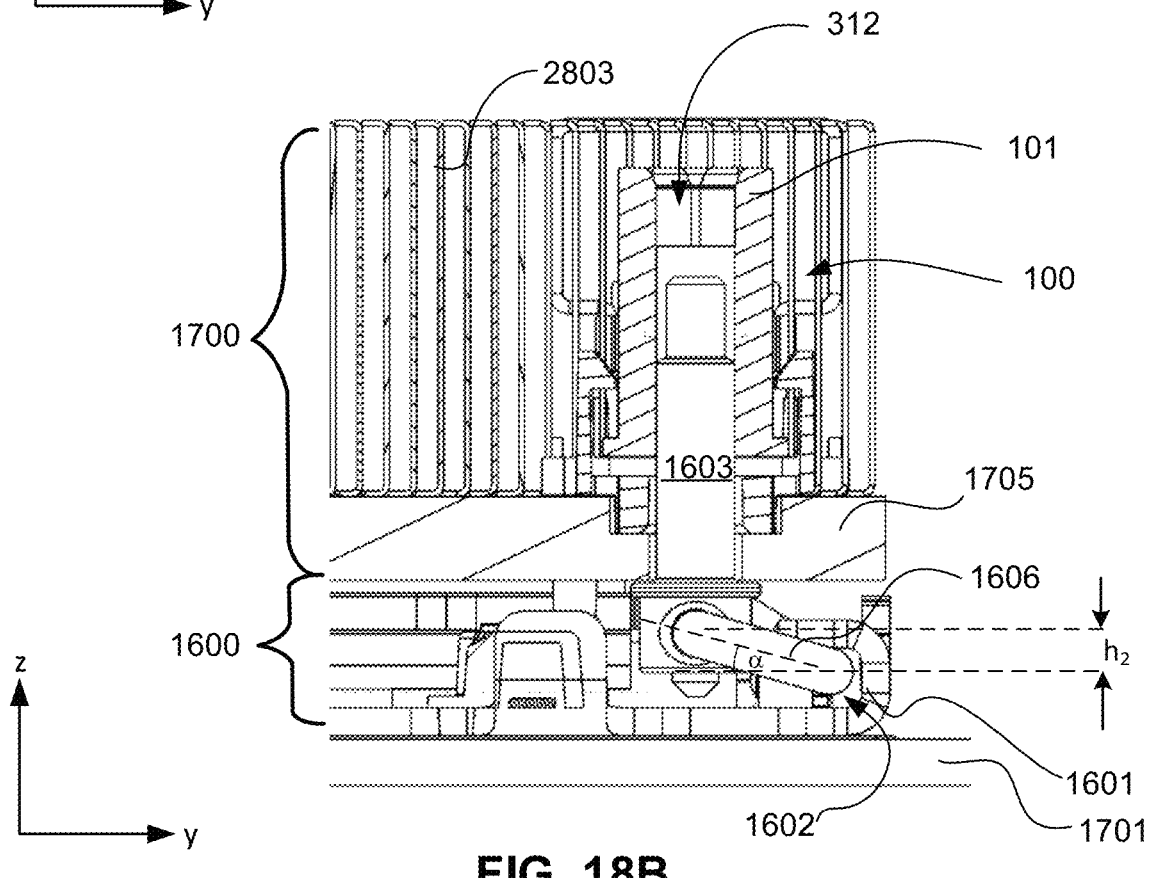
FIG. 18B illustrates a profile view of a microprocessor/heatsink module installed on a loading mechanism in a load state, according to some embodiments of the disclosure.

FIG. 18B illustrates a profile view of microprocessor/heatsink module 1700 installed on loading mechanism 1600 in a load state, according to some embodiments of the disclosure.

In FIG. 18B retention nut 101 is engaged with threads of mounting stud 1603 and tightened down on flange 1705. The torqueing of retention nut 101 on flange 1705 pulls mounting stud 1603 upwards vertically. By tightening retention nut 101, mounting flange 1705 is loaded by the torsion spring. Second end 1606 rotates upward (clockwise in the figure) by an angle α. Mounting stud is pulled upward (in the z-direction) a distance $h_2$, which is proportional to sin α. Angle α is equivalent to the torsion angle in the torsion spring (e.g., torsion spring 1602). Reactive torque in the torsion spring is proportional to torsion angle α. The reactive torque imposes a downward force (vertical load) on flange 1705 transmitted through mounting stud 1603. The torsion angle of a torsion spring is analogous to linear displacement in springs having bending elements, such as a coil spring, a leaf spring or a cantilever spring.

The torque required to twist the torsion spring by rotation of second end 1606 is proportional to the torque applied to retention nut 101 to tighten it over flange 1705. Upward rotation of second end 1606 generates a reactive torque that resists the rotation. The reactive torque pulls back on mounting stud 1603, increasing the load on microprocessor/heatsink module 1700. The greater is angle α due to the torque applied to retention nut 101 (tightening force), the larger the torsional force required to rotate second end 1606 and the greater the loading on flange 1705. The generated load is the vertical component of the torsional force. In some embodiments, loads between 150 lbf and 400 lbf are generated by torsion springs 1606 made from 2.5 mm diameter steel piano wire. Corresponding tightening torque on retention nut 1803 may range from 4 to 16 in-lb.

Figure 19:
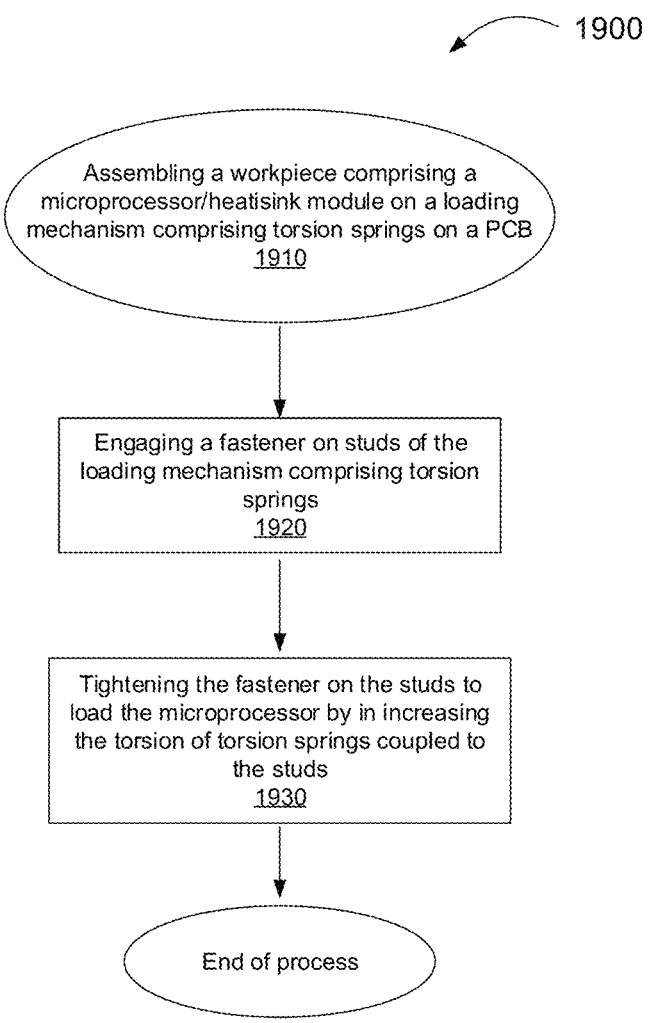
FIG. 19 illustrates a flow chart for a method of using a loading mechanism having torsion springs, according to some embodiments of the disclosure.

FIG. 19 illustrates flow chart 1900 for a method of using a loading mechanism having torsion springs, according to some embodiments of the disclosure.

At operation 1910, the method begins by assembling a workpiece that comprises a microprocessor/heatsink module installed on a loading mechanism comprising torsion springs (e.g., module 1700 and loading mechanism 1600 in FIG. 17). The loading mechanism (e.g., 1600) is coupled to a PCB. In some embodiments, the PCB is a computer motherboard.

The loading mechanism comprises a bolster plate (e.g., 1601 in FIG. 16A) that is the base of the loading mechanism. In some embodiments, the bolster plate is bolted to the PCB. In some embodiments, the bolster plate comprises an aperture that fits around a microprocess socket (e.g., socket 1702 in FIG. 17), which is coupled to the PCB. In some embodiments, the microprocessor socket is surface mounted on the PCB, and is not mechanically coupled to the bolster plate.

The bolster plate comprises mounting studs that extend substantially orthogonal (vertically) to the bolster plate. In some embodiments, the bolster plate comprises elongate torsion springs (e.g., 1602 in FIG. 16A) that are anchored to the bolster plate at a first end and coupled to the mounting studs at a second end. In some embodiments, the mounting studs are suspended over the bolster plate by the torsion springs. In some embodiments, the torsion springs are pre-loaded where the torsion springs have a built-in torsion (twist) as received with the bolster plate. The pre-loading introduces a load bias in the torsion springs.

The microprocessor/heatsink module (e.g., 1700) comprises a heatsink having a baseplate. In some embodiments, a mounting flange extends along the periphery of the baseplate. In some embodiments, the microprocessor carrier is attached to the bottom of the baseplate. In some embodiments, the baseplate comprises a heat transfer surface. In some embodiments, the heat transfer surface is a cold plate. A microprocessor package, having an integrated heat spreader (IHS) on the die side surface, is mounted such that the IHS is interfaced to the heatsink baseplate.

The microprocessor/heatsink module is lowered over the loading mechanism such that the mounting studs on the loading mechanism are passed through the bolt passage holes on the mounting flange of the heatsink (e.g., see FIG. 17). In some embodiments, anti-tilt fastener assemblies (e.g., anti-tilt fastener assembly 100 in FIG. 17) are attached to the mounting flange of the heatsink. In some embodiments, the anti-tilt fastener assemblies comprise a base and a retention nut captivated in the base. In some embodiments, the anti-tilt fastener base is inserted over the bolt passage holes.

At operation 1920, the mounting stud abuts the retaining nut of the anti-tilt fastener when the microprocessor/heatsink module is installed over the bolster plate of the loading mechanism. In some embodiments, the mounting stud comprises a tip that has entered within the threaded bore of the retention nut. The nut (e.g., retention nut 101) is engaged on the mounting stud by engaging the threads in preparation for tightening down over the mounting flange. A torque wrench may be employed to begin torqueing the nut down over the mounting flange of the heatsink. The torque wrench provides a measure of the torque applied to the nut to enable uniform loading.

At operation 1930, torque is applied to the nut as the nut is driven onto the mounting flange of the heatsink. This action couples the heatsink to the torsion springs. As torque is applied on the nut, the mounting stud is pulled upward, rotating the attached torsion spring upward (e.g., the process illustrated in FIGS. 18A and 18B). Raising the mounting stud by applying torque to the nut and tightening it over the mounting flange increases torsion in the torsion springs, as described earlier. The reaction of the torsion springs is transferred to the mounting flange as a vertical load (downward force), which increases with increasing torsion as torque on the nut increases.

The vertical load on the heatsink is in turn distributed over the microprocessor, compressing it against the microprocessor socket. In some embodiments, loads up to 400 lbf are generated by the torsion springs. The high load may be necessary to ensure that all lands on the microprocessor package are solidly contacted to corresponding pins of the microprocessor socket. As the number of contacts increases, greater loading may be necessary. By way of example, a load of approximately 350 lbf is necessary to sufficiently load a microprocessor package having approximately 4200 contacts.

Attention is now shifted to microprocessor carrier 2000 comprising hinge and latch assemblies enabling a single solution for automatic microprocessor alignment during installation, and automatic tilt control and microprocessor removal during unmounting. Microprocessor carrier 2000 mounts onto a loading mechanism and is similar to loading mechanism 1600 and is latched thereto. A method of use is also disclosed that describes installation of an assembly comprising a microprocess package and microprocessor carrier 2000. The disclosed method contrasts more conventional mounting of a carrier/microprocessor assembly on a heatsink.

Figure 20:
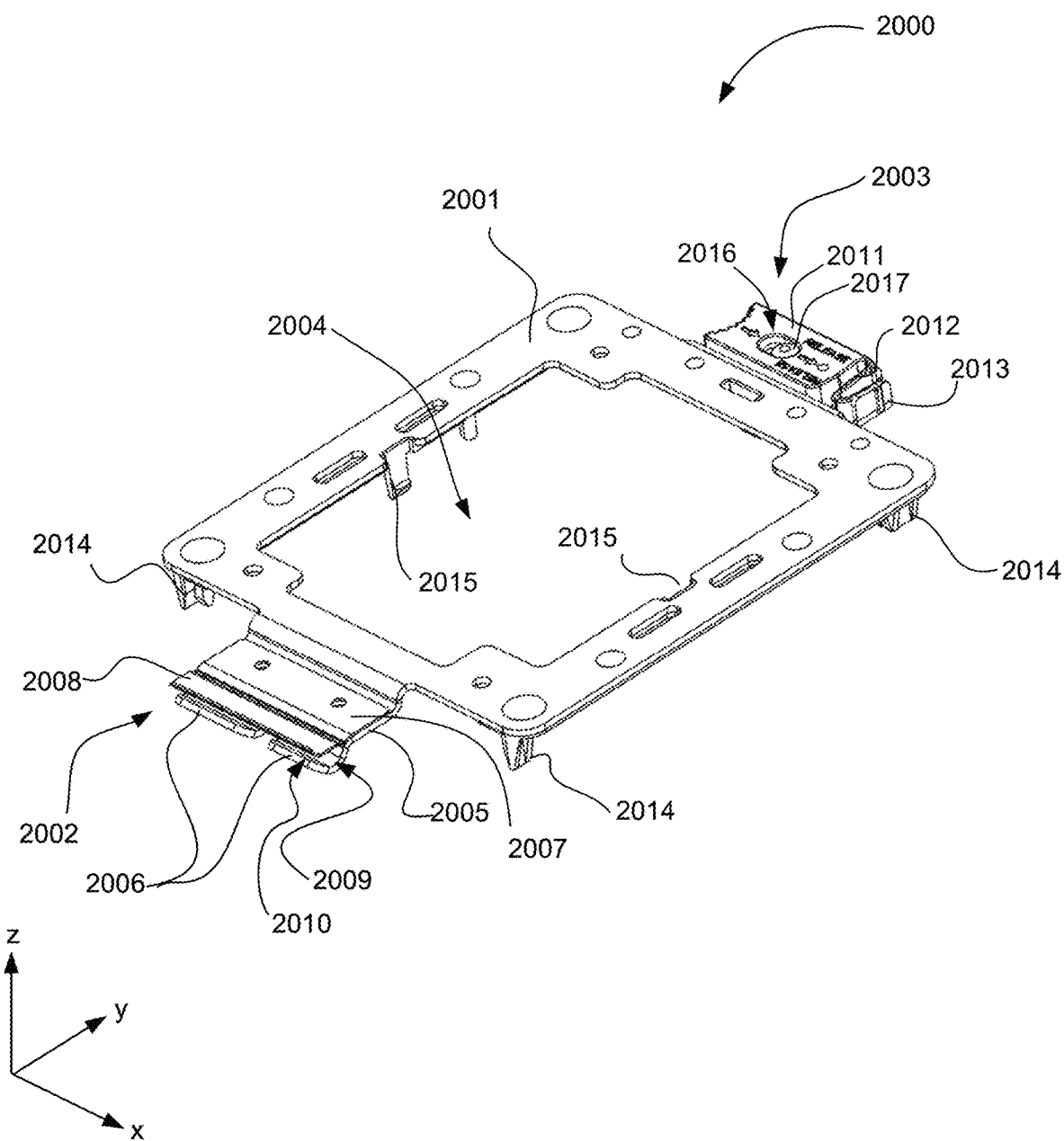
FIG. 20 illustrates an isometric view of a microprocessor carrier, according to some embodiments of the disclosure.

FIG. 20 illustrates an isometric view of microprocessor carrier 2000, according to some embodiments of the disclosure.

In FIG. 20, microprocessor carrier 2000 comprises multiple components that are assembled into the embodiments described in the disclosure. A representative embodiment 2000 is shown in the fully assembled state. The isometric view shows most of the components of microprocessor carrier 2000, however some components are hidden. All components are shown in the exploded view of FIG. 21.

Microprocessor carrier 2000 is to receive a microprocessor package and attach to a CPU loading mechanism (described below), for direct installation of the microprocessor package onto a CPU socket prior to heatsink installation. Microprocessor carrier 2000 comprises frame 2001, hinge assembly 2002 extending outwardly from an edge of frame 2001, and latch assembly 2003 extending outwardly from an opposing edge of frame 2001. An embodiment of a bolster plate (e.g., 2200 in FIG. 22A) that is adapted to receive microprocessor carrier 2000 is described below. In some embodiments, frame 2001 comprises sheet metal having a composition that comprises any suitable steel alloy. Hinge assembly 2002 and latch assembly 2003 are to engage corresponding receiving structures on the bolster plate embodiment that is described below.

The isometric view in FIG. 20 shows frame 2001 surrounding microprocessor receiving aperture 2004. In some embodiments, frame 2001 is rectangular. Hinge assembly 2003 extends outwardly from one edge of frame 2001. In some embodiments, hinge assembly 2003 comprises hinge platform 2005 that extends from the left edge of frame 2001 as oriented in the figure (in the y-direction of the figure). In some embodiments, hinge platform 2005 is integral with frame 2001, and substantially parallel thereto. Curved tabs 2006 extend outwardly from hinge platform 2005. Hinge assembly 2003 further comprises clip 2007, which is attached over hinge platform 2005. In some embodiments, curved tabs 2006 extend downwardly at an angle from hinge platform 2005, and outer edges bent upwards to create the curved profile of curved tabs 2006. In some embodiments, clip 2007 is bonded to hinge platform 2005 by any one of rivets, screws or welds. In some embodiments, clip 2007 comprises a raised edge flap 2008 that overhangs curved tabs 2006, forming a split barrel 2009 to receive a hinge pin, as described below. In some embodiments, curved tabs 2006 and edge flap 2008 function together as a claw that clamps to a hinge receiving structure on a bolster plate (2200 in FIG. 22A). In some embodiments described in greater detail below, a hinge rail (2202, FIG. 22A) engages split barrel 2009 through gap 2010.

Latch mechanism assembly 2003 extends outwardly from the right edge of frame 2001 as oriented in the figure. Latch mechanism assembly 2003 comprises slide cover 2011, spring 2012 and finger tab 2013. In some embodiments, spring 2012 extends between slide cover 2011 and finger tab 2012. Latch mechanism assembly 2003 comprises more structural features that are hidden by slide cover 2011, which are shown in the exploded view in FIG. 21 and are now described in the following paragraphs.

In some embodiments, frame 2001, hinge platform 2005 and finger tab 2013 (extending from latch platform 2104 in FIG. 21) are constructed from steel sheet metal. In some embodiments, the sheet metal comprises stainless steel (e.g., 301 stainless steel). In some embodiments, frame 2001, hinge platform 2005 and latch platform (e.g., latch platform 2104 in FIG. 21) are stamped as a contiguous unit from a unitary piece of sheet metal.

Extending below (in the z-direction) the corners of frame 2001 are mid-alignment tabs 2014. As described below, mid-alignment tabs 2014 aid in guiding a microprocessor package that is attached to microprocessor carrier 2000 to properly seat in a microprocessor socket. Microprocessor capture tabs 2015 extend below frame 2001 at approximately mid-distance between corners. In some embodiments, microprocessor capture tabs 2015 mate with mounting features a microprocessor package to attach to microprocessor carrier 2000.

In some embodiments, mid-alignment tabs 2014 and microprocessor capture tabs 2015 comprise a compliant polymeric material. Materials such as, but not limited to, high density polyethylene, polypropylene, polyamides (e.g., Nylon), polyvinylchloride (PVC), acrylonitrile butadiene styrene (ABS) and polyurethanes. In some embodiments, mid-alignment tabs 2013 and microprocessor capture tabs 2014 are molded on a single carrier strip that is bonded to frame 2001, as described below.

Figure 21:
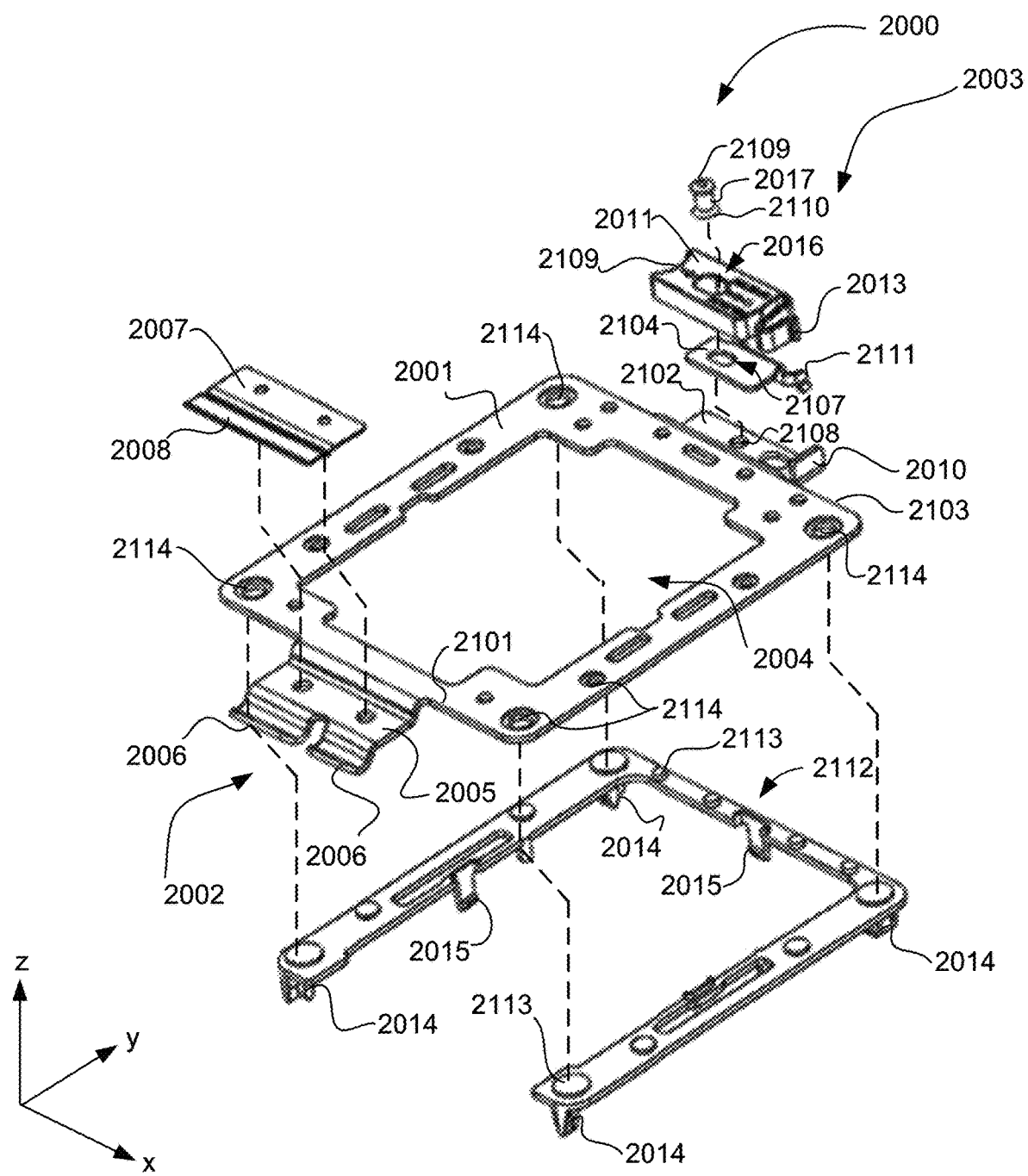
FIG. 21 illustrates an exploded isometric view of a microprocessor carrier, according to some embodiments of the disclosure.

FIG. 21 illustrates an exploded isometric view of microprocessor carrier 2000, according to some embodiments of the disclosure.

In FIG. 21, microprocessor carrier 2000 is broken out into separate components in the exploded view. Hinge platform 2005 extends outwardly from edge 2101 of frame 2001. In some embodiments hinge platform 2005 is integral with frame 2001 and substantially parallel thereto. Latch platform 2102 extends outwardly from opposing edge 2103 of frame 2001. In some embodiments, latch platform is integral with frame 2001 and substantially parallel thereto. In some embodiments, finger tab 2013 extends orthogonally from an edge of latch platform 2102.

Clip 2007 is a separate piece of hinge assembly 2002 that is assembled onto hinge platform 2005. Clip 2007 comprises edge flap 2008, which overhangs curved tabs 2006 to form split hinge barrel 2009 (shown in FIG. 20). Clip 2007 may be attached to hinge platform 2005 by use of rivets, screws or welds. Clip 2007 is stamped from sheet metal. In some embodiments, clip 2007 comprises one of carbon steel alloys or stainless steel alloys.

Latch assembly 2003 comprises slider cover 2011, slider 2104 and rivet 2105 as separate pieces that are assembled onto latch platform 2102. Slider cover 2011 and slider 2104 comprise slots 2016 and 2107, respectively. In some embodiments, slots 2016 and 2107 are coincidental when slider cover 2011 and slider 2104 are assembled. Rivet 2017 couples slider cover 2011 and slider 2104 to latch platform 2104 by insertion through slots 2016 an 2107 into rivet hole 2108 and retained therein.

Rivet 2017 comprises heads 2109 and 2110 that are wider than slot 2016 and hole 2108, enabling rivet 2017 to retain slider cover 2011 and slider 2104 on latch platform 2104 when assembled. In some embodiments, slider cover 2011 is free to slide over latch platform 2102 along the long axis of slot 2016 when actuated. Slider cover 2011 fits over slider 2104, and may abut slider 2104 when slider cover 2011 is translated. Slider 2104 may then be translated over latch platform 2102 simultaneously with slider cover 2011 by virtue of slot 2107. Both slider 2104 and slider cover 2011 are retained on latch platform 2003 by reaction of rivet 2017.

In some embodiments, slider cover 2011 comprises finger grip 2109 and cantilever spring 2013 extending from a side of slide cover 2011 that is adjacent to finger tab 2010. In some embodiments, cantilever spring 2013 and slider cover 2011 are combined as a single molded piece comprising a compliant thermoplastic, such as, but not limited to, the thermoplastics described above. In some embodiments, cantilever spring abuts finger tab 2010. Cantilever spring 2013 may react on slider cover 2011 when it is pushed toward finger tab 2010, tending to return slider cover and slider 2104 to a neutral position. The function of cantilever spring 2013 is described in greater detail below.

In some embodiments, slider 2104 is a metal plate that is stamped from sheet metal. In some embodiments, slider 2104 is a bent plate, where the plate is bent at approximately a right angle along the x-direction. In some embodiments, slider 2104 comprises at least one latching tab 2111 that extends substantially outwardly in the y-direction from an edge of slider 2104. In some embodiments, latching tab 2111 and the plate of slider 2104 are stamped as a single unit and bent to create the three-dimensional features. Form and function of latching tab 2111 are described in greater detail below.

In some embodiments, the compliant components comprising mid-alignment tabs 2014 and microprocessor capture tabs 2015 of microprocessor carrier 2000 are contained on a single molded plastic frame 2112 that is bonded to metal frame 2001. In some embodiments, plastic frame 2112 comprises bosses 2113 that mate with openings 2114 in metal frame 2001. In some embodiments, bosses 2113 are remolded within openings 2114 by a heat staking process to bond plastic frame 2112 to metal frame 2001. In some embodiments, plastic frame 2112 is bonded to metal frame 2001 by a plastic injection insert molding process.

In some embodiments, mid-alignment tabs 2014 and microprocessor capture tabs 2015 are independent pieces that are bonded to metal frame 2001. In some embodiments alignment tabs 2014 and microprocessor capture tab 2015 are inserted individually into openings 2114.

Figure 22A:
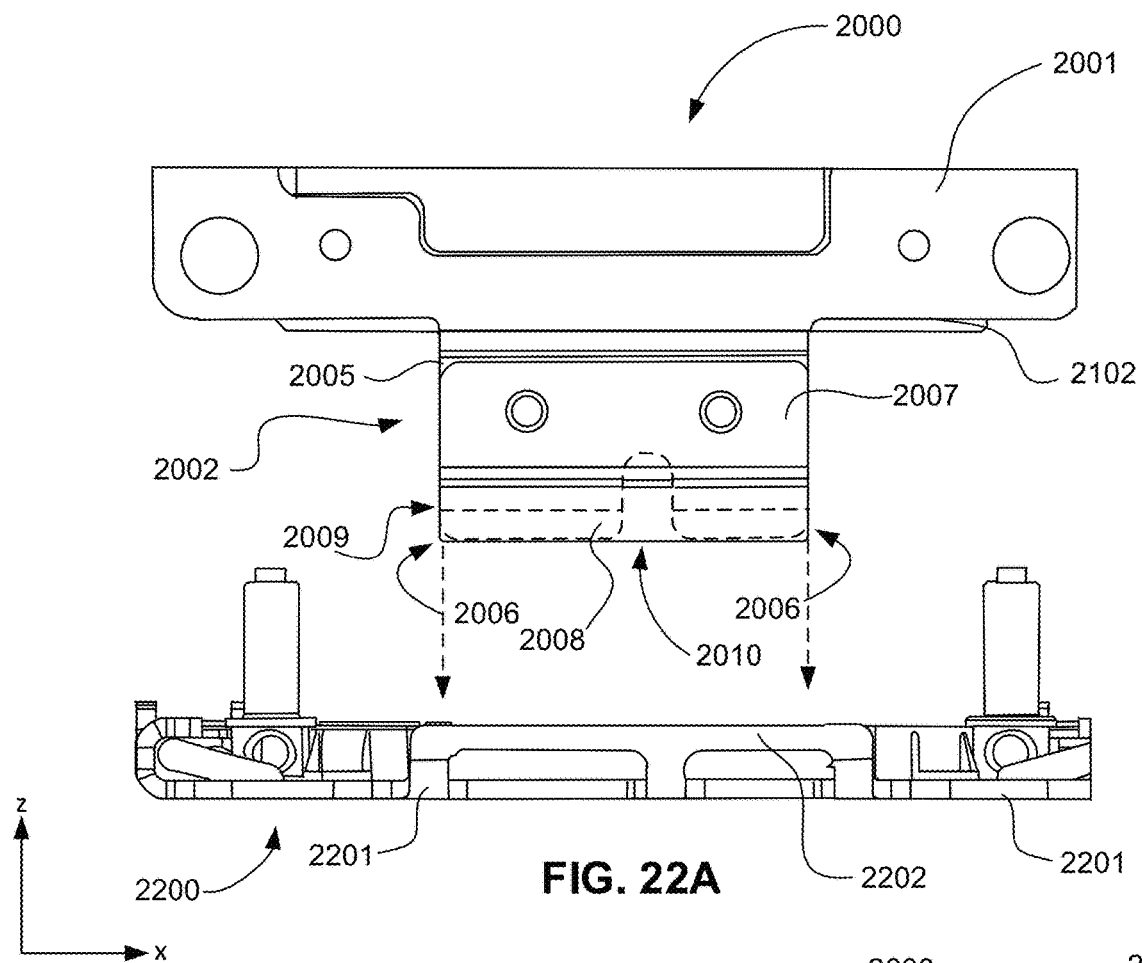
FIGS. 22A-22B illustrate profile views of coupling a microprocessor carrier to a hinge point on a bolster plate, according to embodiments of the disclosure
Figure 22B:
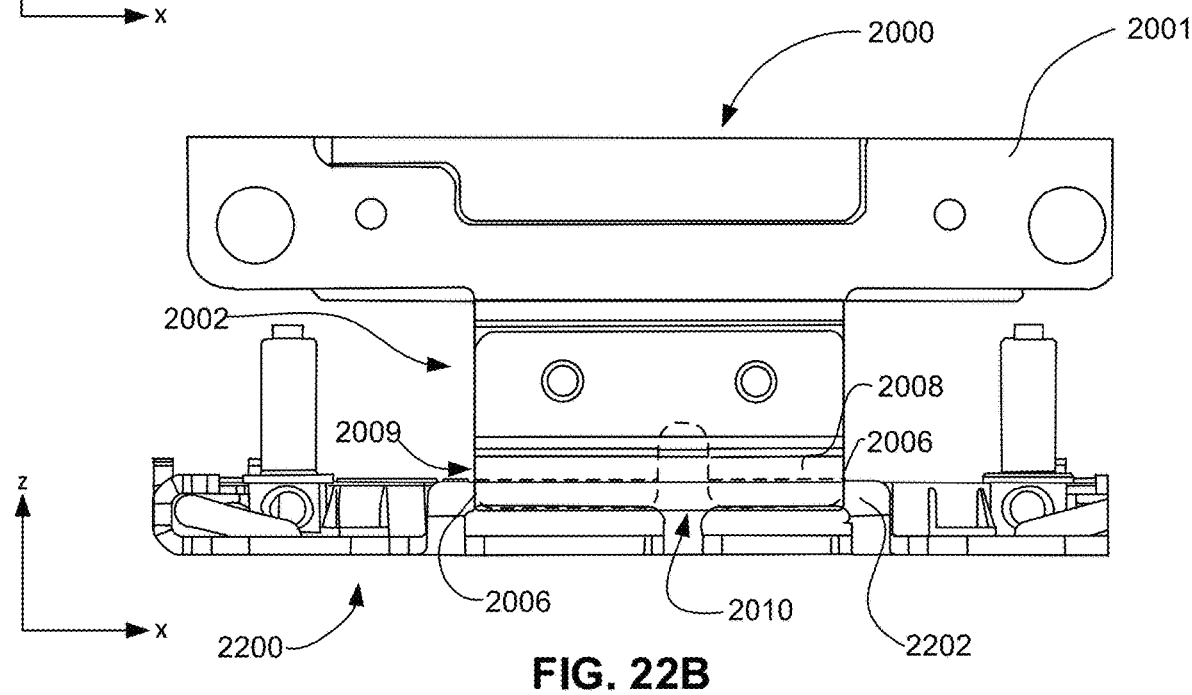

FIGS. 22A-22B illustrate profile views of coupling microprocessor carrier 2000 to hinge point 2201 on bolster plate 2200, according to embodiments of the disclosure In FIG. 22A, microprocessor carrier 2200 is positioned orthogonally over bolster plate 2200. Frame 2001 is oriented vertically in the x-z plane and bolster plate extends below the figure in the x-y plane. The view of frame 2001 is from the top side. Edge 2201 of bolster plate 2200 is shown in FIG. 22A. In some embodiments, hinge rail 2202 extends along edge 2201 in the x-direction. In some embodiments, hinge rail 2202 extends outwardly in the y direction, above the plane of the figure. Hinge mechanism 2002 extends downward (in the z-direction) from edge 2101 of microprocessor carrier frame 2001, and is substantially parallel thereto according to some embodiments.

In FIG. 22A, hinge mechanism 2002 is aligned over hinge rail 2202 and substantially coplanar therewith. Microprocessor carrier 2000 is to be lowered onto hinge rail 2202, as indicated by the vertical dashed arrows. Hinge mechanism comprises clip 2007 overlaid on hinge platform 2005 and fastened thereto. Edge flap 2008 extends downwardly from the bottom edge of clip 2007, overhanging curved tabs 2006 forming split barrel 2009 between edge flap 2008 and curved tabs 2006. In some embodiments, curved tabs 2006 do not touch edge flap 2008, leaving gap 2010. In some embodiments, curved tabs 2006 and edge flap 2008 comprise a metal composition that exhibits sufficient elasticity to displace to pass hinge rail 2202 through gap 2010 into hinge barrel 2009.

In FIG. 22B, microprocessor carrier 2000 has been lowered onto hinge rail 2202. Hinge mechanism 2002 is clipped onto hinge rail through a claw comprising curved tabs 2006 and edge flap 2008. In the illustrated assembly processes, hinge rail 2202 is passed through gap 2010, displacing curved tabs 2006 and edge flap 2008. Hinge rail 2202 is seated in hinge barrel 2009, about which microprocessor carrier 2000 articulates, according to some embodiments. The following paragraphs will describe details of the full mounting assembly of microprocessor carrier 2000 onto bolster plate 2200.

FIGS. 23A-23D illustrate an exemplary method for assembling microprocessor carrier 2000 onto bolster plate 2200, according to some embodiments of the disclosure.

Figure 23A:
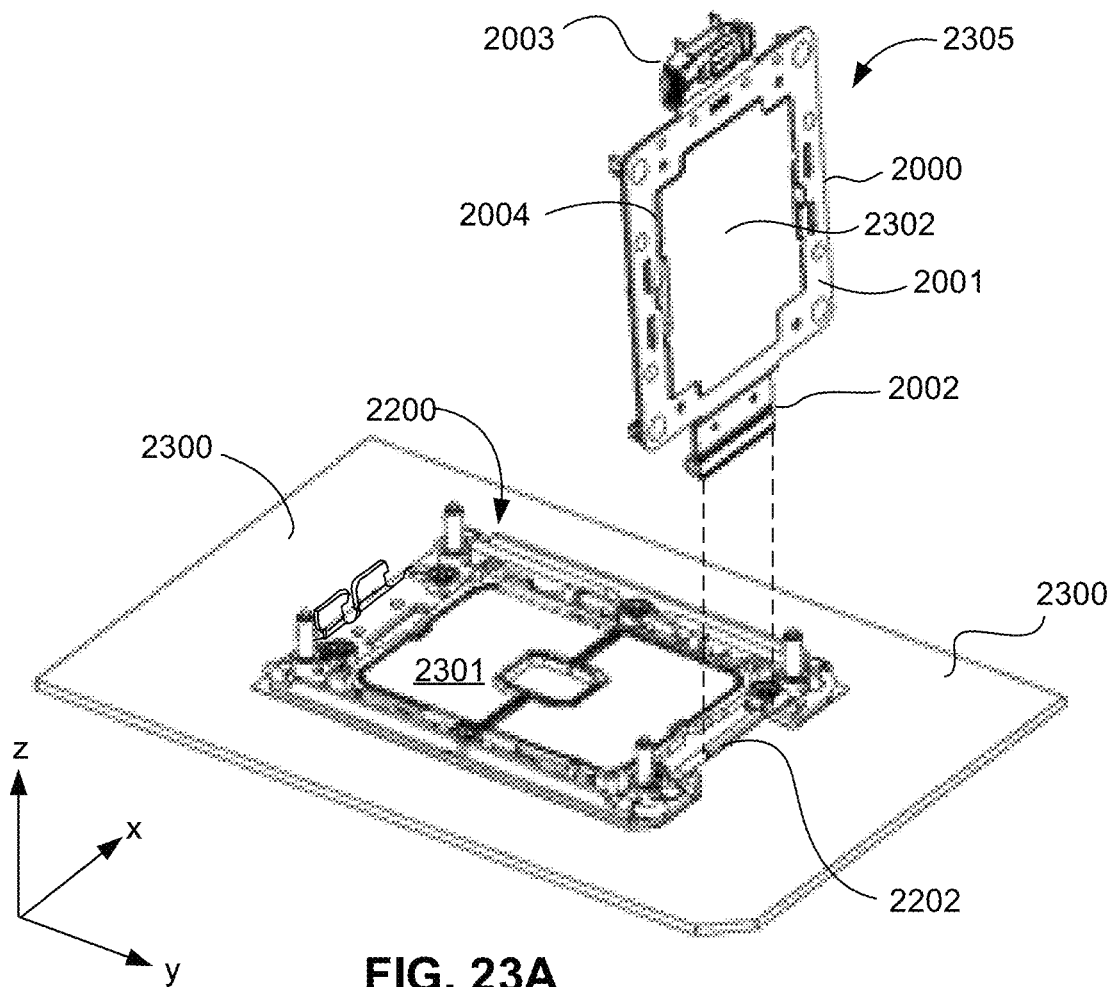
FIGS. 23A-23D illustrate an exemplary method for installing a microprocessor carrier on bolster plate, according to some embodiments of the disclosure.

FIG. 23A illustrates an oblique view of microprocessor carrier 2000 and bolster plate 2200. Bolster plate 2200 is shown coupled to PCB substrate 2300. Microprocessor socket 2301 is seated within the microprocessor socket aperture (e.g., aperture 1615 in FIG. 16B) of bolster plate 2200, and coupled to PCB substrate 2300. Microprocessor carrier 2000 is in the process of being lowered onto hinge rail 2202 on bolster plate 2200.

Microprocessor carrier 2000 carries microprocessor package 2302, seated within microprocessor receiving aperture 2004 within frame 2001. The combination forms a carrier/microprocessor subassembly 2305. The surface of the die side of microprocessor package 2302 is shown. In some embodiments, an integrated heat spreader (IHS) is on the die side of microprocessor package 2302. In subsequent operations, the IHS is to be interfaced with a heatsink. Lands are on the opposing face of microprocessor package 2302, and are to align with pins on microprocessor socket 2301. Hinge assembly 2002 is aligned over hinge rail 2202, as described above and shown in FIG. 22A. Latch assembly 2003 is on the opposing edge of microprocessor carrier 2000.

Figure 23B:
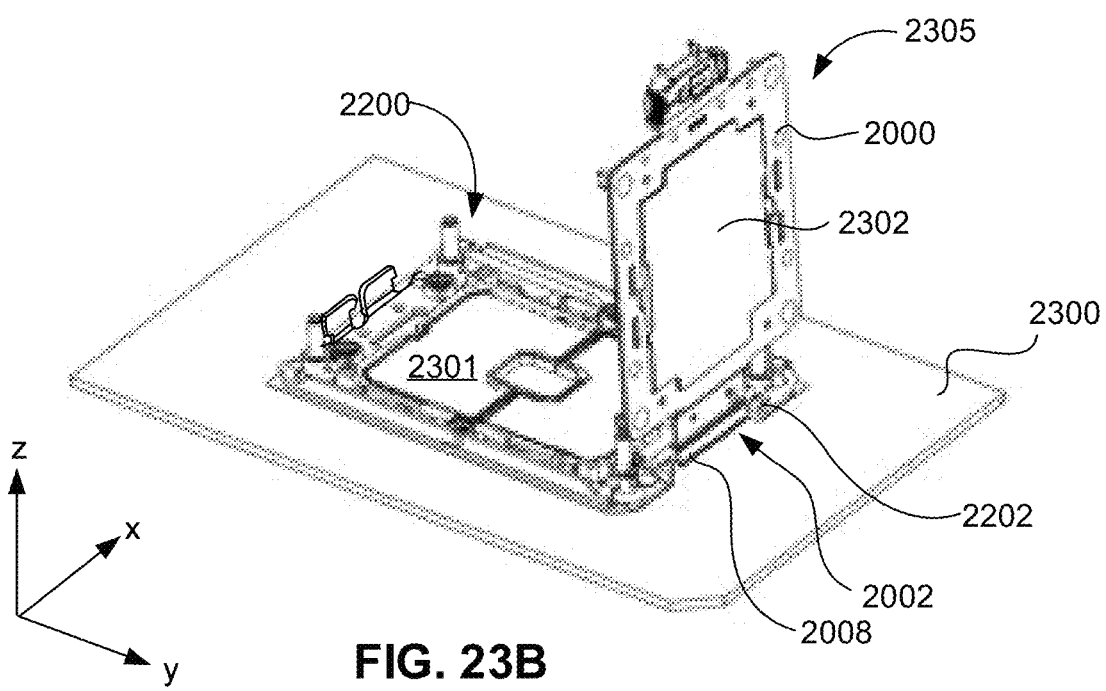

FIG. 23B illustrates an oblique view of carrier/microprocessor subassembly 2305 docked onto bolster plate 2200. In some embodiments, bolster plate 2200 is coupled to PCB substrate 2300. In some embodiments, hinge assembly 2002 is clipped onto hinge rail 2202 by passage between curved tabs (e.g., 2006 in FIG. 21) and edge flap 2008, as described above. Hinge mechanism 2002 articulates about hinge rail 2202 to enable microprocessor package 2302 to seat on microprocessor socket 2301 by pivoting microprocessor carrier 2000 downward, as shown in a subsequent operation.

Figure 23C:
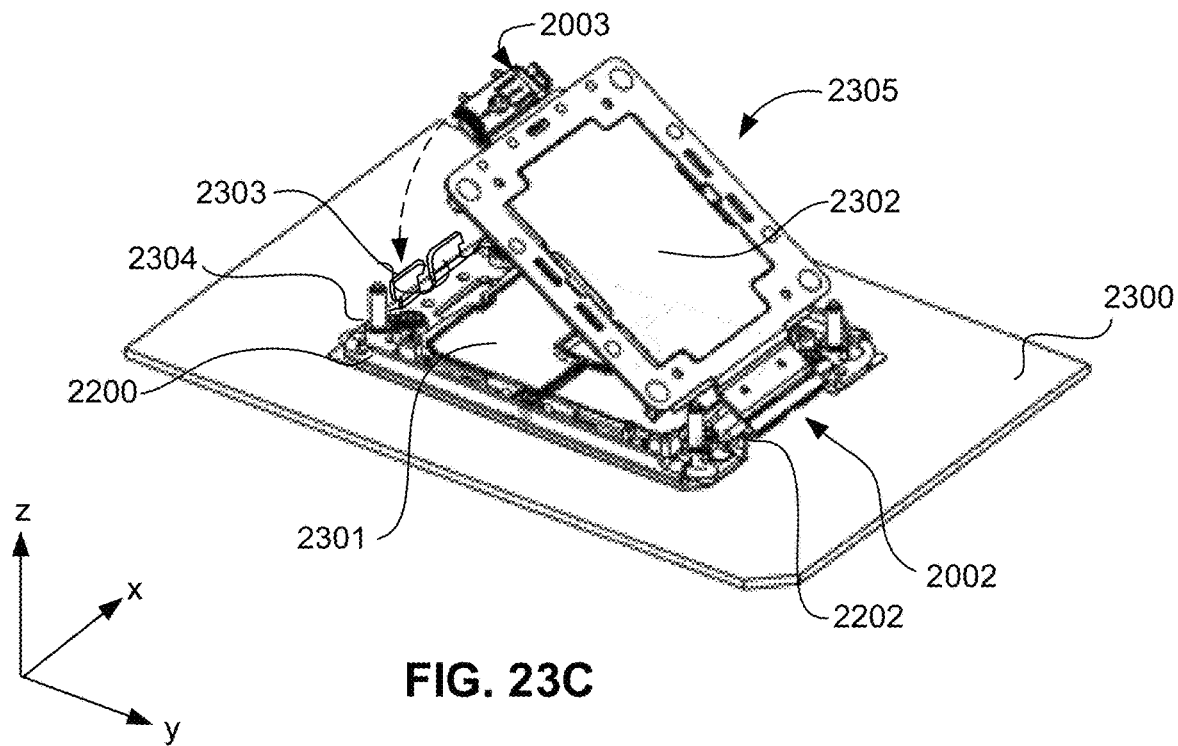

In FIG. 23C, carrier/microprocessor subassembly 2305 is pivoted downward toward bolster plate 2200. Microprocessor package 2302 undergoes a two-stage alignment with microprocessor socket 2301 to maximize proper alignment of lands and pins. In some embodiments, clipping hinge assembly 2002 onto hinge rail 2202 effectuates a gross alignment of microprocessor package 2302 with microprocessor socket 2301. In some embodiments, microprocessor carrier 2000 is dimensioned so that microprocessor package 2302 will align with microprocessor socket within a certain tolerance. In some embodiments, the alignment tolerance is between 0.5 mm to 1 mm. A finer alignment is effectuated by mid-alignment tabs 2014 (FIG. 21).

In some embodiments, bolster plate 2200 is dimensioned to enable latching mechanism 2003 to align to and mate with locking tabs 2303 on edge 2304 of bolster plate 2200. The details of the latching mechanism are described below for FIGS. 24A and 24B.

Figure 23D:
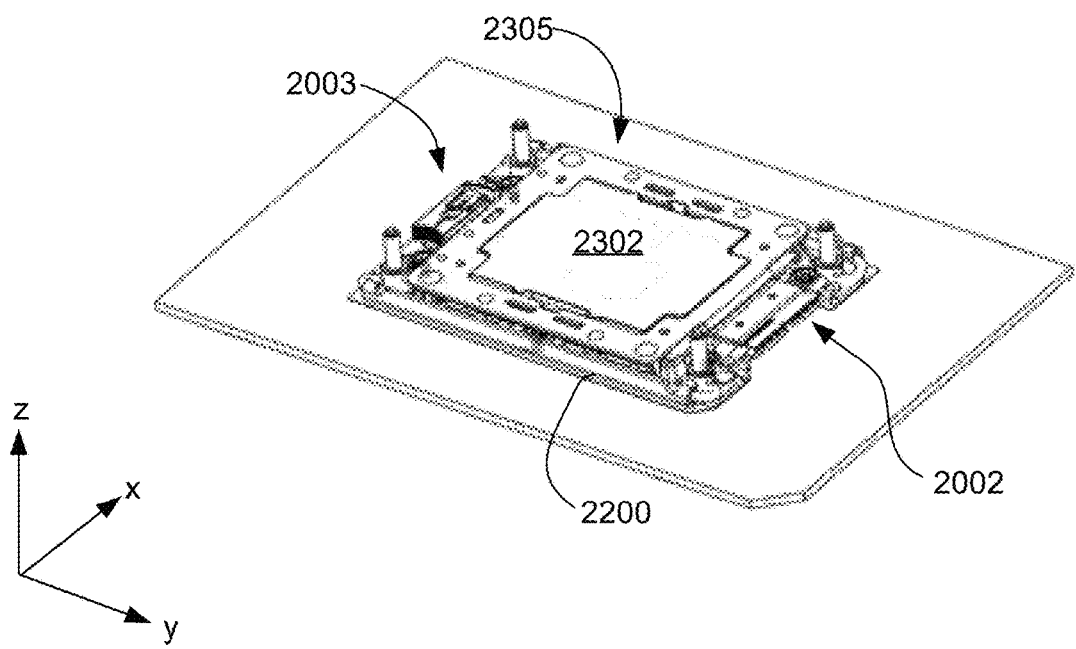

In FIG. 23D, microprocessor/carrier subassembly 2305 is lowered fully into a horizontal position onto bolster plate 2200. Latch assembly 2003 is locked onto latch receiving features on bolster plate 2200 by mating with locking tabs (e.g., locking tabs 2303 in FIG. 23C). Microprocessor package 2302 is aligned over microprocessor socket (not shown) and undergoes a second stage of fine alignment to line up the land array with the pin array on microprocessor socket 2301, as described below for FIG. 25.

Figure 24A:
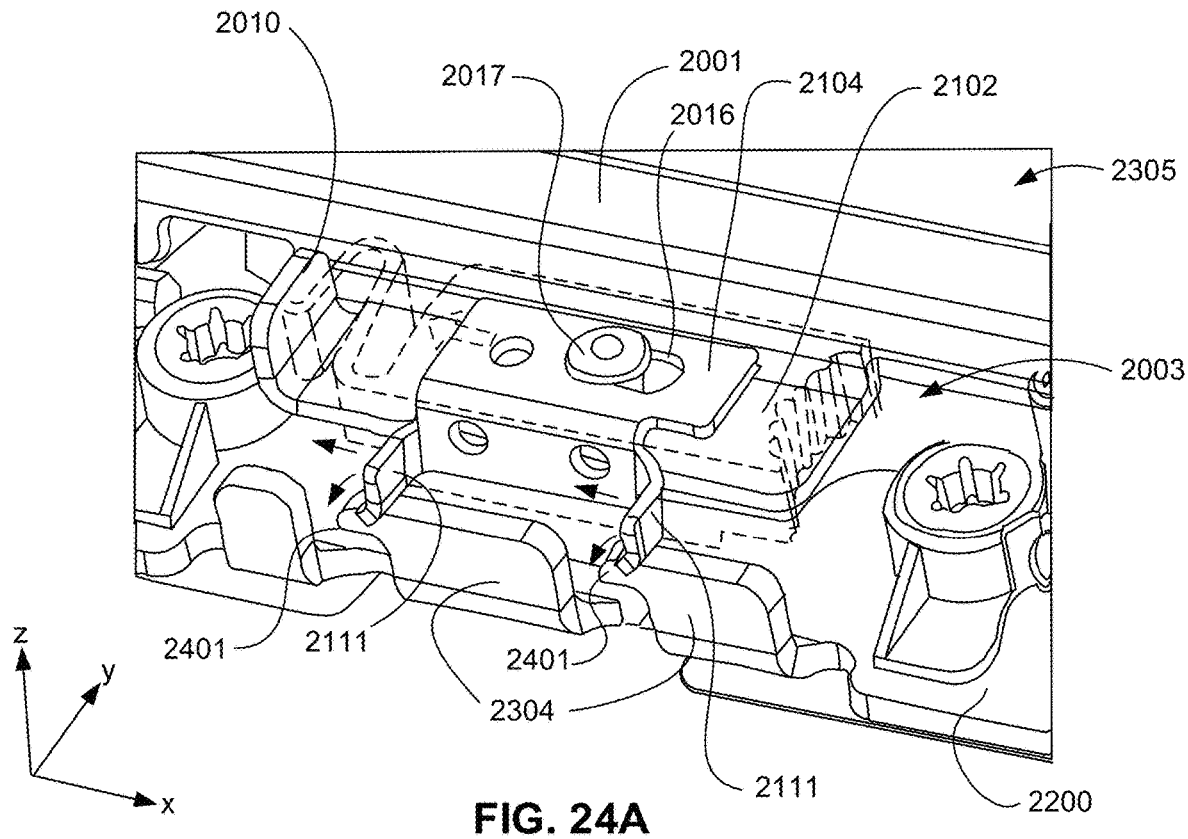
FIGS. 24A and 24B illustrate oblique views of the latching mechanism to lock a carrier/microprocessor assembly to a bolster plate, according to some embodiments of the disclosure.
Figure 24B:
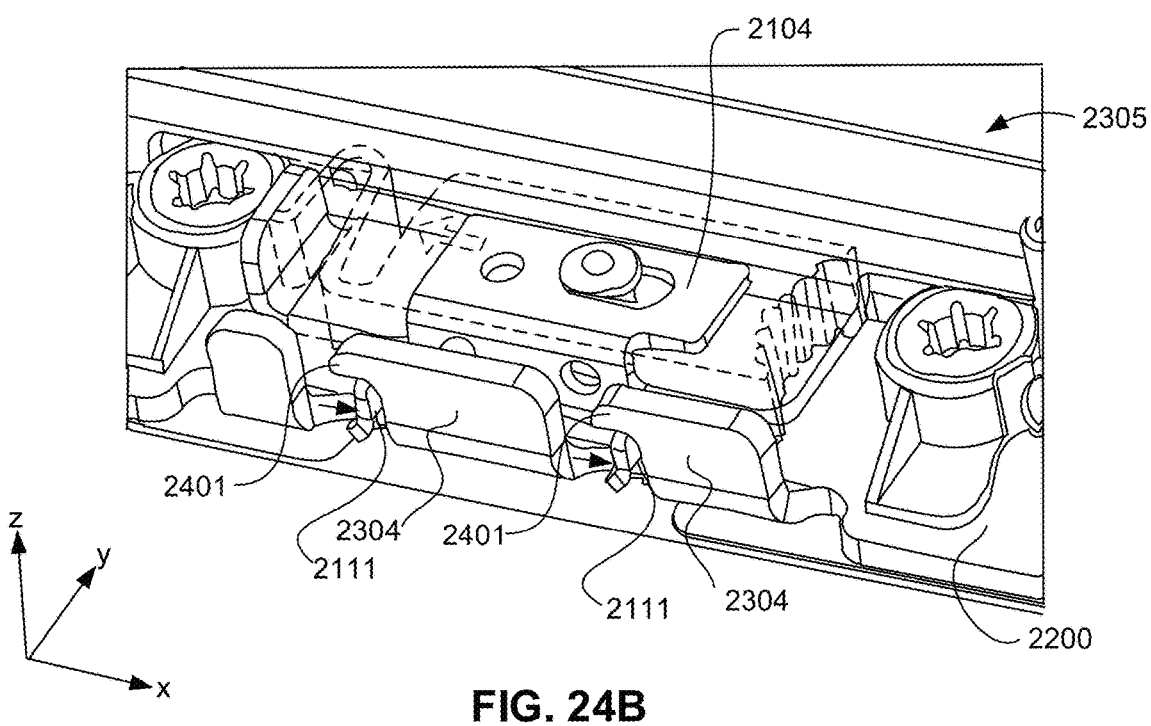

FIGS. 24A and 24B illustrate oblique views of the latching mechanism to lock carrier/microprocessor assembly 2305 to bolster plate 2200, according to some embodiments of the disclosure.

In the operation shown in FIG. 24A, carrier/microprocessor assembly 2305 is rotated to a horizontal position and grossly aligned with bolster plate 2200. Latching tabs 2111 extend from slider 2104. In some embodiments, slider 2104 is bent at substantially a right angle into horizontal portion and a vertical portion. In some embodiments, latching tabs 2111 extend from the vertical section, as shown in the illustrated embodiment. Latching tabs 2111 abut and rest over locking tabs 2304. In some embodiments, locking tabs 2304 comprise chamfered noses 2401 that extend laterally from the top portion of locking tabs 2304. Chamfered noses 2401 comprise a sloped edge that enables latching tabs to slide downwards when slider 2104 is moved toward finger tab 2010 by actuation over latch platform 2102. In some embodiments, latching tabs 2111 are aligned over locking tabs 2304 such that latching tabs 2111 are adjacent to chamfered digits 2401, as the illustrated embodiment shows in FIG. 24A.

Slider 2104 is held to latch platform 2102 by rivet 2017 that is confined within slot 2016. Slider cover 2011 is present in the figure and indicated by the hidden lines to reveal details of slider 2104 underneath. In some embodiments, slider cover (e.g., 2011 in FIG. 21) abuts slider 2102 when pushed from finger grip 2109, pushing slider 2102 toward finger tab 2010, as indicated by the arrows pointing to the left of the figure. Cantilever spring 2013 is also present and indicated by the hidden lines. The cantilever spring (e.g., 2013 in FIG. 21) is compressed. As indicated by the arrows in the figure, latching tabs 2304 slide toward the left in the figure when slider 2104 is actuated by pushing the slider cover. Latching tabs 2304 slide off of chamfered digits 2401, enabling latch assembly 2003 to fall toward bolster plate 2200 and snap under chamfered noses 2401 of locking tabs 2304.

In the operation shown in FIG. 24B, latching tabs 2111 are locked under locking tabs 2304. As latching tabs 2111 slide downward from chamfered noses 2401, the reaction of cantilever spring (e.g., cantilever spring 2013 in FIG. 20) pushes back on the slider cover (e.g., 2011 in FIG. 21, and indicated by the hidden lines). Latching tabs 2111 travel to the right in the figure as indicated by the arrows pointing to the right in the figure, and rest against a vertical edge of locking tabs 2304. In some embodiments, natural tension in the cantilever spring reacts on slider 2104, applying a static force to slider 2104 and to latching tabs 2111 that are integral with slider 2104. The static force traps latching tabs 2111 under chamfered noses 2401, pushing latching tabs 2111 against vertical edges of locking tabs 2304. The action locks carrier/microprocessor subassembly 2305 to bolster plate 2200.

Figure 25:
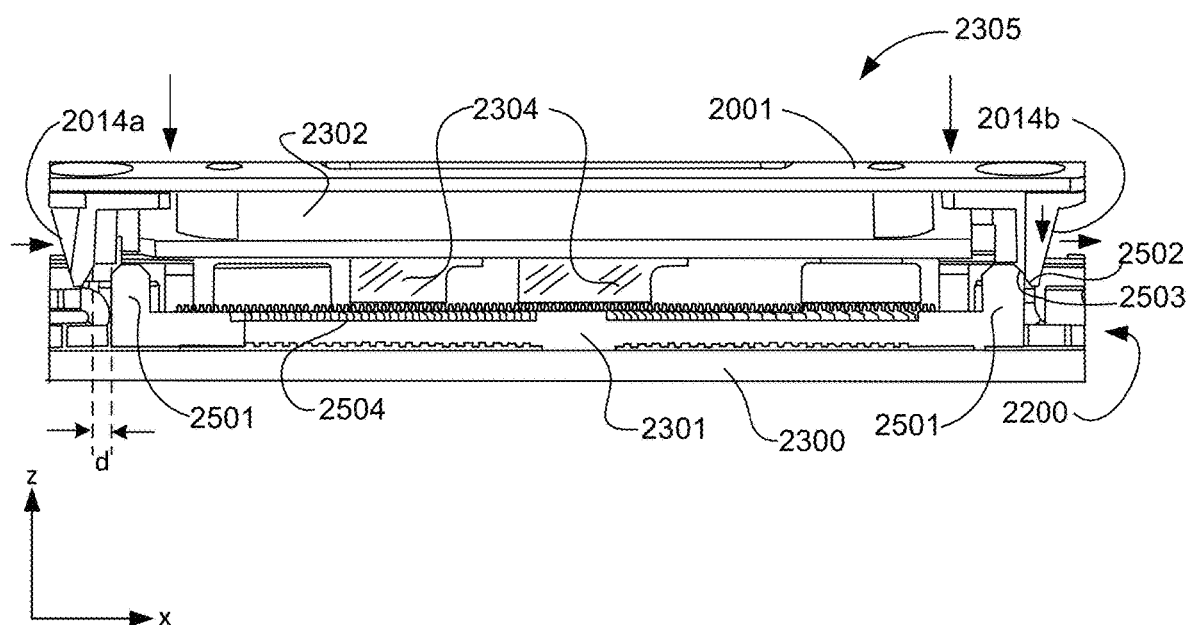
FIG. 25 illustrates an exemplary method for the fine alignment of a microprocessor package on a microprocessor socket by use of mid-alignment tabs on the microprocessor carrier, according to some embodiments of the disclosure.

FIG. 25 illustrates an exemplary method for fine alignment of microprocessor package 2302 on microprocessor socket 2301 by mid-alignment tabs 2014, according to some embodiments of the disclosure.

In FIG. 25, carrier/microprocessor 2305 and bolster plate 2200 are shown in cross-sectional view looking from a slice in the x-z plane of hinge assembly end toward the latch assembly end that is below the plane of the figure. Locking tabs 2304 are shown below the plane of the figure extending vertically (in the z-direction) from the far edge of bolster plate 2200. In the illustrated embodiment, carrier/microprocessor subassembly 2305 is shown misaligned over microprocessor socket 2301. Mid-alignment tab 2014a on the left side of microprocessor carrier frame 2001 (as oriented in the figure) is offset to the left from chamfered socket wall 2501 by a distance d.

Mid-alignment tab 2014b on the right side of microprocessor carrier frame 2001 comprises chamfered foot 2502 that abuts sloped edge 2503 at the top of chamfered socket wall 2501. In some embodiments, downward force applied to carrier/microprocessor subassembly 2305, as indicated by the downward-pointing arrows, causes mid-alignment tabs 2014a and 2014b to slide down sloped edge 2503. In some embodiments, microprocessor package 2302 travels laterally by distance d or less, as indicated by the right-pointing arrows. In some embodiments, the LGA on microprocessor package 2302 is aligned with pin array 2504 on microprocessor socket 2301 before microprocessor package 2302 seats within microprocessor socket 2301, mitigating potential damage to pin array 2504 due to misalignment. In the final phase of locking carrier/microprocessor subassembly 2305 to bolster plate 2200, microprocessor package 2302 descends vertically downward to seat within microprocessor socket 2301.

Figure 26A:
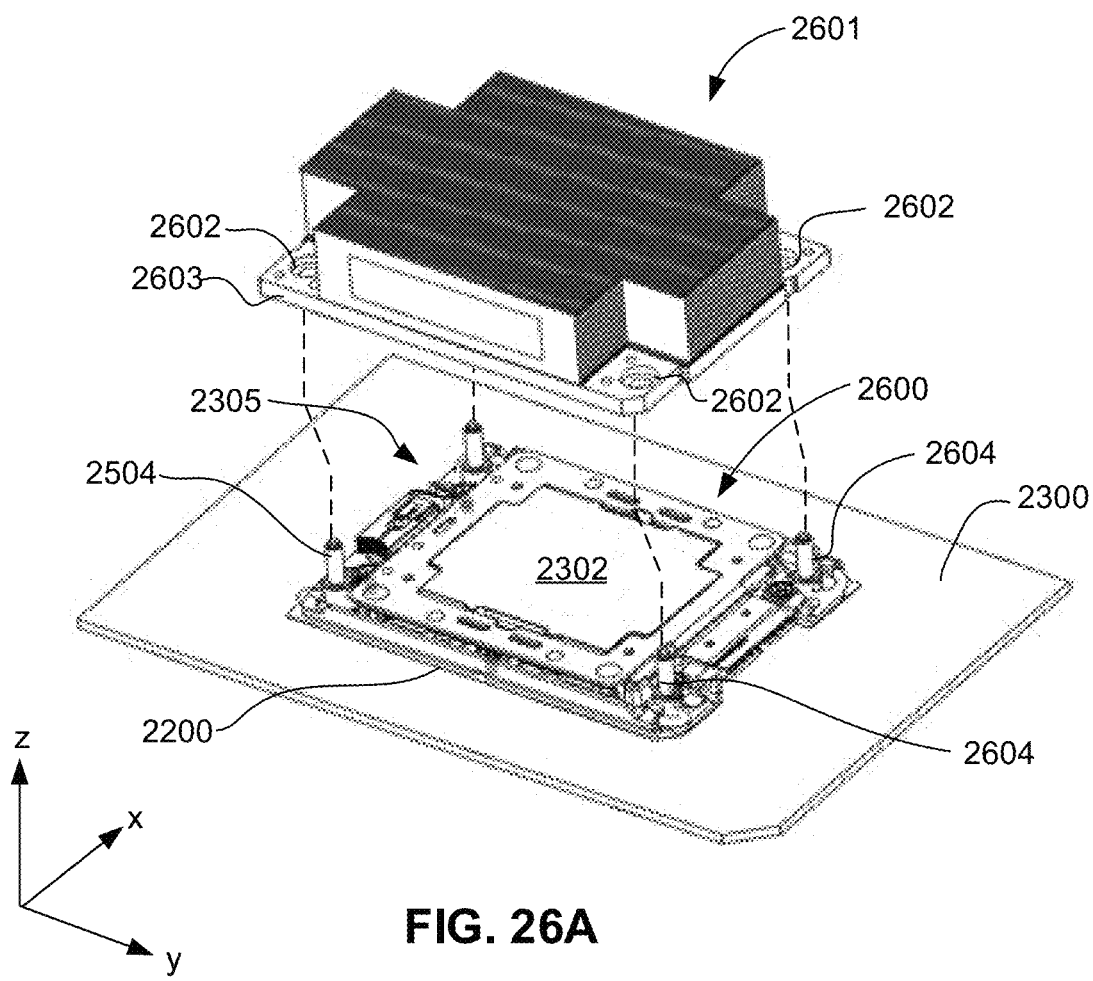
FIGS. 26A and 26B illustrate an exemplary method of loading a carrier/microprocessor subassembly, according to some embodiments of the disclosure.
Figure 26B:
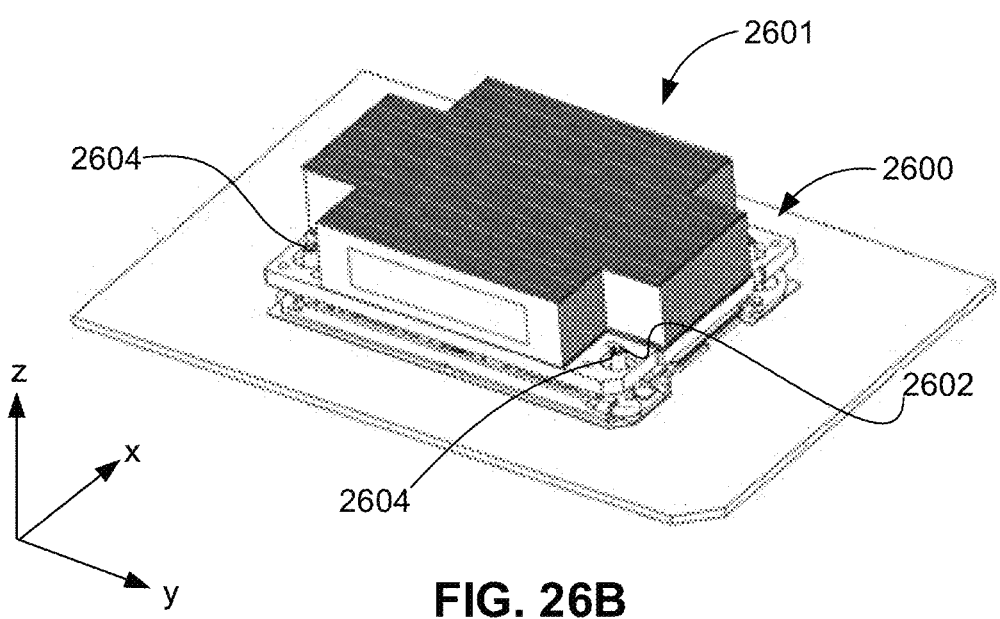

FIGS. 26A and 26B illustrate an exemplary method of loading carrier/microprocessor subassembly 2305, according to some embodiments of the disclosure.

In the operation shown in FIG. 26A, carrier/microprocessor subassembly 2305 is locked onto bolster plate 2200, as described above and shown in FIG. 23D. Bolster plate 2200 is coupled to PCB substrate 2300. In some embodiments, PCB substrate 2300 is a computer motherboard. The combination of carrier/microprocessor subassembly locked onto bolster plate 2200 forms central processing unit (CPU) subassembly 2600. Heatsink 2601 is positioned over carrier/microprocessor subassembly 2305 such that bolt passage holes 2602 on mounting flange 2603 are aligned with mounting studs 2604 extending orthogonally (vertically) from bolster plate 2200.

The exemplary method operation shown in FIG. 26A and the method described above and shown in FIGS. 23A-23D contrasts from earlier methods of loading a microprocessor mounted within a microprocessor socket coupled to a PCB substrate. Referring to the earlier loading embodiments described in the disclosure, the microprocessor package is attached to a heatsink by a carrier, in contrast to the operation of FIG. 26A. In some embodiments, the carrier is clipped to the mounting flange of the heatsink, interfacing the IHS of the microprocessor package with a heat transfer surface, such as a cold plate. In some embodiments, a thermal interface material (TIM) intervenes between the IHS and the heat transfer surface.

The heatsink/microprocessor subassembly is then brought into proximity of a bolster plate coupled to a PCB substrate and surrounding a microprocessor socket. The heatsink/microprocessor subassembly is then lowered to align and seat the microprocessor within the microprocessor socket.

Fasteners are then engaged with mounting studs on the bolster plate and tightened down over the mounting flange.

In the operation shown in FIG. 26B, heatsink 2601 is lowered onto CPU subassembly 2600. Mounting studs 2604 extend through bolt passage holes 2602 in preparation for engagement with fasteners. In some embodiments, fasteners are retaining nuts, such as retaining nut 101 in FIG. 4B. Loading of microprocessor package (e.g., 2302 in FIG. 26A) may be performed as described earlier in the disclosure. In some embodiments, anti-tilt fasteners, such as anti-tilt fastener assemblies 100 in FIG. 4B are employed. In some embodiments, CPU subassembly 2600 automatically performs an anti-tilt function, as is described below. In some embodiments, anti-tilt fasteners (e.g., anti-tilt fasteners 100 in FIG. 4B) are not required for loading microprocessor package 2302. The automatic anti-tilt function of CPU subassembly 2600 is described in the following paragraphs.

Figure 27:
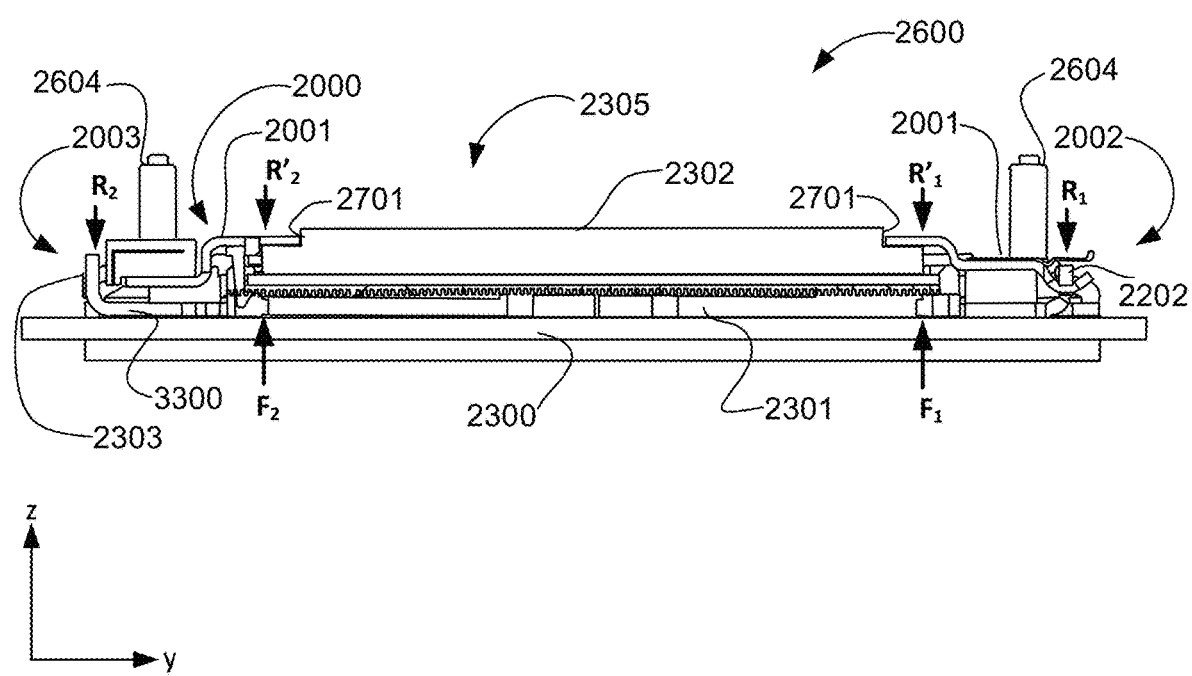
FIG. 27 illustrates the anti-tilt function of a CPU subassembly, according to some embodiments of the disclosure.

FIG. 27 illustrates the anti-tilt function of CPU subassembly 2600, according to some embodiments of the disclosure.

In FIG. 27, CPU subassembly 2600 is shown in cross section between hinge assembly 2002 and latch assembly 2003. Latch assembly 2003 is engaged in locking tabs 2303 and hinge assembly 2002 is engaged on hinge rail 2202, locking carrier/microprocessor 2305 onto bolster plate 2200. Fixed elements of hinge assembly 2002 and latch assembly 2003 with bolster plate 220 restrict motion of carrier/microprocessor 2305 by reaction to external forces.

The anti-tilt function of CPU subassembly 2600 will now be described. Starting with the installed heatsink/microprocessor assembly as shown in FIG. 26B, the load on CPU subassembly 2600 becomes unbalanced as two or more of the retention nuts are untightened and removed from mounting studs 2604 in any sequence. Release of the load on one side of CPU subassembly 2600 creates a tendency to tilt in the direction of the remaining load. Without tilt control, CPU subassembly would lift one side of microprocessor 2302 from socket 2301 while pressing microprocessor 2302 on the pins on the opposite side of microprocessor socket 2301, possibly damaging them.

In FIG. 27, an attached heatsink (e.g., heatsink 2601 in FIG. 26B) and retention nuts are not shown to facilitate description of the anti-tilt function of CPU subassembly 2600. According to some embodiments, CPU subassembly comprises microprocessor carrier 2000 fixed on bolster plate 2200, and microprocessor package 2302 seated within microprocessor carrier 2000 (forming carrier/microprocessor assembly 2305).

In FIG. 27, two or three retention nuts are untightened. The load is released in an unbalanced manner. The unbalanced forces are indicated by $F_1$ and $F_2$ in FIG. 27. The unbalance release of the load tends to tilt the attached heatsink, creating upward forces $F_1$ and $F_2$ acting on the left and right side of carrier/microprocessor assembly 2305, respectively. Microprocessor package 2302 tends to travel with the heatsink due to adhesion by a TIM layer. As carrier/microprocessor 2305 is fixed on bolster plate 2200 at the latch and hinge points the upward forces are reacted downward by locking tabs 2303 and hinge rail 2202, respectively. The reactive forces are indicated by $R_1$ and $R_2$. Microprocessor package 2302 is constrained to remain seated in microprocessor socket 2301 as reactive forces $R_1$ and $R_2$ are transferred to microprocessor package 2302 ($R'_1$ and $R'_2$) where frame 2001 interacts with IHS features 2701.

At the same time, adhesion forces due to TIM surface tension are overcome by the unbalanced load on heatsink, which tilts accordingly and separates from microprocessor 2302, according to some embodiments. Simultaneous tilt control and CPU/heatsink separation is performed by microprocessor carrier 2000.

Figure 28:
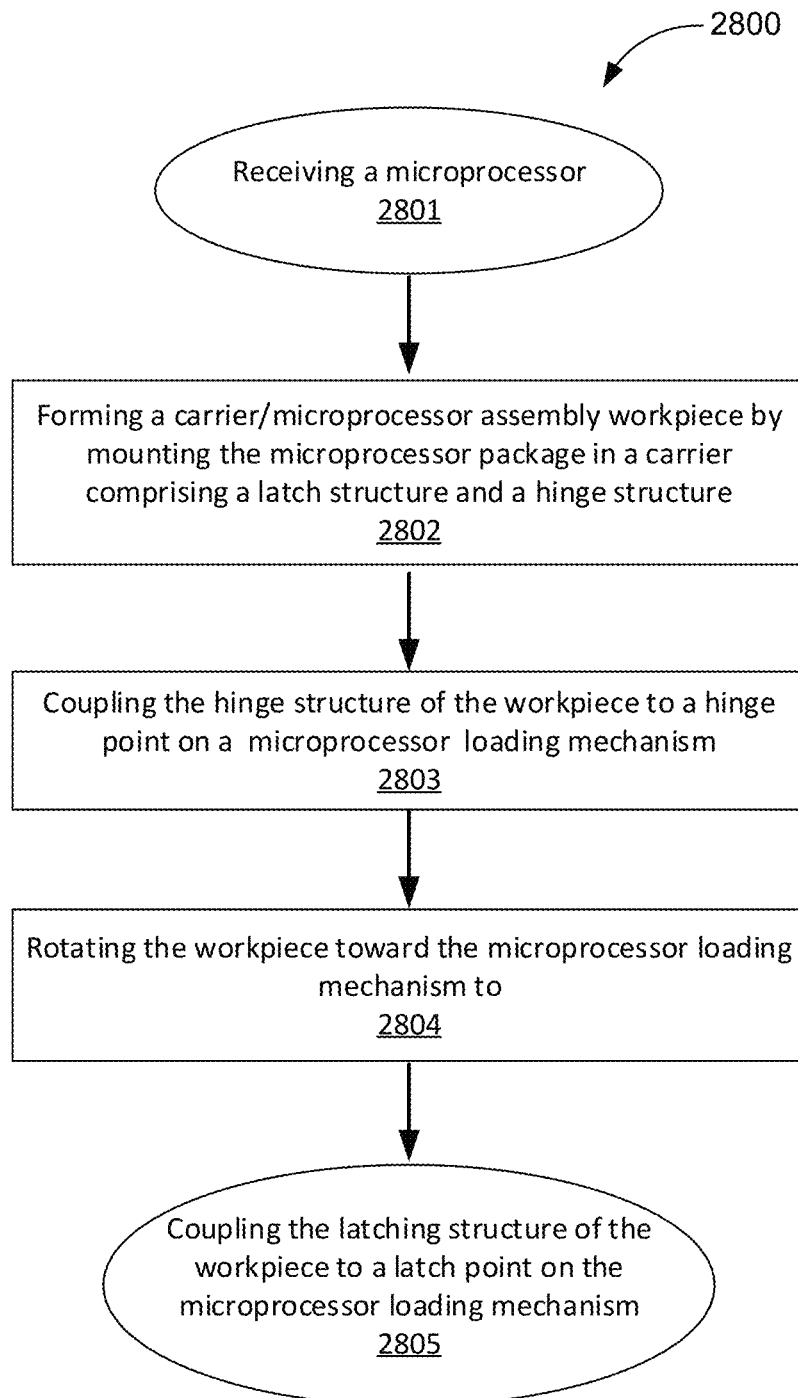
FIG. 28 illustrates a flow chart for a method of using a microprocessor carrier following FIGS. 23A-23D, according to some embodiments of the disclosure.

FIG. 28 illustrates flow chart 2800 for a method of using microprocessor carrier 2000 following FIGS. 23A-23D, according to some embodiments of the disclosure.

In operation 2801, a microprocessor package (e.g., microprocessor package 2302 in FIG. 23A) is received in a shipping tray, according to some embodiments. In some embodiments, the microprocessor package comprises an IHS having shape features enabling mounting in a microprocessor carrier.

In operation 2802, the microprocessor package is captured in a microprocessor carrier (e.g., microprocessor carrier 2000 in FIG. 20), forming a carrier/microprocessor assembly workpiece (e.g., carrier/microprocessor assembly 2305 in FIG. 23A) having a frame surrounding a microprocessor receiving aperture, a latch assembly and a hinge assembly attached to opposite sides of the frame (e.g., see FIG. 20). The microprocessor carrier comprises compliant tabs that snap into the shape features of the IHS to secure the microprocessor package to the carrier.

In operation 2803, the workpiece is lowered onto a microprocessor loading mechanism comprising a bolster plate (e.g., bolster plate 2200 in FIGS. 23A and 23B), as shown in FIG. 23B. Hinge assembly 2002 is coupled to a hinge receiving structure (e.g., hinge rail 2202) on one edge of the loading mechanism. In some embodiments, the hinge assembly is clipped over the hinge rail on the bolster plate. In some embodiments, the hinge assembly articulates on the hinge rail, enabling rotation of the workpiece about the hinge rail.

In some embodiments, the bolster plate comprises a microprocessor socket receiving aperture (e.g., aperture 2004 in FIG. 20). A microprocessor socket is seated within the receiving aperture and is coupled to the substrate In operation 2804, the workpiece is rotated toward the loading mechanism to seat the microprocessor package in the microprocessor socket, as shown in FIG. 23C. In some embodiments, the microprocessor package is automatically aligned with the socket. In some embodiments, the alignment occurs in to stages. First, gross alignment is enabled by engaging the hinge assembly of the workpiece with the loading mechanism hinge point on an edge of the bolster plate. The carrier and bolster plate are dimensioned such that the microprocessor package is substantially aligned with the socket. In some embodiments, the offset tolerance is ±1 mm. A fine alignment occurs at a second stage, where alignment tabs on the carrier interact with the socket walls to finely adjust the centering of the workpiece over the socket (e.g., see FIG. 25 and related description).

In operation 2805, the latch assembly on the workpiece (e.g., latch assembly 2003 in FIG. 20) is engaged with latch point on the bolster plate of the loading mechanism, as shown in FIG. 23D. Tabs on the latch assembly of the workpiece (e.g., latching tabs 2111, FIG. 21) engage with locking tabs on an edge of the bolster plate (e.g., locking tabs 2304, FIGS. 23A-23C). When the workpiece is forced downward after touching down on the latch point, the tabs on the latch assembly slide into notches on the sides of the locking tabs. A cantilever spring on the latch assembly presses the latch assembly tabs laterally against the locking tabs on the bolster plate to secure the workpiece to the loading mechanism.

Figure 29:
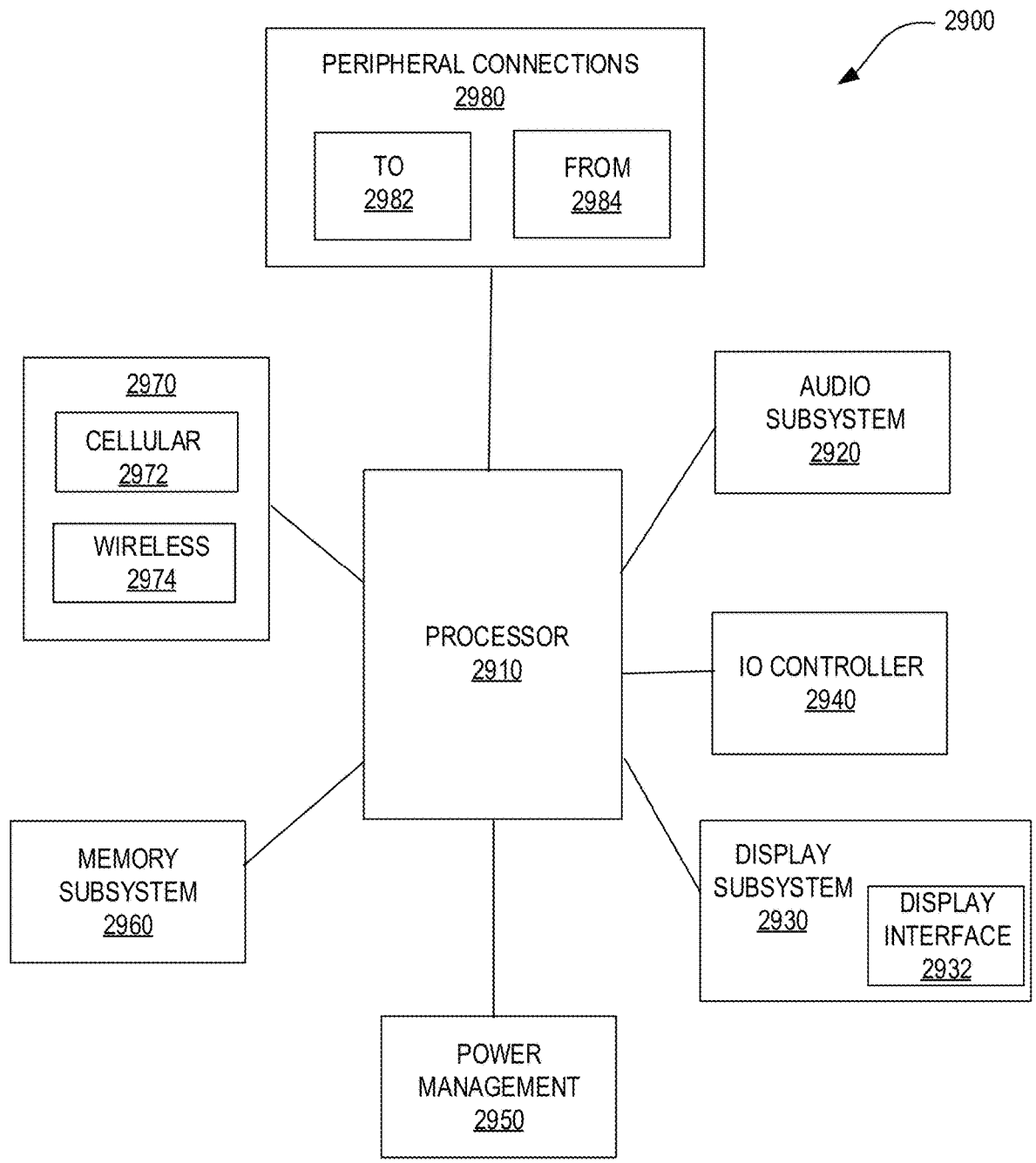
FIG. 29 illustrates a microprocessor (CPU) as part of a system-on-chip (SoC) package, where the microprocessor SoC package is mounted on the motherboard of a computing device according to the disclosed method, where the microprocessor is mounted in a microprocessor carrier comprising a microprocessor latch assembly and a hinge assembly.

FIG. 29 illustrates a microprocessor (CPU) as part of a system-on-chip (SoC) package, where the microprocessor SoC package is mounted on the motherboard of a computing device according to the disclosed method, where the microprocessor (e.g., microprocessor 2302 in FIG. 23A) is mounted in a microprocessor carrier comprising a microprocessor latch assembly and a hinge assembly (e.g., microprocessor carrier 2000 in FIG. 1).

FIG. 29 illustrates a block diagram of an embodiment of a computing device 2900. In some embodiments, computing device 2900 represents a computing tablet, a laptop, a desktop computer or server. It will be understood that certain components are shown generally, and not all components of such a device are shown in computing device 2900.

In some embodiments, computing device 2900 includes a first processor 2910. The various embodiments of the present disclosure may also comprise a network interface within 2970 such as a wireless interface so that a system embodiment may be incorporated into a wireless device, for example, cell phone or personal digital assistant.

In one embodiment, processor 2910 can include one or more physical devices, such as microprocessors, application processors, microcontrollers, programmable logic devices, or other processing means. The processing operations performed by processor 2910 include the execution of an operating platform or operating system on which applications and/or device functions are executed. The processing operations include operations related to I/O (input/output) with a human user or with other devices, operations related to power management, and/or operations related to connecting the computing device 2900 to another device. The processing operations may also include operations related to audio I/O and/or display I/O.

In one embodiment, computing device 2900 includes audio subsystem 2920, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2900, or connected to the computing device 2900. In one embodiment, a user interacts with the computing device 2900 by providing audio commands that are received and processed by processor 2910.

Display subsystem 2930 represents hardware (e.g., display devices) and software (e.g., drivers) components that provide a visual and/or tactile display for a user to interact with the computing device 2900. Display subsystem 2930 includes display interface 2932 which includes the particular screen or hardware device used to provide a display to a user. In one embodiment, display interface 2932 includes logic separate from processor 2910 to perform at least some processing related to the display. In one embodiment, display subsystem 2930 includes a touch screen (or touch pad) device that provides both output and input to a user.

I/O controller 2940 represents hardware devices and software components related to interaction with a user. I/O controller 2940 is operable to manage hardware that is part of audio subsystem 2920 and/or display subsystem 2930. Additionally, I/O controller 2940 illustrates a connection point for additional devices that connect to computing device 2900 through which a user might interact with the system. For example, devices that can be attached to the computing device 2900 might include microphone devices, speaker or stereo systems, video systems or other display devices, keyboard or keypad devices, or other I/O devices for use with specific applications such as card readers or other devices.

As mentioned above, I/O controller 2940 can interact with audio subsystem 2920 and/or display subsystem 2930. For example, input through a microphone or other audio device can provide input or commands for one or more applications or functions of the computing device 2900. Additionally, audio output can be provided instead of, or in addition to display output. In another example, if display subsystem 2930 includes a touch screen, the display device also acts as an input device, which can be at least partially managed by I/O controller 2940. There can also be additional buttons or switches on the computing device 2900 to provide I/O functions managed by I/O controller 2940.

In one embodiment, I/O controller 2940 manages devices such as accelerometers, cameras, light sensors or other environmental sensors, or other hardware that can be included in the computing device 2900. The input can be part of direct user interaction, as well as providing environmental input to the system to influence its operations (such as filtering for noise, adjusting displays for brightness detection, applying a flash for a camera, or other features).

In one embodiment, computing device 2900 includes power management 2950 that manages battery power usage, charging of the battery, and features related to power saving operation. Memory subsystem 2960 includes memory devices for storing information in computing device 2900. Memory can include nonvolatile (state does not change if power to the memory device is interrupted) and/or volatile (state is indeterminate if power to the memory device is interrupted) memory devices. Memory subsystem 2960 can store application data, user data, music, photos, documents, or other data, as well as system data (whether long-term or temporary) related to the execution of the applications and functions of the computing device 2900.

Elements of embodiments are also provided as a machine-readable medium (e.g., memory 2960) for storing the computer-executable instructions. The machine-readable medium (e.g., memory 2960) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 2970 includes hardware devices (e.g., wireless and/or wired connectors and communication hardware) and software components (e.g., drivers, protocol stacks) to enable the computing device 2900 to communicate with external devices. The computing device 2900 could be separate devices, such as other computing devices, wireless access points or base stations, as well as peripherals such as headsets, printers, or other devices.

Network interface 2970 can include multiple different types of connectivity. To generalize, the computing device 2900 is illustrated with cellular connectivity 2972 and wireless connectivity 2974. Cellular connectivity 2972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2974 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2980 include hardware interfaces and connectors, as well as software components (e.g., drivers, protocol stacks) to make peripheral connections. It will be understood that the computing device 2900 could both be a peripheral device ("to" 2982) to other computing devices, as well as have peripheral devices ("from" 2984) connected to it. The computing device 2900 commonly has a "docking" connector to connect to other computing devices for purposes such as managing (e.g., downloading and/or uploading, changing, synchronizing) content on computing device 2900. Additionally, a docking connector can allow computing device 2900 to connect to certain peripherals that allow the computing device 2900 to control content output, for example, to audiovisual or other systems.

In addition to a proprietary docking connector or other proprietary connection hardware, the computing device 2900 can make peripheral connections 2980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A microprocessor heat sink fastener assembly, comprising:
a base coupled to a heat sink, wherein the base comprises a seating flange and a captivation sleeve extending substantially orthogonally from a plane of the seating flange;
a retention nut received by a cavity of the base, wherein the captivation sleeve at least partially surrounds the cavity of the base, wherein the seating flange has an opening to the cavity, the retention nut sits over the opening in the seating flange, and the retention nut has a threaded bore aligned with the opening in the seating flange; and
a retention clip attached to the base and cantilevered therefrom, wherein the retention clip is engaged with a latching structure extending from a retention plate.

2. The fastener assembly of claim 1, wherein the retention clip comprises a cantilever spring and a latch plate coupled to the cantilever spring, and wherein the cantilever spring deflects to release the latch plate from the latching structure extending from the retention plate.

3. The fastener assembly of claim 2, wherein the latch plate comprises at least one tab extending orthogonally from a plane of the latch plate, and wherein the at least one tab has an edge that is sloped to engage the latch plate to the latching structure extending from the retention plate.

4. The fastener assembly of claim 3, wherein the cantilever spring comprises a curved portion to provide a bail to manually release the latch plate from the latching structure.

5. The fastener assembly of claim 1, wherein the retention nut comprises a cylindrical body that extends axially, and wherein the threaded bore extends along a longitudinal axis of the cylindrical body.

6. The fastener assembly of claim 1, wherein the captivation sleeve comprises multiple sections separated by spaces therebetween, wherein the captivation sleeve has an interior surface, wherein one or more centering stubs are on the interior surface, and wherein the retention nut is abutted against the one or more centering stubs.

7. The fastener assembly of claim 1, wherein the captivation sleeve comprises a polymer or a metal.

8. A microprocessor heat sink fastener assembly, comprising:
a base coupled to a heat sink, wherein the base comprises a seating flange and a captivation sleeve extending substantially orthogonally from a plane of the seating flange;
a retention nut received by a cavity of the base, wherein the cavity is in the captivation sleeve, the seating flange has an opening to the cavity, the retention nut sits over the opening in the seating flange, and the retention nut has a threaded bore aligned with the opening in the seating flange; and a retention clip attached to the base and cantilevered therefrom, wherein the retention clip comprises a cantilever spring and a latch plate coupled to the cantilever spring, wherein the latch plate is engaged with a latching structure extending from a retention plate, and wherein the cantilever spring deflects to release the latch plate from the latching structure.

9. The fastener assembly of claim 8, wherein the captivation sleeve comprises multiple sections separated by spaces therebetween, wherein one or more centering stubs are on the multiple sections, and wherein the retention nut is abutted against the one or more centering stubs.

10. The fastener assembly of claim 8, wherein the latch plate comprises at least one tab extending orthogonally from a plane of the latch plate, and wherein the at least one tab engages the latch plate to the latching structure of the retention plate.

11. The fastener assembly of claim 8, wherein the retention nut comprises a cylindrical body that extends axially, and wherein the threaded bore extends along a longitudinal axis of the cylindrical body.

12. A microprocessor heat sink fastener assembly, comprising:
a base coupled to a heat sink;
a retention nut received by a cavity of the base, wherein the base comprises a captivation sleeve comprising multiple sections separated by spaces therebetween, wherein the captivation sleeve surrounds the cavity, wherein the captivation sleeve has an interior surface, wherein one or more centering stubs are on the interior surface, and wherein the retention nut is abutted against the one or more centering stubs; and
a retention clip attached to the base and cantilevered therefrom, wherein the retention clip engages with a latching structure extending from a retention plate.

13. The fastener assembly of claim 12, wherein the base comprises a seating flange, and wherein the captivation sleeve extends substantially orthogonally from a plane of the seating flange.

14. The fastener assembly of claim 13, wherein the seating flange has an opening to the cavity.

15. The fastener assembly of claim 14, wherein the retention nut sits over the opening in the seating flange and wherein the retention nut has a threaded bore aligned with the opening in the seating flange.

16. The fastener assembly of claim 12, wherein the retention clip comprises a cantilever spring and a latch plate coupled to the cantilever spring.

17. The fastener assembly of claim 16, wherein the latch plate comprises at least one tab extending from the latch plate, and wherein the at least one tab engages the latch plate to the latching structure.

* * * * *